(12) United States Patent
Nishimura et al.

(10) Patent No.: US 8,987,715 B2
(45) Date of Patent: Mar. 24, 2015

(54) ORGANIC ELECTROLUMINESCENCE ELEMENT

(75) Inventors: Kazuki Nishimura, Sodegaura (JP); Hitoshi Kuma, Sodegaura (JP); Chishio Hosokawa, Sodegaura (JP); Hideaki Nagashima, Sodegaura (JP); Masaki Numata, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/702,625

(22) PCT Filed: Jun. 8, 2011

(86) PCT No.: PCT/JP2011/063102
§ 371 (c)(1),
(2), (4) Date: Dec. 7, 2012

(87) PCT Pub. No.: WO2011/155507
PCT Pub. Date: Dec. 15, 2011

(65) Prior Publication Data
US 2013/0075716 A1 Mar. 28, 2013

(30) Foreign Application Priority Data

Jun. 8, 2010 (JP) ................................. 2010-131537

(51) Int. Cl.
*H01L 51/54* (2006.01)
*C09K 11/06* (2006.01)
(Continued)

(52) U.S. Cl.
CPC ........ *H01L 51/5016* (2013.01); *H01L 51/5004* (2013.01); *H01L 51/0059* (2013.01); *H01L 51/0072* (2013.01); *H01L 51/0073* (2013.01);
(Continued)

(58) Field of Classification Search
None
See application file for complete search history.

(56) References Cited

U.S. PATENT DOCUMENTS 7,329,466 B2 * 2/2008 Vargas et al. ................. 428/690
7,727,640 B2 * 6/2010 Tada et al. ..................... 428/690
(Continued)

FOREIGN PATENT DOCUMENTS

JP 2006 352046 12/2006
JP 2007 251097 9/2007
(Continued)

OTHER PUBLICATIONS

Brunner, K., et. al., "Carbazole Compounds as Host Materials for Triplet Emitters in Organic Light Emitting Diodes, Tuning the HOMO Level Without Influencing the Triplet Energy in Small Molecules", Journal of American Chemical Society, 126 (2004) pp. 6035-6042.*

(Continued)

*Primary Examiner* — Joseph Schoenholtz
(74) *Attorney, Agent, or Firm* — Olbon, Spivak, McClelland, Maier & Neustadt, L.L.P.

(57) ABSTRACT

An organic electroluminescence device (1) includes: an anode (3); a cathode (4); and an emitting layer (5) provided between the anode (3) and the cathode (4). The emitting layer contains a first host, a second host and a phosphorescent dopant. A triplet energy of each of the first host and the second host is 2.8 eV or more. An ionization potential of the first host is 5.5 eV or less. An affinity $Af_1$ of the first host is smaller than an affinity $Af_2$ of the second host.

18 Claims, 2 Drawing Sheets

(51) Int. Cl.
*C07D 403/00* (2006.01)
*H01L 51/50* (2006.01)
*H01L 51/00* (2006.01)

(52) U.S. Cl.
CPC ..... *H01L 51/0085* (2013.01); *H01L 2251/5384* (2013.01); *H01L 2251/552* (2013.01); *Y10S 428/917* (2013.01)
USPC ................ 257/40; 257/E51.026; 257/E51.05; 428/690; 428/917; 313/504; 313/506; 544/283; 548/440

(56) References Cited

U.S. PATENT DOCUMENTS

| | | | |
|---|---|---|---|
| 8,039,129 B2* | 10/2011 | Iwakuma et al. | 428/690 |
| 8,174,001 B2* | 5/2012 | Kitamura et al. | 257/40 |
| 2002/0008233 A1* | 1/2002 | Forrest et al. | 257/40 |
| 2006/0257684 A1* | 11/2006 | Arakane et al. | 428/690 |
| 2006/0279204 A1* | 12/2006 | Forrest et al. | 313/506 |
| 2007/0159083 A1* | 7/2007 | Matsuura et al. | 313/506 |
| 2008/0284318 A1* | 11/2008 | Deaton et al. | 313/504 |
| 2009/0058279 A1* | 3/2009 | Takeda | 313/504 |
| 2009/0146552 A1* | 6/2009 | Spindler et al. | 313/504 |
| 2009/0167165 A1 | 7/2009 | Otsu et al. | |
| 2009/0218561 A1* | 9/2009 | Kitamura et al. | 257/13 |
| 2009/0302745 A1 | 12/2009 | Otsu et al. | |
| 2010/0163853 A1* | 7/2010 | Ogiwara et al. | 257/40 |
| 2011/0001130 A1 | 1/2011 | Nishimura et al. | |
| 2012/0119197 A1* | 5/2012 | Nishimura et al. | 257/40 |

FOREIGN PATENT DOCUMENTS

| | | |
|---|---|---|
| JP | 2007 288035 | 11/2007 |
| JP | 2007 311460 | 11/2007 |
| JP | 2008 84913 | 4/2008 |
| JP | 2008 135498 | 6/2008 |
| JP | 2008 181937 | 8/2008 |
| JP | 2008 282610 | 11/2008 |
| JP | 2010 34484 | 2/2010 |
| JP | 2011 8991 | 1/2011 |
| WO | 2005 079118 | 8/2005 |
| WO | 2008 035571 | 3/2008 |
| WO | 2009 066778 | 5/2009 |

OTHER PUBLICATIONS

D'Andrade, B., et. al., "Relationship Between the Ionization and Oxidation Potentials of Molecular Organic Semiconductors", Organic Electronics 6 (2005) pp. 11-20.*

Jang, J.G., et. al. "Preparation and Characterization of Highly Efficient Blue TPBI:Flrpic Organic Light Emtting Devices", Journal of SID 18/11 (2010) pp. 1015-1019.*

Su, S.J., et. al., "Three Carbazole Armed Host Materials with Various Cores for RGB Phosphorescent Organic Light-Emitting Diodes", J. Mater. Chem., 2012, 22, 3447.*

Zheng, Y.H., Bipolar Molecules with High Triplet Energies: Synthesis, Photophysical and Structural Properties, J. Org. Chem. 2011, 76, 8300-8310.*

U.S. Appl. No. 13/702,600, filed Dec. 7, 2012, Nishimura, et al.
International Search Report Issued Aug. 9, 2011 in PCT/JP11/63102 Filed Jun. 8, 2011.

* cited by examiner

ORGANIC ELECTROLUMINESCENCE ELEMENT

TECHNICAL FIELD

The present invention relates to an organic electroluminescence device.

BACKGROUND ART

An organic electroluminescence device (hereinafter, electroluminescence is occasionally abbreviated as EL) is a self-emitting device based on the principle that, when an electrical field is applied, a fluorescent material emits light using energy generated by a recombination of holes injected from an anode with electrons injected from a cathode. Organic EL devices formed from organic materials have been vigorously studied since a report on a low voltage-driven organic electroluminescence device formed by laminating layers was made by C. W. Tang et al. of Eastman Kodak Company.

There has been proposed a phosphorescent organic electroluminescence device in which an organic phosphorescent material is used in an emitting layer. Such a phosphorescent organic electroluminescence device uses excited states of the organic phosphorescent material, i.e., a singlet state and a triplet state, to provide a high luminous efficiency. When electrons and holes are recombined in an organic EL device, it is presumed that singlet excitons and triplet excitons are produced at a rate of 1:3 due to difference in spin multiplicity. Thus, a device using a phosphorescent material presumably achieves three to four times higher luminous efficiency than a device using only fluorescence.

Various studies have been made for improving the luminous efficiency of an organic electroluminescence device using a phosphorescent material.

As a result of one of such studies, there has been proposed an organic electroluminescence device in which a plurality of emitting layers are layered between the anode and the cathode (e.g., Patent Literatures 1 to 5).

CITATION LIST

Patent Literatures

Patent Literature 1: JP-A-2008-84913
Patent Literature 2: JP-A-2010-34484
Patent Literature 3: WO2005/079118
Patent Literature 4: JP-A-2008-181937
Patent Literature 5: JP-A-2008-282610

SUMMARY OF THE INVENTION

Problems to be Solved by the Invention

A carbazole host, which is excellent in electron tolerance and has a large triplet energy enabling blue emission, is used in organic electroluminescence devices disclosed in Patent Literatures 1 to 5.

However, while enabling blue emission, such a carbazole host disclosed in Patent Literatures 1 to 5 shortens the lifetime of the device.

Patent Literatures 4 and 5 imply that a carbazole host is used in common in the emitting layers, but fail to disclose a technique for improving the lifetime of the device. In particular, some organic electroluminescence devices disclosed in Patent Literature 4 have a green-red-emitting layer in which a CBP host and another carbazole host are used in combination. However, the lifetime of any of these organic electroluminescence devices is rather shortened as a result of such a combined use of the hosts.

An object of the invention is to provide a long-life organic electroluminescence device that is capable of blue emission and exhibits a high efficiency.

Means for Solving the Problems

According to an aspect of the invention, an organic electroluminescence device includes: an anode; a cathode; and an emitting layer provided between the anode and the cathode, in which the emitting layer contains a first host, a second host and a phosphorescent dopant, a triplet energy of each of the first host and the second host is 2.8 eV or more, an ionization potential of the first host is 5.5 eV or less, and an affinity $Af_1$ of the first host is smaller than an affinity $Af_2$ of the second host.

In the above aspect, the affinity $Af_1$ of the first host and the affinity $Af_2$ of the second host preferably satisfy a relationship of $Af_2 - Af_1 \geq 0.4$ [eV].

In the above aspect, a difference between a singlet energy of the first host and the triplet energy of the first host is preferably smaller than a difference between a singlet energy of the second host and the triplet energy of the second host.

In the above aspect, an emission peak of the phosphorescent dopant is preferably 480 nm or less.

Effects of the Invention

According to the invention, a long-life organic electroluminescence device that is capable of blue emission and exhibits a high efficiency can be provided.

DESCRIPTION OF EMBODIMENT(S)

Figure 1:
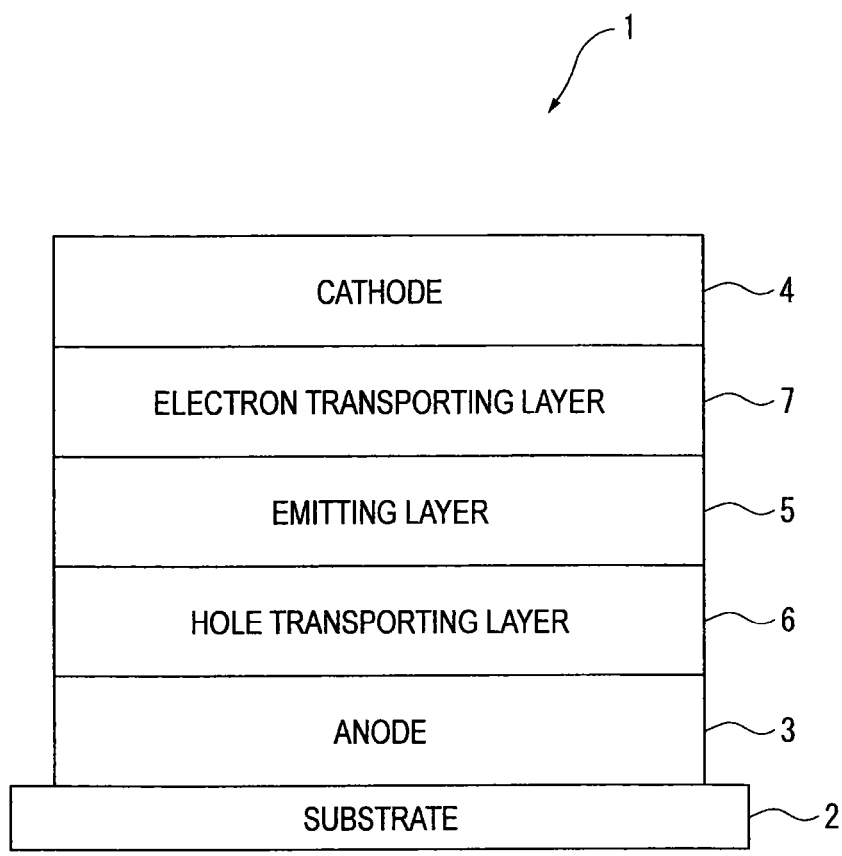
FIG. 1 schematically shows an exemplary arrangement of an organic electroluminescence device according to an exemplary embodiment of the invention.

Embodiment(s) of the invention will be described below.
Arrangement of Organic Electroluminescence Device An arrangement of an organic electroluminescence device (hereinafter abbreviated as organic EL device) will be described below.

The following are representative arrangement examples of the organic EL device.
(1) anode/emitting layer/cathode
(2) anode/hole injecting layer/emitting layer/cathode
(3) anode/emitting layer/electron injecting•transporting layer/cathode
(4) anode/hole injecting layer/emitting layer/electron injecting•transporting layer/cathode
(5) anode/hole injecting•transporting layer/emitting layer/electron injecting•transporting layer/cathode While the arrangement (5) is preferably used among the above, the arrangement of the invention is not limited to the above arrangements.

It should be noted that the "hole injecting/transporting layer (or hole injecting•transporting layer)" herein means "at least one of hole injecting layer and hole transporting layer" while "electron injecting/transporting layer (or electron injecting•transporting layer)" herein means "at least one of electron injecting layer and electron transporting layer".

FIG. 1 shows an organic EL device 1 according to the exemplary embodiment.

The organic EL device 1 includes a transparent substrate 2, an anode 3, a cathode 4, a hole transporting layer 6, an emitting layer 5 and an electron transporting layer 7.

The hole transporting layer 6, the emitting layer 5, the electron transporting layer 7 and the cathode 4 are in this sequence layered on the anode 3.

Emitting Layer

The emitting layer 5 is layered between the hole transporting layer 6 and the electron transporting layer 7 to be adjacent thereto.

The emitting layer 5 contains a first host, a second host and a phosphorescent dopant.

Preferably, the first host is contained at 10 mass % to 90 mass %, the second host is contained at 10 mass % to 90 mass %, and the phosphorescent dopant is contained at 0.1 mass % to 30 mass %.

First Host

In the exemplary embodiment, the triplet energy of the first host is 2.8 eV or more and the ionization potential of the first host is 5.5 eV or less.

The first host is preferably a non-amine-based compound, more preferably a compound represented by the following formula (1).

[Formula 1]

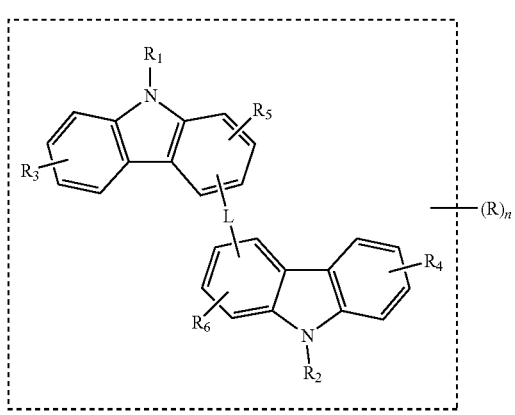

(1)

In the formula (1), R represents a substituent substitutable for a carbazole skeleton or L. n represents the number of R. n is 0 to 6, preferably 0 to 4. When n is 2 or larger, a plurality of R may be mutually different.

Examples of R are as follows:

an alkyl group having 1 to 20 carbon atoms;

a cycloalkyl group having 3 to 20 carbon atoms;

an alkoxy group having 1 to 20 carbon atoms;

a cycloalkoxy group having 3 to 20 carbon atoms;

an aryl group having 6 to 18 carbon atoms;

an aryloxy group having 6 to 18 carbon atoms;

a heteroaryl group having 5 to 18 carbon atoms (including carbazole, dibenzofuran and dibenzothiophene);

an amino group (which may have a substituent such as the above alkyl group, cycloalkyl group and aryl group);

a silyl group (which may have a substituent such as the above alkyl group, cycloalkyl group and aryl group);

a fluoro group; and a cyano group.

The above substituents may be further substituted with these substituents.

In the formula (1), each of $R_1$ to $R_6$ represents a substituent, examples of which are the same as those described in relation to R in the formula (1).

In the formula (1), L, which bonds two carbazole skeletons, is a single bond or a divalent bonding group containing an element such as carbon (C), nitrogen (N), oxygen (O), silicon (Si), phosphorus (P) and sulfur (S).

Examples of L are as follows:

an oxygen (O) atom;

a sulfur (S) atom;

a sulfoxide group;

a divalent phosphoxide group;

a divalent alkylene group having 1 to 20 carbon atoms;

a divalent cycloalkylene group having 3 to 20 carbon atoms;

a divalent arylene group having 6 to 18 carbon atoms;

a divalent heteroarylene group having 5 to 18 carbon atoms (including carbazole, dibenzofuran and dibenzothiophene);

a divalent amino group (which may have a substituent such as the alkyl group, cycloalkyl group and aryl group described in relation to R in the formula (1)); and a divalent silyl group (which may have a substituent such as the alkyl group, cycloalkyl group and aryl group described in relation to R in the formula (1)).

These bonding groups may further have a substituent. Examples of the substituent may be the same as those described in relation to R in the formula (1).

In the formula (1), R may be a hydrogen atom. Herein, "hydrogen" is meant to also include deuterium.

In the formula (1), the aryl group (aromatic hydrocarbon group) as R may have 6 to 30 carbon atoms forming the aromatic ring (hereinafter referred to as ring carbon atoms). The aryl group may have a fused ring structure.

In the formula (1), the alkyl group as R may be substituted with halogen to be a haloalkyl group and the alkoxy group as R may be substituted with halogen to be a haloalkoxy group.

In the formula (1), the heteroaryl group (aromatic heterocyclic group) as R may have 2 to 30 ring carbon atoms. The heteroaryl group may have a fused ring structure.

In the formula (1), $R_1$ and $R_2$ may be bonded at N-position (9-position) of the carbazole skeleton directly or via a bonding group. Examples of the bonding group are $X^1$ and $X^2$ in a formula (1A) described below and $L^2$ and $L^3$ in a formula (1C) described below.

In the formula (1), an adjacent set of the substituents substituted for the carbazole skeleton may be mutually bonded to form a ring structure.

In the exemplary embodiment, the first host is more preferably a compound represented by the following formula (2).

[Formula 2]

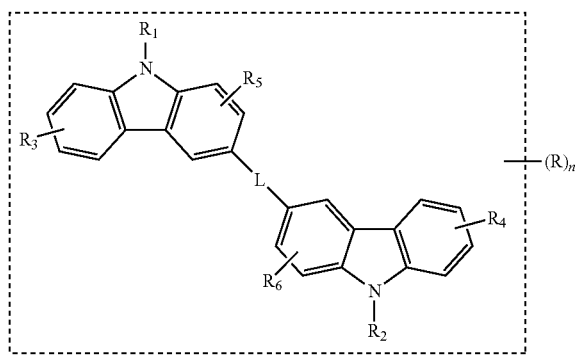

(2)

In the formula (2), examples of R and $R_1$ to $R_6$ are the same as those of R in the formula (1).

Examples of n are the same as those of n in the formula (1).
Examples of L are the same as those of L in the formula (1).
In the formula (2), L bonds carbon atoms provided at 3-positions of two carbazole skeletons.

In the formula (1) or (2), $R_1$ and $R_2$ may preferably contain no azine ring.

In the formula (1) or (2), preferable examples of $R_1$ to $R_6$ are as follows:
  an aromatic heterocyclic group containing an oxygen atom as a hetero atom;
  an aromatic heterocyclic group containing a sulfur atom as a hetero atom;
  an aromatic heterocyclic group containing an oxygen atom and a sulfur atom as hetero atoms; and
  a monovalent residue of an N-arylcarbazole.
Preferably, the monovalent residue of the N-arylcarbazole, which is provided by substituting N of carbazole with an aryl group, is not bonded to a biscarbazole skeleton represented by the formula (1) or (2) via the aryl group.

In the exemplary embodiment, among the compounds represented by the formula (1), the first host is preferably a compound represented by the following formula (1A).

[Formula 3]

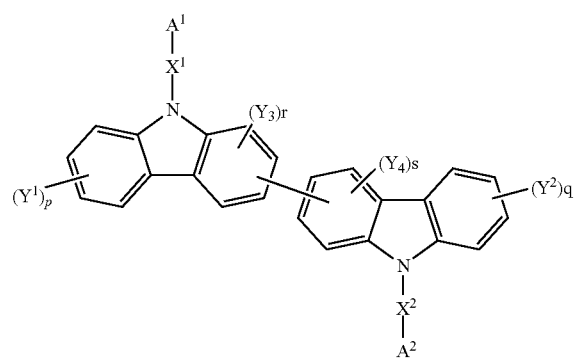

(1A)

In the formula (1A), $A^1$ represents a substituted or unsubstituted nitrogen-containing heterocyclic group having 1 to 30 ring carbon atoms.

In the formula (1A), $A^2$ represents a substituted or unsubstituted aromatic hydrocarbon group having 6 to 30 ring carbon atoms or a substituted or unsubstituted nitrogen-containing heterocyclic group having 1 to 30 ring carbon atoms.

In the formula (1A), $X^1$ and $X^2$ are bonding groups and each independently represent one of the following:
  a single bond;
  a substituted or unsubstituted aromatic hydrocarbon group having 6 to 30 ring carbon atoms;
  a substituted or unsubstituted fused aromatic hydrocarbon group having 6 to 30 ring carbon atoms;
  a substituted or unsubstituted aromatic heterocyclic group having 2 to 30 ring carbon atoms; and
  a substituted or unsubstituted fused aromatic heterocyclic group having 2 to 30 ring carbon atoms.

In the formula (1A), $Y^1$ to $Y^4$ each independently represent one of the following:
  a hydrogen atom;
  a fluorine atom;
  a cyano group;
  a substituted or unsubstituted alkyl group having 1 to 20 carbon atoms;
  a substituted or unsubstituted alkoxy group having 1 to 20 carbon atoms;
  a substituted or unsubstituted haloalkyl group having 1 to 20 carbon atoms;
  a substituted or unsubstituted haloalkoxy group having 1 to 20 carbon atoms;
  a substituted or unsubstituted alkylsilyl group having 1 to 10 carbon atoms;
  a substituted or unsubstituted arylsilyl group having 6 to 30 carbon atoms;
  a substituted or unsubstituted aromatic hydrocarbon group having 6 to 30 ring carbon atoms;
  a substituted or unsubstituted fused aromatic hydrocarbon group having 6 to 30 ring carbon atoms;
  a substituted or unsubstituted aromatic heterocyclic group having 2 to 30 ring carbon atoms; and
  a substituted or unsubstituted fused aromatic heterocyclic group having 2 to 30 ring carbon atoms.

In the formula (1A), an adjacent set of $Y^1$ to $Y^4$ may be mutually bonded to form a ring structure.

In the formula (1A), each of p and q is an integer of 1 to 4.
In the formula (1A), each of r and s is an integer of 1 to 3.
When each of p and q is an integer of 2 to 4 and each of r and s is an integer of 2 to 3, a plurality of $Y^1$ to $Y^4$ may be mutually the same or different.

When $Y^1$ to $Y^4$ are mutually bonded to form a ring structure, the ring structure is exemplified by structures represented by the following formula (1B).

[Formula 4]

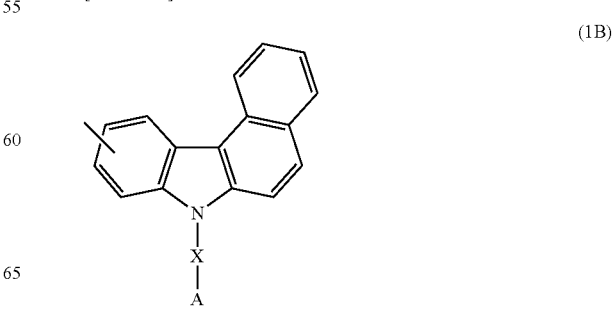

(1B)

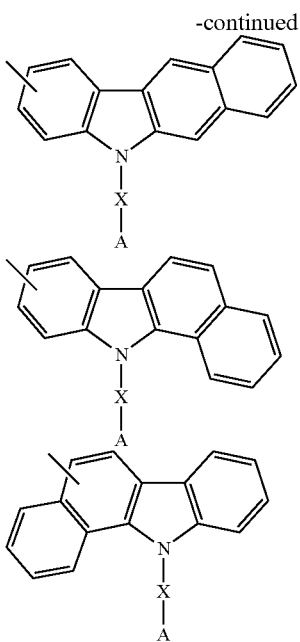

In the exemplary embodiment, among the compounds represented by the formula (1), the first host is preferably a compound represented by the following formula (1C).

[Formula 5]

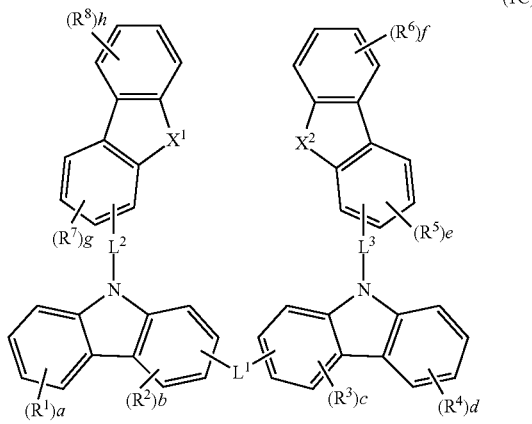

(1C)

In the formula (1C), $X^1$ and $X^2$ each independently represent an oxygen atom or a sulfur atom, and are not simultaneously sulfur atoms. In other words, $X^1$ and $X^2$ are simultaneously oxygen atoms, or, alternatively, one of $X^1$ and $X^2$ is an oxygen atom while the other thereof is a sulfur atom.

In the formula (1C), $R^1$ to $R^8$ each independently represent one of the following:
- an alkyl group having 1 to 20 carbon atoms;
- a cycloalkyl group having 3 to 20 ring carbon atoms;
- an alkoxy group having 1 to 20 carbon atoms;
- a cycloalkoxy group having 3 to 20 ring carbon atoms;
- an aryl group having 6 to 18 ring carbon atoms;
- an aryloxy group having 6 to 18 ring carbon atoms;
- a heteroaryl group having 5 to 18 atoms forming a ring (hereinafter referred to as ring atoms);
- an amino group;
- a silyl group.
- a fluoro group; and
- a cyano group.

$R^1$ to $R^8$ in the formula (1C) may be further substituted with these substituents. $R^1$ to $R^8$ in the formula (1C) are hereinafter collectively referred to as "substituents $R_{1C}$" as needed. When a plurality of $R^1$ exist in the formula (1C), the plurality of $R^1$ may be mutually the same or different. The same applies to each of $R^2$ to $R^8$.

a, d, f and h in the formula (1C) each independently represent an integer of 0 to 4.

b, c, e and g in the formula (1C) each independently represent an integer of 0 to The sum of a to h in the formula (1C) is 6 or less.

$L^1$ in the formula (1C) represents one of the following:
- a single bond;
- a divalent bonding group containing N;
- a divalent bonding group containing O;
- a divalent bonding group containing Si;
- a divalent bonding group containing P;
- a divalent bonding group containing S;
- an alkylene group having 1 to 20 carbon atoms;
- a cycloalkylene group having 3 to 20 ring carbon atoms;
- an arylene group having 6 to 18 ring carbon atoms;
- a heteroarylene group having 5 to 18 ring atoms;
- a divalent amino group; and
- a divalent silyl group.

In the formula (1C), $L^2$ and $L^3$ each independently represent one of the following:
- a single bond;
- an alkylene group having 1 to 20 carbon atoms;
- a cycloalkylene group having 3 to 20 ring carbon atoms;
- an arylene group having 6 to 18 ring carbon atoms; and
- a heteroarylene group having 5 to 18 ring atoms.

$L^1$, $L^2$ and $L^3$ in the formula (1C) may be substituted with any one of the above substituents $R_{1C}$.

In the formula (1C), when $L^1$ is an arylene group having 6 to 18 ring carbon atoms or a heteroarylene group having 5 to 18 ring atoms, a and b each independently represent an integer of 1 to 4.

When a dibenzofuranyl group or a dibenzothiophenyl group is bonded at N-position (9-position) of the carbazole skeleton directly or via a bonding group as in the formula (1C), the LUMO level of dibenzofuran or dibenzothiophene becomes deeper, so that it becomes easier to inject electrons into the emitting layer or the like of the organic EL device according to the exemplary embodiment. As a result, carrier balance can be easily adjusted to favorably provide the effects of the invention.

Examples of the alkyl group as $R^1$ to $R^8$ in the formula (1C) are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group and 3-methylpentyl group.

Examples of the cycloalkyl group as $R^1$ to $R^8$ in the formula (1C) are a cyclopropyl group, cyclobutyl group, cyclopentyl group, cycloheptyl group, norbornyl group and adamantyl group.

Examples of the alkoxy group as $R^1$ to $R^8$ in the formula (1C) are a methoxy group, ethoxy group, propoxy group, butoxy group, pentyloxy group and hexyloxy group, among which ones having 3 or more carbon atoms may have a liner, cyclic or branched structure.

Examples of the cycloalkoxy group as $R^1$ to $R^8$ in the formula (1C) are a cyclopentoxy group and a cyclohexyloxy group.

Examples of the aryl group as $R^1$ to $R^8$ in the formula (1C) are a phenyl group, tolyl group, xylyl group, mesityl group, o-biphenyl group, m-biphenyl group, p-biphenyl group, o-terphenyl group, m-terphenyl group, p-terphenyl, naphthyl group and phenanthryl group. Among the above, a phenyl group and a mesityl group are preferable.

Examples of the aryloxy group as $R^1$ to $R^8$ in the formula (1C) are a phenoxy group and biphenyloxy group.

Examples of the heteroaryl group as $R^1$ to $R^8$ in the formula (1C) are a carbazolyl group, dibenzofuranyl group, dibenzothiophenyl group, pyrrolyl group, furyl group, thienyl group, silolyl group, pyridyl group, quinolyl group, isoquinolyl group, benzofuryl group, imidazolyl group, pyrimidyl group, selenophenyl group, oxadiazolyl group and triazolyl group.

The amino group and the silyl group as $R^1$ to $R^8$ in the formula (1C) may be substituted with the substituents described above. The silyl group is preferably a trimethylsilyl group.

a, d, f and h in the formula (1C) preferably each independently represent an integer of 0 to 3, more preferably an integer of 0 to 2.

b, c, e and g in the formula (1C) preferably each independently represent an integer of 0 to 2, more preferably an integer of 0 to 1.

In consideration of sublimability and thermal decomposition frequently caused by an excessive molecular weight during vapor deposition, the sum of a to h in the formula (1C) is preferably 4 or less.

The divalent bonding group containing N, the divalent bonding group containing O, the divalent bonding group containing Si, the divalent bonding group containing P and the divalent bonding group containing S as $L^1$ in the formula (1C) are exemplified by bonding groups represented by the following formula (1D).

[Formula 6]

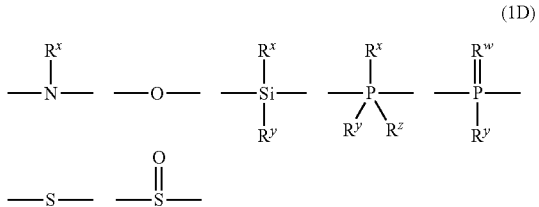

(1D)

In the groups represented by the formula (1D), $R^x$, $R^y$ and $R^z$ each independently represent a hydrogen atom or a group selected from the above substituents $R_{1C}$. $R^w$ is an oxygen atom.

Among the groups represented by the formula (1D), "—S—" group (sulfide group), phosphoxide group and ether group are preferable.

The alkylene group having 1 to 20 carbon atoms, the cycloalkylene group having 3 to 20 ring carbon atoms, the arylene group having 6 to 18 ring carbon atoms, the heteroarylene group having 5 to 18 ring atoms, the divalent amino group, or the divalent silyl group as $L^1$, $L^2$ and $L^3$ in the formula (1C) may be provided by removing one hydrogen atom in one of the substituents described above in relation to $R^1$ to $R^8$ in the formula (1C).

In the exemplary embodiment, the arylene group includes a 9,9-fluorenylidene group.

Examples of the arylene group as $L^1$, $L^2$ and $L^3$ in the formula (1C) are a 1,4-phenylene group, 1,2-phenylene group, 1,3-phenylene group, 1,4-naphthylene group, 2,6-naphthylene group, 1,5-naphthylene group, 9,10-anthranylene group, 9,10-phenanthrenylene group, 3,6-phenanthrenylene group, 1,6-pyrenylene group, 2,7-pyrenylene group, 6,12-chrysenylene group, 4,4'-biphenylene group, 3,3'-biphenylene group, 2,2'-biphenylene group and 2,7-fluorenylene group. Among the above, a p-phenylene group (1,4-phenylene group), an m-phenylene group (1,3-phenylene group) and a biphenylene group are preferable.

Examples of the heteroarylene group as $L^1$, $L^2$ and $L^3$ in the formula (1C) are a 2,5-thiophenylene group, 2,5-silolylene group and 2,5-oxadiazolylene group.

Examples of the amino group as $L^1$, $L^2$ and $L^3$ in the formula (1C) are an amino group, alkylamino group, arylamino group, aralkylamino group, acylamino group, alkoxycarbonylamino group, aryloxycarbonylamino group and sulfonylamino group. Among the above, a biphenylamino group is preferable.

Each of the bonding groups represented by $L^1$, $L^2$ and $L^3$ in the formula (1C) may have a substituent. Examples of such a substituent are the same as those of the substituents $R_{1C}$ in the formula (1C).

In the exemplary embodiment, among the compounds represented by the formula (1C), the first host is preferably a compound represented by the following formula (2E).

[Formula 7]

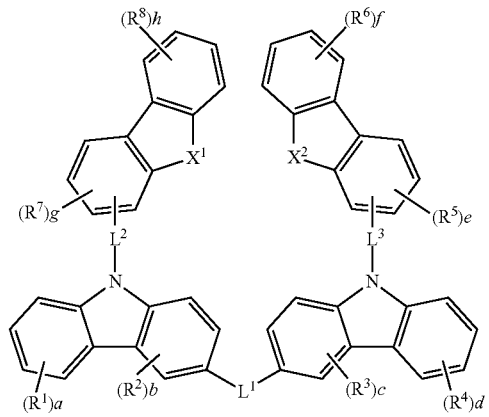

(2E)

Advantages of bonding two carbazolyl groups to each other at 3-positions thereof directly or via a bonding group as in the compound represented by the formula (2) or (2E) are as follows.

(1) Such an arrangement is highly convenient in synthesis.

(2) Although the 3-position and the 6-position of carbazole are positions with less chemical stability, by introducing a substituent other than a hydrogen atom at one of the 3-position and the 6-position, the chemical stability may be enhanced. In view of the above, an arrangement in which a substituent is introduced also at the 6-position is further preferable.

(3) When carbazoles are bonded to each other at 3-positions thereof via a single bond, nitrogen atoms on the two carbazoles are mutually conjugated, so that HOMO level becomes shallower. As a result, hole-injecting capability and hole-transporting capability are enhanced to facilitate carrier balance adjustment.

In the formula (2E), $X^1$, $X^2$, $R^1$ to $R^8$, a to h, and $L^1$ to $L^3$ are the same as those in the formula (1C).

In the exemplary embodiment, the first host is preferably a compound represented by the following formula (2F). This is because the compound represented by the formula (2F) exhibits a higher chemical stability.

[Formula 8]

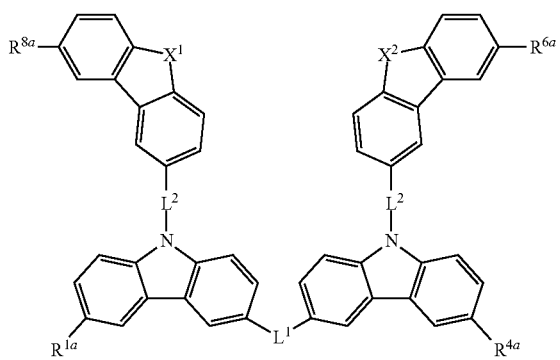

(2F)

$R^{1a}$, $R^{4a}$, $R^{6a}$ and $R^{8a}$ in the formula (2F) each independently represent a hydrogen atom or an aryl group having 6 to 18 ring carbon atoms (which is the same as the aryl group described in relation to the substituents $R_{1C}$).

An arrangement in which each of $R^{1a}$, $R^{4a}$, $R^{6a}$ and $R^{8a}$ is a hydrogen atom corresponds to an arrangement in which each of a, d, f and h in the formula (1C) is 0.

The aryl group may be further substituted with one of the substituents $R_{1c}$.

In the formula (2F), $X^1$, $X^2$ and $L^1$ to $L^3$ are the same as those in the formula (1C).

In the formula (2F), each of $L^2$ and $L^3$ is preferably a single bond and $L^1$ is also preferably a single bond. This is because sublimability and an excessive molecular weight may frequently cause thermal decomposition during vapor deposition.

In terms of lowering voltage and of time elapsed until luminescence intensity is reduced by half, $L^1$ to $L^3$ in the formula (2F) are preferably arranged as follows:

"$L^1$ is a single bond while each of $L^2$ and $L^3$ is any other bonding group";

"each of $L^2$ and $L^3$ is a single bond while $L^1$ is any other bonding group"; or "all of $L^1$, $L^2$ and $L^3$ are single bonds".

Each of $X^1$ and $X^2$ in the formulae (1C), (2E) and (2F) is preferably an oxygen atom in terms of external quantum efficiency and lifetime.

In the exemplary embodiment, in terms of lowing voltage and of time elapsed until luminescence intensity is reduced by half, the first host is preferably a compound represented by the following formula (2G) among the compounds represented by the above formula (2F).

[Formula 9]

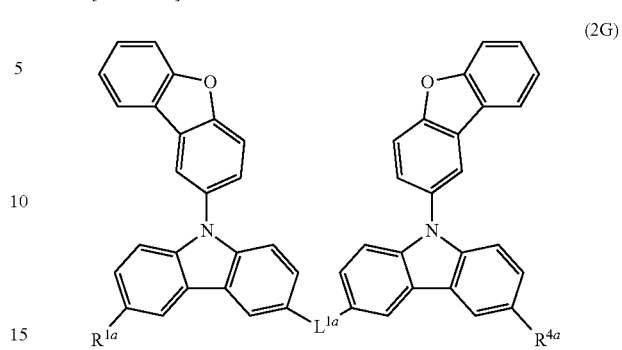

(2G)

$R^{1a}$ and $R^{4a}$ in the formula (2G) each independently represent a hydrogen atom or a phenyl group that may be substituted with a methyl group.

$L^{1a}$ in the formula (2G) is a single bond or a phenylene group.

It should be noted that when both of $R^{1a}$ and $R^{4a}$ are hydrogen atoms, $L^{1a}$ is not a phenylene group. When $L^{1a}$ is a phenylene group while both of $R^{1a}$ and $R^{4a}$ are hydrogen atoms in the formula (2G), the carbazoles have the hydrogen atoms at 6-positions thereof and are not bonded to each other at 3-positions thereof via a single bond. Such a material should not be a particularly excellent material for forming the first host in terms of chemical stability and carrier balance adjustment.

In the exemplary embodiment, the first host is preferably a compound represented by the following formula (9).

[Formula 10]

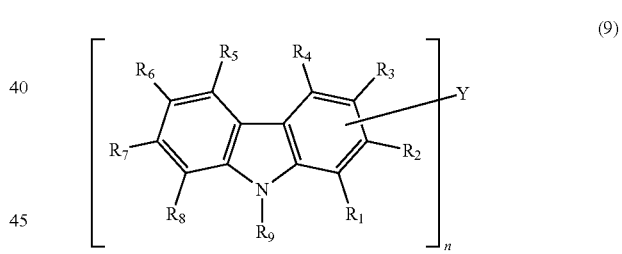

(9)

In the formula (9), each of $R_1$ to $R_8$ is selected from hydrogen, an alkyl group, a cycloalkyl group, an aralkyl group, an alkenyl group, a cycloalkenyl group, an alkynyl group, a hydroxyl group, a mercapto group, an alkoxy group, an alkylthio group, an arylether group, an arylthioether group, an aryl group, a heterocyclic group, halogen, haloalkane, haloalkene, haloalkyne, a cyano group, an aldehyde group, a carbonyl group, a carboxyl group, an ester group, a carbamoyl group, an amino group, a nitro group, a silyl group, a siloxanyl group and a ring structure between adjacent substituents.

At least one of $R_1$ to $R_4$ in the formula (9) is a bonding group Y. The bonding group Y in the formula (9) is one of or a combination of two or more of a single bond, alkyl chain, alkylene chain, cycloalkyl chain, aryl chain, amino chain, heterocyclic chain, silyl chain, ether chain and thioether chain.

$R_9$ in the formula (9) is selected from hydrogen, an alkyl group and an aryl group.

n in the formula (9) is a natural number of 2 or more.

The alkyl group in the formula (9) is a saturated aliphatic hydrocarbon group, such as a methyl group, ethyl group, propyl group and butyl group, which may be substituted or unsubstituted.

The cycloalkyl group in the formula (9) is a saturated alicyclic hydrocarbon group, such as cyclopropyl, cyclohexyl, norbornyl and adamantyl, which may be substituted or unsubstituted.

The aralkyl group in the formula (9), which is exemplified by a benzyl group or a phenylethyl group, contains an aromatic hydrocarbon group and an aliphatic hydrocarbon. The aliphatic hydrocarbon and the aromatic hydrocarbon may be substituted or unsubstituted.

The alkenyl group in the formula (9) is an unsaturated aliphatic hydrocarbon group containing a double bond, such as a vinyl group, allyl group and butadienyl group, which may be substituted or unsubstituted.

The cycloalkenyl group in the formula (9) is an unsaturated alicyclic hydrocarbon group containing a double bond, such as a cyclopentenyl group, cyclopentadienyl group and cyclohexene group, which may be substituted or unsubstituted.

The alkynyl group in the formula (9) is an unsaturated aliphatic hydrocarbon group containing a triple bond, such as an acetylenyl group, which may be substituted or unsubstituted.

The alkoxy group in the formula (9), which is exemplified by a methoxy group, contains an aliphatic hydrocarbon group and an ether bond. The aliphatic hydrocarbon group may be substituted or unsubstituted.

The alkylthio group in the formula (9) is formed by substituting an oxygen atom of an ether bond in an alkoxy group with a sulfur atom. The arylether group, which is exemplified by a phenoxy group, contains an aromatic hydrocarbon group and an ether bond. The aromatic hydrocarbon group may be substituted or unsubstituted.

The arylthioether group in the formula (9) is formed by substituting an oxygen atom of an ether bond in an arylether group with a sulfur atom.

The aryl group in the formula (9) represents an aromatic hydrocarbon group, such as a phenyl group, naphthyl group, biphenyl group, phenanthryl group, terphenyl group and pyrenyl group, which may be substituted or unsubstituted.

The heterocyclic group in the formula (9) represents a cyclic structure group containing an atom other than carbon, such as a furyl group, thienyl group, oxazolyl group, pyridyl group, quinolyl group and carbazolyl group, which may be substituted or unsubstituted.

The halogen in the formula (9) is fluorine, chlorine, bromine or iodine.

The haloalkane in the formula (9) is provided by substituting a part or the entirety of the above alkyl group with the halogen, an example of which is a trifluoromethyl group. The haloalkene in the formula (9) is likewise provided by substituting a part or the entirety of the above alkenyl group with the above halogen. The haloalkyne in the formula (9) is likewise provided by substituting a part or the entirety of the above alkynyl with the halogen. The other part of each of the alkyl group, alkenyl group and alkynyl may be substituted or unsubstituted.

Each of the aldehyde group, carbonyl group, ester group, carbamoyl group and amino group in the formula (9) may be substituted with an aliphatic hydrocarbon, alicyclic hydrocarbon, aromatic hydrocarbon, heterocycle or the like. The aliphatic hydrocarbon, alicyclic hydrocarbon, aromatic hydrocarbon and heterocycle may be substituted or unsubstituted.

The silyl group in the formula (9) represents a silicon compound group such as a trimethylsilyl group, which may be substituted or unsubstituted.

The siloxanyl group in the formula (9), which is exemplified by a trimethylsiloxanyl group, contains a silicon compound group and an ether bond. The silicon compound group may be substituted or unsubstituted.

In the formula (9), an adjacent set of substituents may form a cyclic structure. The formed cyclic structure may be substituted or unsubstituted.

Among compounds having a carbazole skeleton, in particular, a compound having a carbazole skeleton represented by the following formula (9A) is preferably usable in the exemplary embodiment because a compound having a dicarbazolyl skeleton has a rigid molecular structure and is excellent in heat resistance.

[Formula 11]

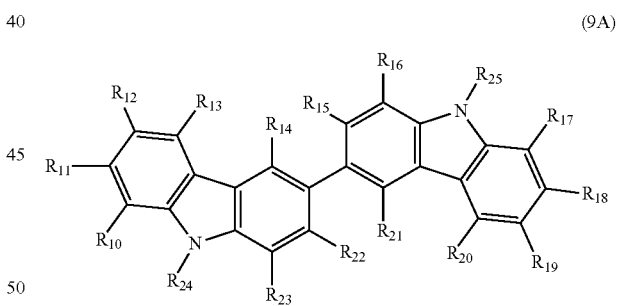

(9A)

Each of $R_{10}$ to $R_{23}$ in the formula (9A) is selected from the same as those described in relation to $R_1$ to $R_8$ in the formula (9).

Each of $R_{24}$ and $R_{25}$ in the formula (9A) is selected from hydrogen, an alkyl group and an aryl group. Dicarbazolyl skeletons may be mutually bonded via the substituents of $R_{24}$ and $R_{25}$.

Compounds having a carbazole skeleton represented by the formulae (9) and (9A) are exemplarily structured as follows.

[Formula 12]
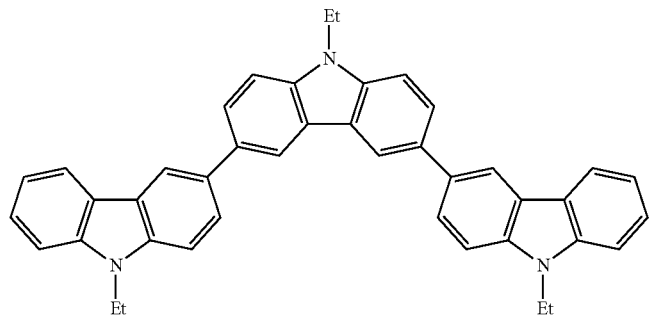
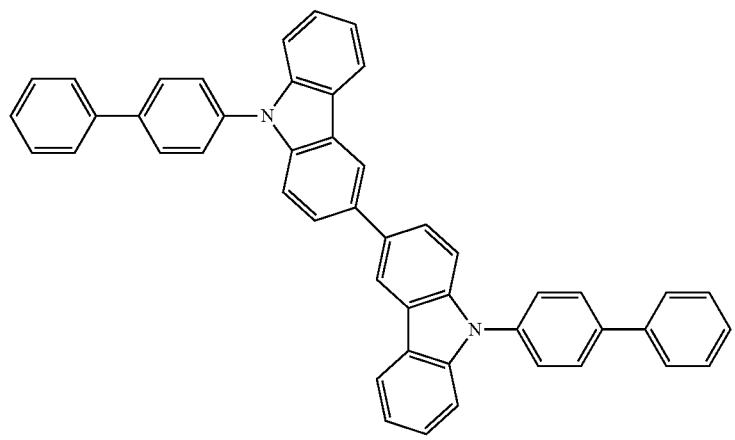
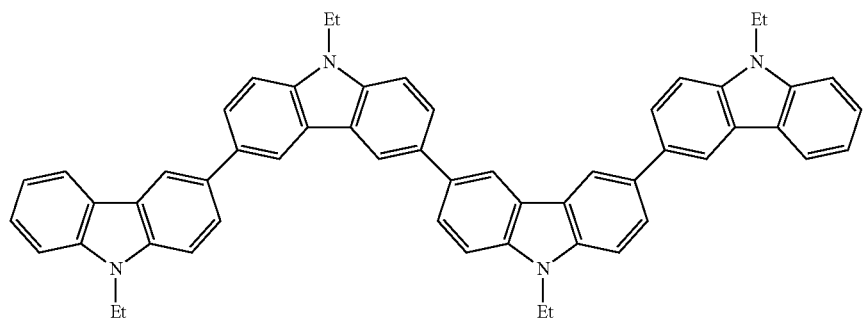
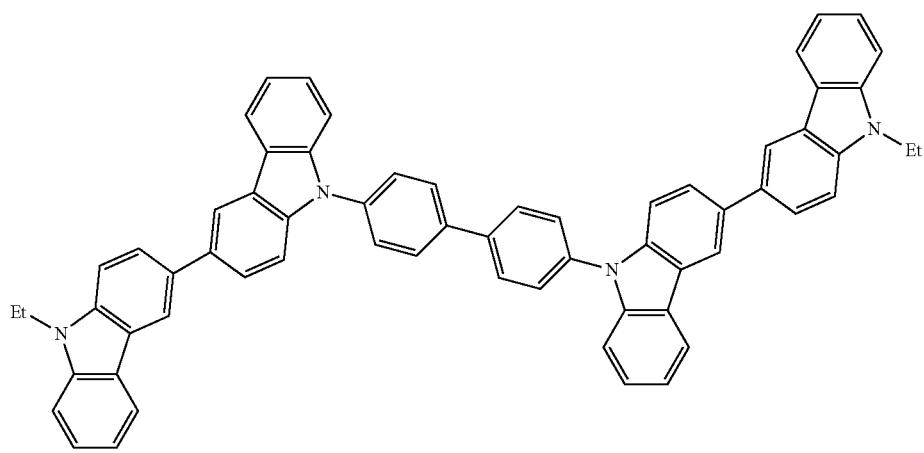

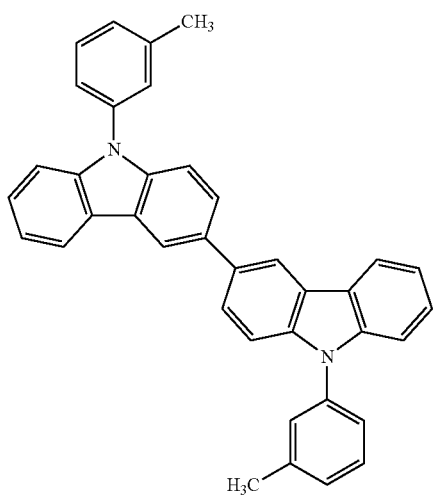 [SMILES: Cc1cccc(-n2c3ccccc3c3cc(-c4ccc5c(c4)c4ccccc4n5-c4cccc(C)c4)ccc32)c1]

In the exemplary embodiment, the first host is preferably a compound represented by the following formula (10).

[Formula 13]

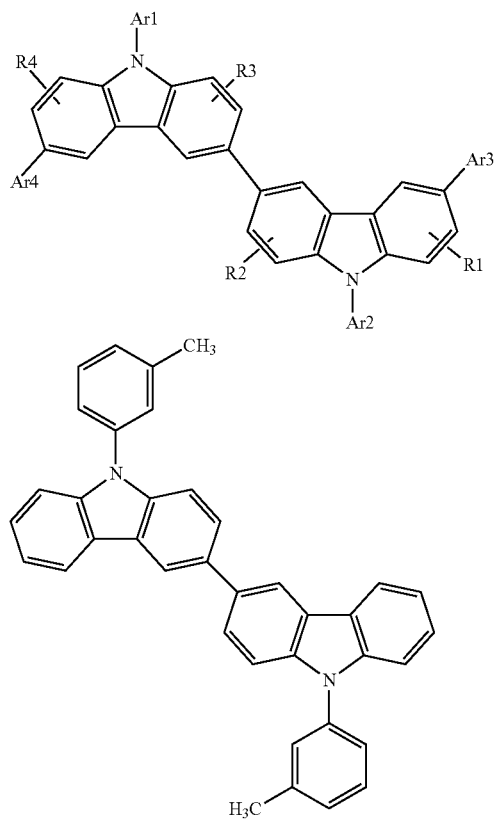

(10)

In the formula (10), R1 to R4 represent the same as R in the formula (1).

In the formula (10), Ar1 and Ar2 represent the aryl group or the heteroaryl group described in relation to R in the formula (1).

In the formula (10), Ar3 and Ar4 represent the aryl group described in relation to R in the formula (1).

Among the compounds represented by the formula (10), a compound represented by the following formula (10A) is preferable.

[Formula 14]

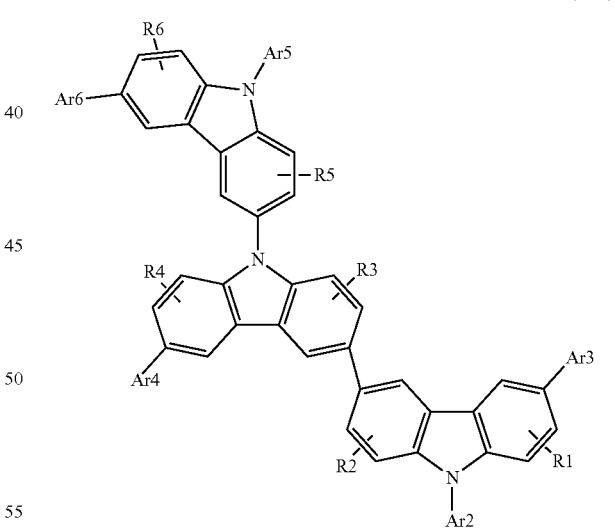

(10A)

In the formula (10A), R1 to R6 represent the same as R in the formula (1).

In the formula (10A), Ar5 represents the aryl group described in relation to R in the formula (1).

In the formula (10A), Ar6 represents a hydrogen atom or the aryl group described in relation to R in the formula (1).

Examples of the compounds represented by the formulae (10) and (10A) are shown below.

[Formula 15]
[Formula 16]
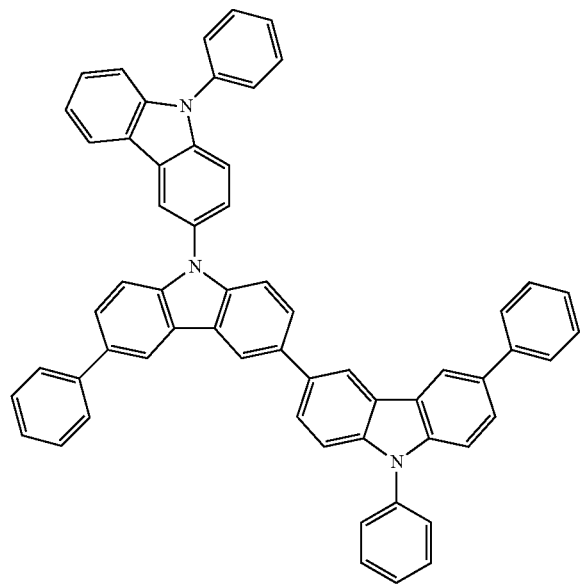
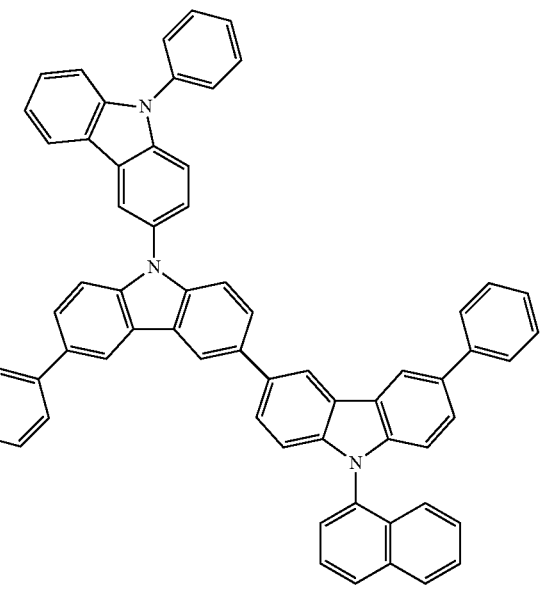
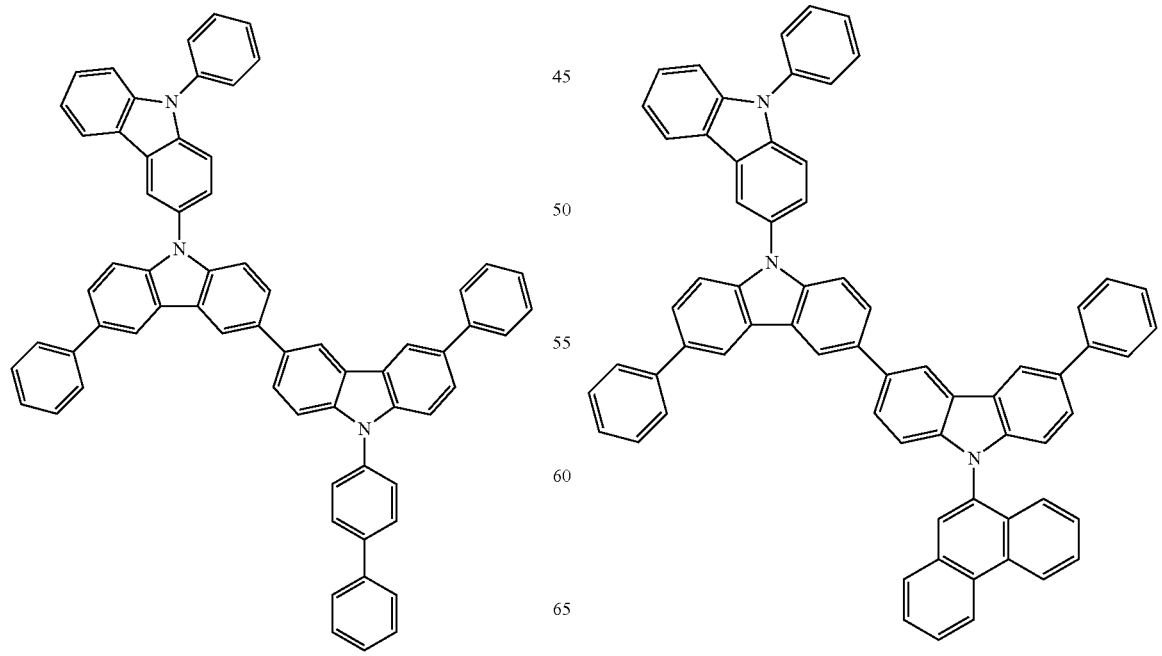

[Formula 17]
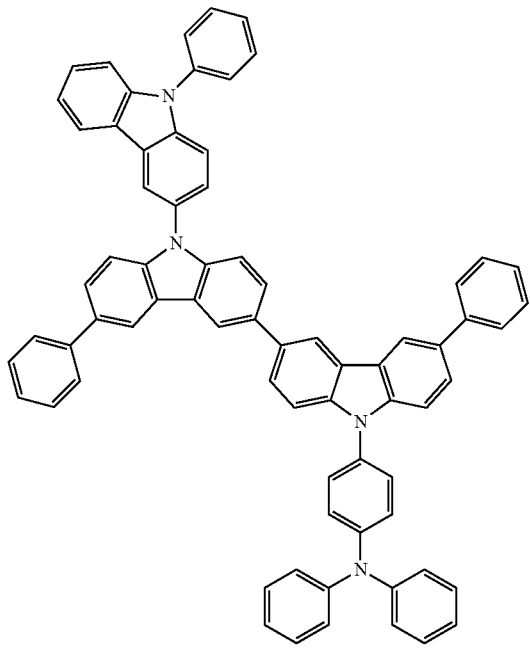
[Formula 18]
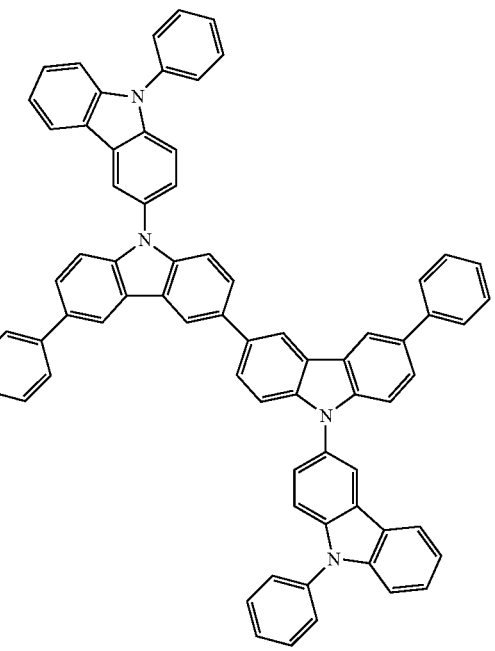
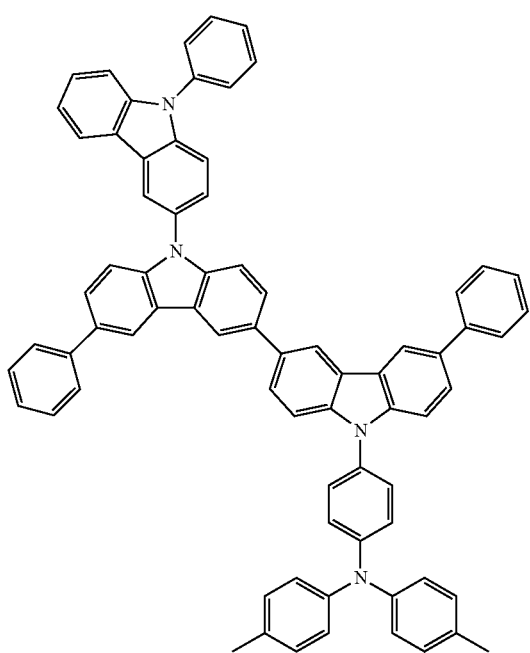
[Formula 19]
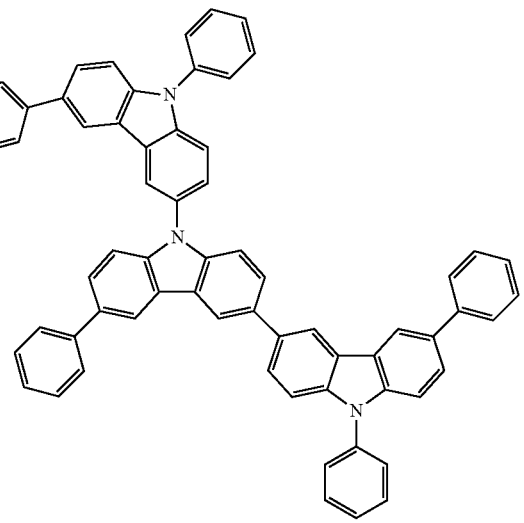

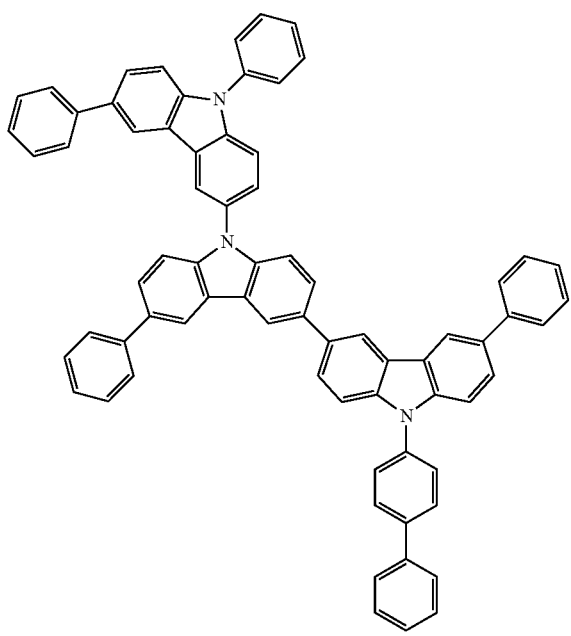 [SMILES: c1ccc(-c2ccc(-n3c4ccc(-c5ccccc5)cc4c4cc(-c5ccc6c(c5)c5cc(-c7ccccc7)ccc5n6-c5ccc6c(c5)c5cc(-c7ccccc7)ccc5n6-c5ccccc5)ccc43)cc2)cc1]

In the exemplary embodiment, the first host is preferably a compound represented by the following formula (11).

[Formula 20]

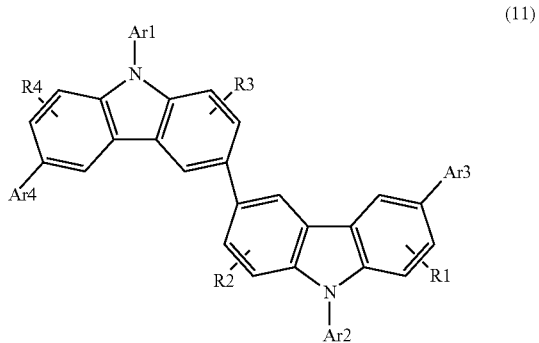

In the formula (11), R1 to R4 represent the same as R in the formula (1).

In the formula (11), Ar1 and Ar2 represent the aryl group or the heteroaryl group described in relation to R in the formula (1).

In the formula (11), Ar3 and Ar4 represent a hydrogen atom or the aryl group described in relation to R in the formula (1).

Among the compounds represented by the formula (11), a compound represented by the following formula (11A) is preferable.

[Formula 21]

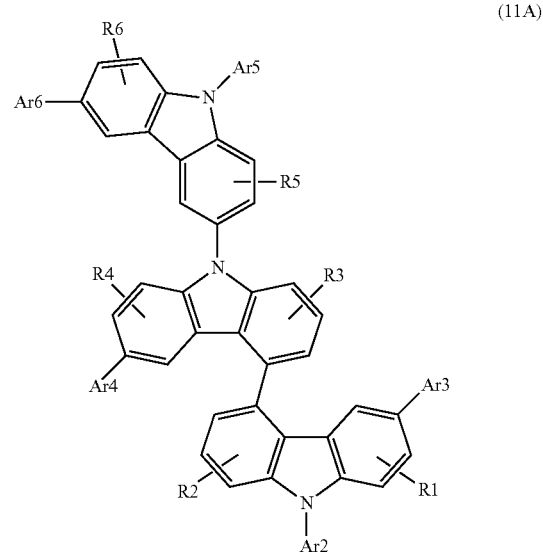

In the formula (11A), R1 to R6 represent the same as R in the formula (1).

In the formula (11A), Ar5 represents the aryl group described in relation to R in the formula (1).

In the formula (11A), Ar6 represents a hydrogen atom or the aryl group described in relation to R in the formula (1).

Examples of the compounds represented by the formulae (11) and (11A) are shown below.

[Formula 22]

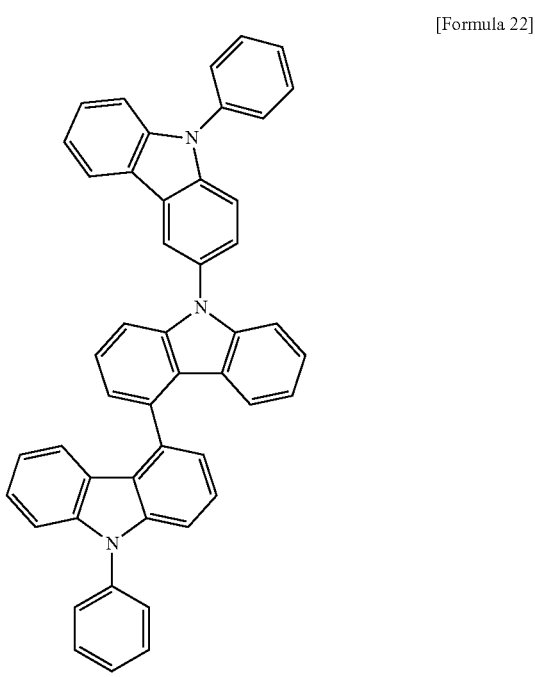

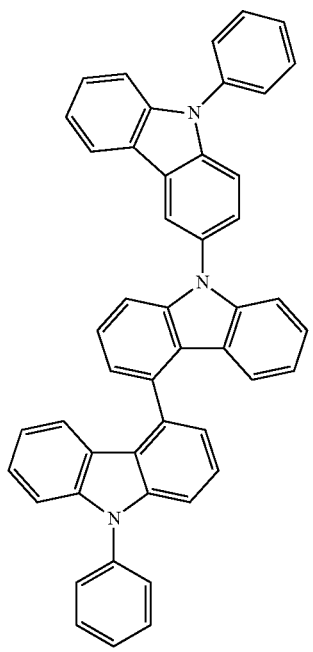
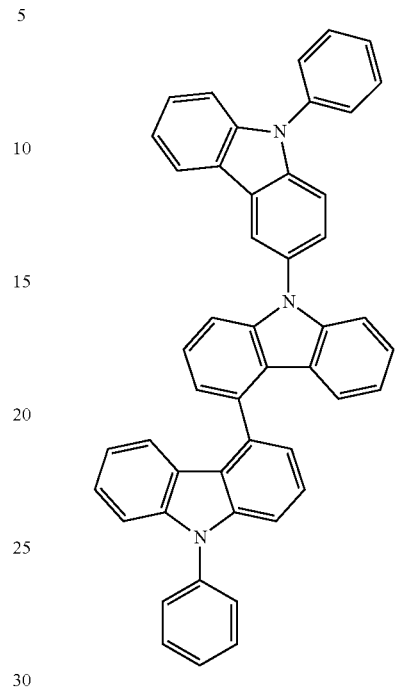
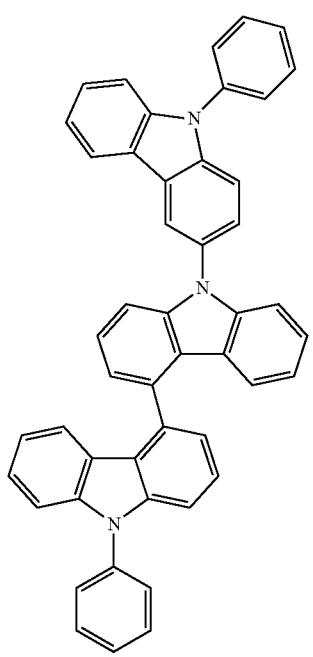
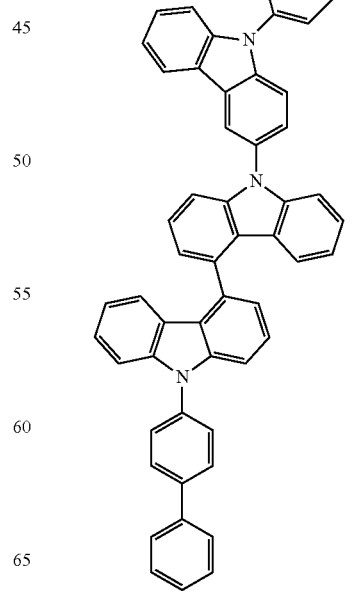
[Formula 23]

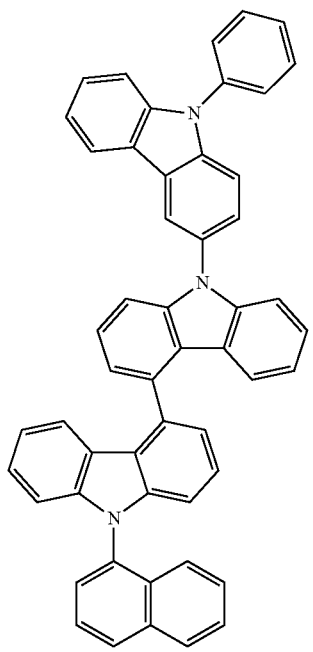
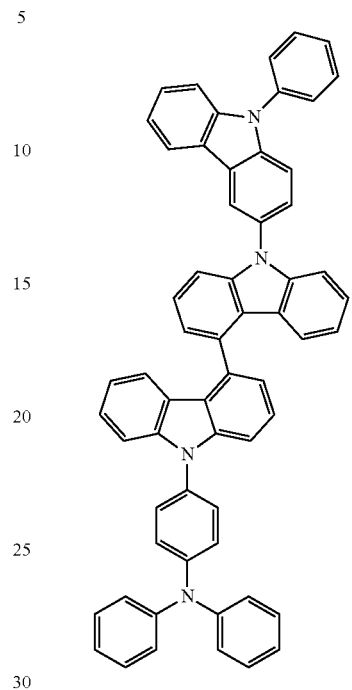
[Formula 24]
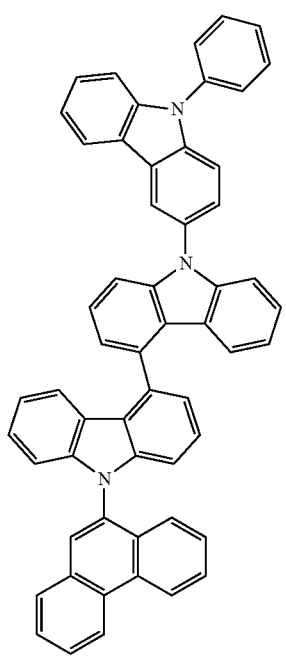
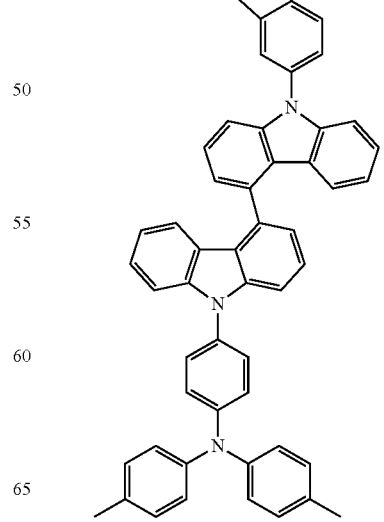

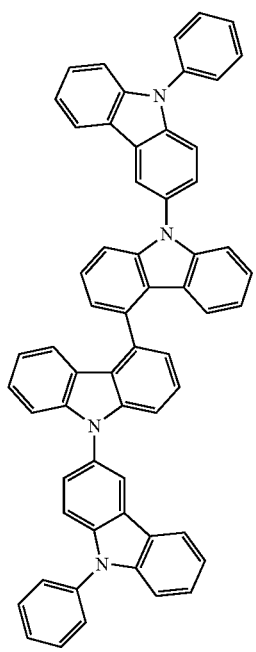
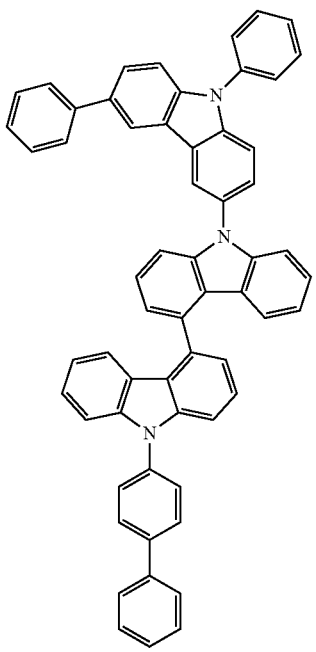
[Formula 25]
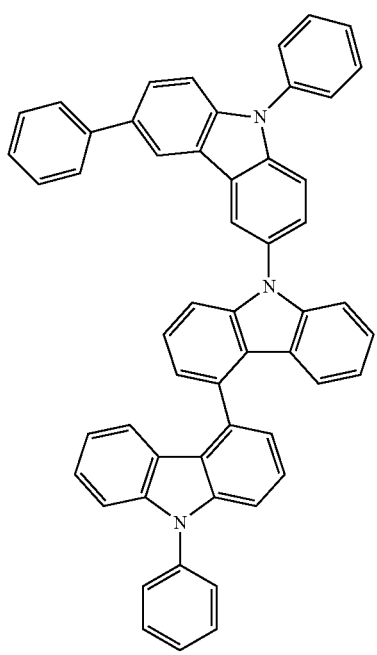
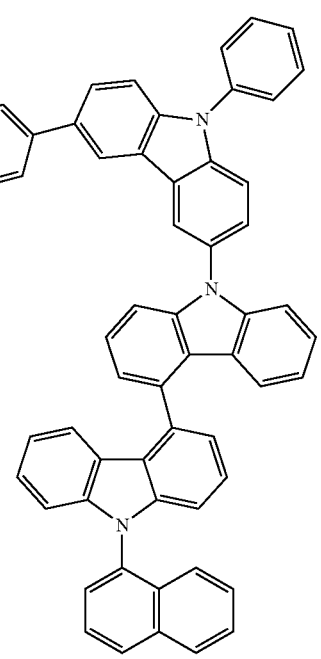

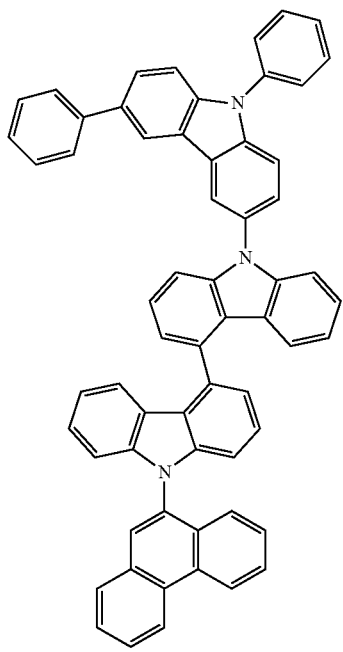
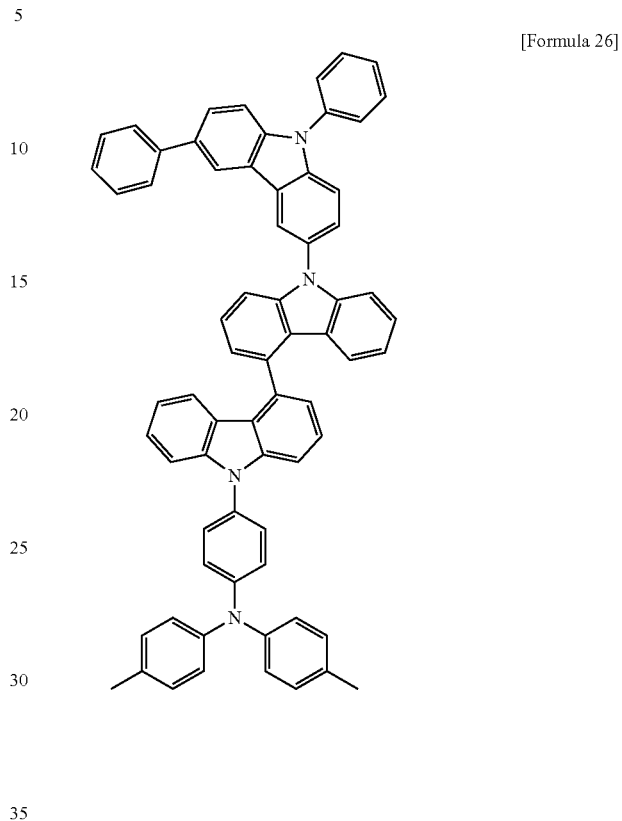
[Formula 26]
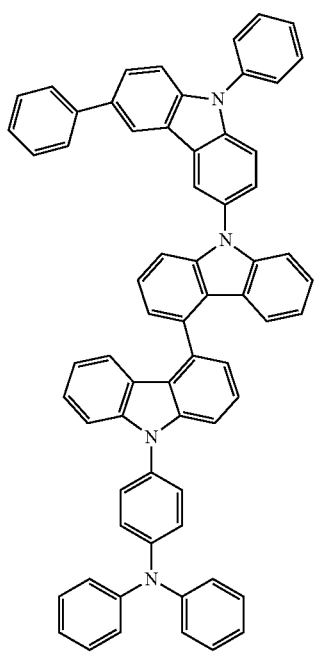
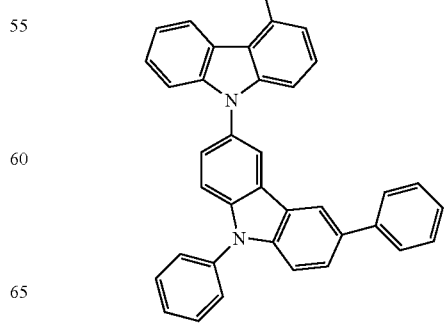

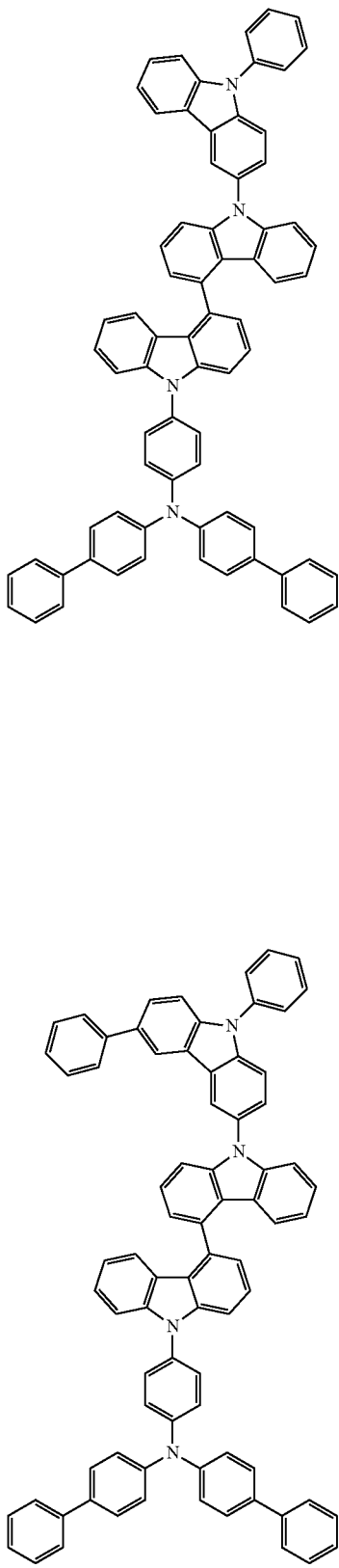

[Formula 27]

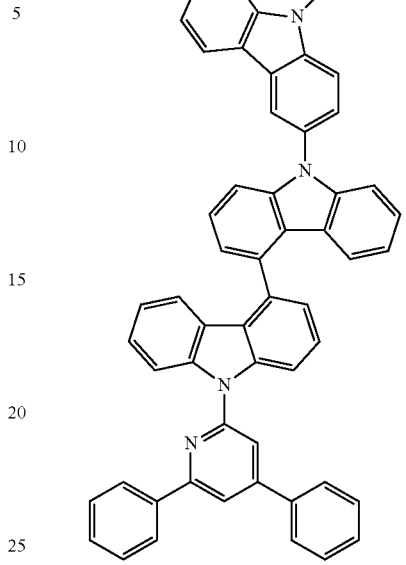

Second Host

In the exemplary embodiment, the triplet energy of the second host is 2.8 eV or more.

The second host is preferably an azine compound.

In the exemplary embodiment, the second host is preferably a compound represented by the following formula (3).

[Formula 28]

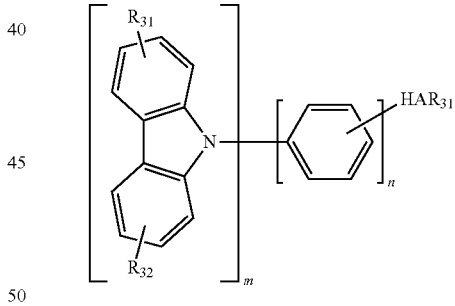

(3)

In the formula (3), $HAR_{31}$ is a substituted or unsubstituted heteroaryl.

In the formula (3), m is an integer of 0 to 5, preferably an integer of 1 to 3, more preferably an integer of 1 or 2.

In the formula (3), n is an integer of 0 to 3. When n is equal to 0, $HAR_{31}$ is bonded to a nitrogen atom in the carbazole skeleton.

In the formula (3), each of $R_{31}$ and $R_{32}$ is a substituted or unsubstituted alkyl group, aryl group or the like. $R_{31}$ and $R_{32}$ may be bonded to provide a cyclic structure with a fused benzene ring.

In the exemplary embodiment, the second host is preferably any one of the compounds represented by the following formulae (4) to (8) and (8A).

[Formula [29]]

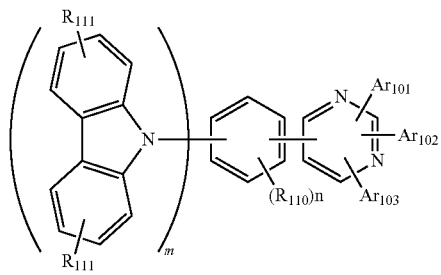
(4)

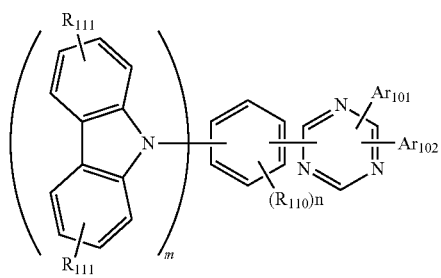
(5)

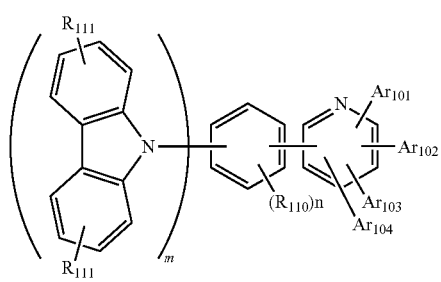
(6)

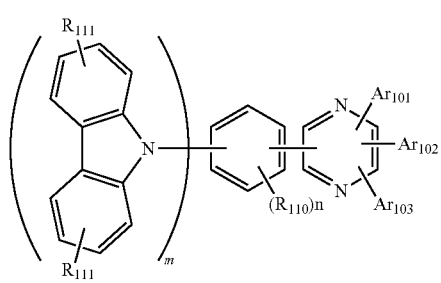
(7)

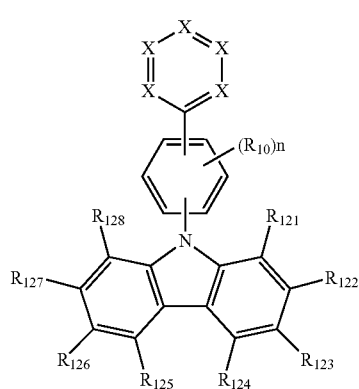
(8)

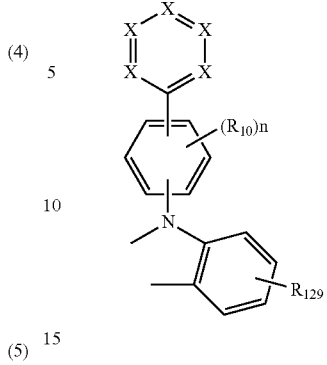
(8A)

In the formulae (4) to (7), each of $Ar_{101}$ to $Ar_{104}$ represents one of the following:

an aryl group having 6 to 60 carbon atoms (which may have a substituent); and a heterocyclic group having 3 to 60 carbon atoms (which may have a substituent). Examples of the substituent may be the same as those described in relation to R in the formula (1).

In the formulae (4) to (7), each of $R_{110}$ to $R_{111}$ represents a substituent, examples of which are the same as those in relation to R in the formula (1).

In the formulae (4) to (7), n is an integer of 0 to 4 and m is an integer of 0 to 5.

The sum of n and m, i.e., (n+m), satisfies a relationship of $1 \leq (n+m) \leq 5$.

In the formulae (8) and (8A), X is N or CH and the number of N is 1 to 4.

In the formula (8), each of $R_{121}$ to $R_{128}$ represents any one of the following:

a hydrogen atom;

an aryl group;

a heteroaryl group;

an alkyl group; and a structure to which the skeleton of the formula (8A) is bonded. The aryl group, heteroaryl group and alkyl group are the same as those described in relation to R in the formula (1).

The structure in which the skeleton of the formula (8A) is bonded to $R_{121}$ to $R_{128}$ is a structure in which at least $R_{121}$ and $R_{122}$, $R_{122}$ and $R_{123}$, $R_{123}$ and $R_{124}$, $R_{125}$ and $R_{126}$, $R_{126}$ and $R_{127}$, or $R_{127}$ and $R_{128}$ are bonded to the skeleton of the formula (8A).

In the formula (8A), $R_{129}$ represents any one of the following:

a hydrogen atom;

an aryl group;

a heteroaryl group; and an alkyl group. The aryl group, heteroaryl group and alkyl group are the same as those described in relation to R in the formula (1).

In the formulae (8) and (8A), examples of $R_{10}$ are the same as those of R in the formula (1).

In the formulae (8) and (8A), n is the number of $R_{10}$. n is an integer of 0 to 4.

In the exemplary embodiment, the second host is also preferably a compound represented by the following formula (12).

[Formula 30]

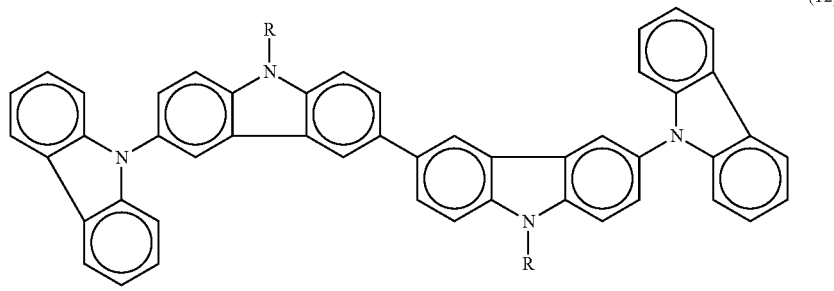

(12)

In the formula (12), R is hydrogen, an aliphatic alkyl group having 1 to 12 carbon atoms, a branched alkyl group having 1 to 12 carbon atoms, a cyclic alkyl group having 1 to 12 carbon atoms, or an aromatic group having 4 to 14 carbon atoms. The aromatic group may be substituted with one or more or two or more alkoxy or amine.

In the exemplary embodiment, the second host is also preferably the following compound (A-6) or (A-9) having a dibenzofuran skeleton.

[Formula 31] (A-6)

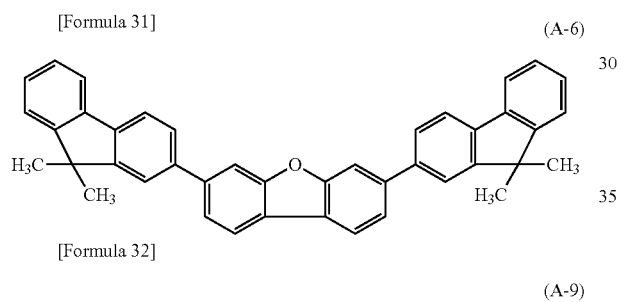

[Formula 32] (A-9)

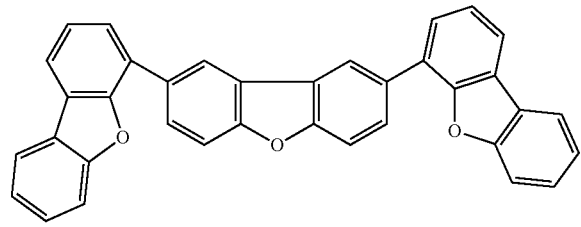

In the exemplary embodiment, the second host is preferably a compound represented by the following formula (13).

[Formula 33]

(13)

$$\begin{array}{c}\text{structure with } R_1 \text{ to } R_{12}, X\end{array}$$

In the formula (13), each of $R_1$ to $R_{12}$ represents a substituent, examples of which are the same as those in relation to R in the formula (1). In the formula (13), adjacent ones of $R_1$ to $R_4$, $R_5$ to $R_7$ or $R_8$ to $R_{12}$, or $R_7$ and $R_8$ may form a saturated or unsaturated cyclic structure.

In the formula (13), X is an oxygen atom or a sulfur atom.

Examples of the compound represented by the formula (13) are shown below.

[Formula 34]

D1

D2

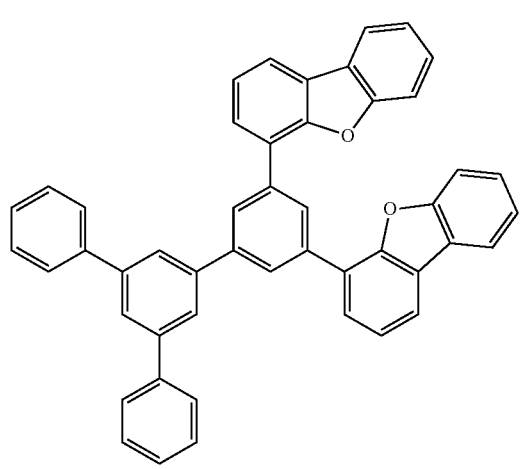
D3
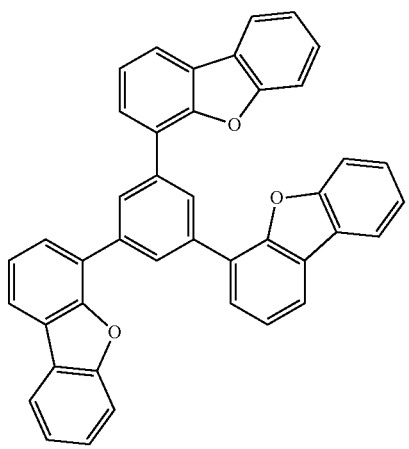
D4
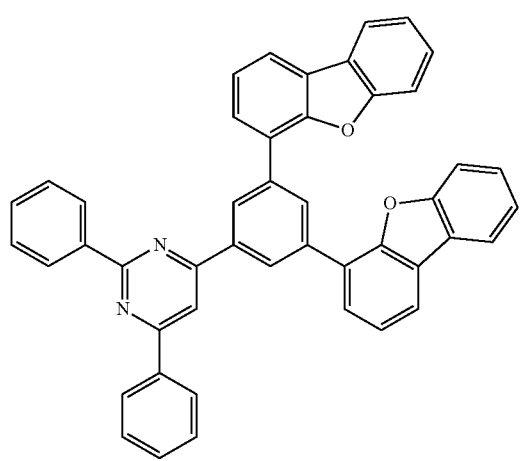
D5
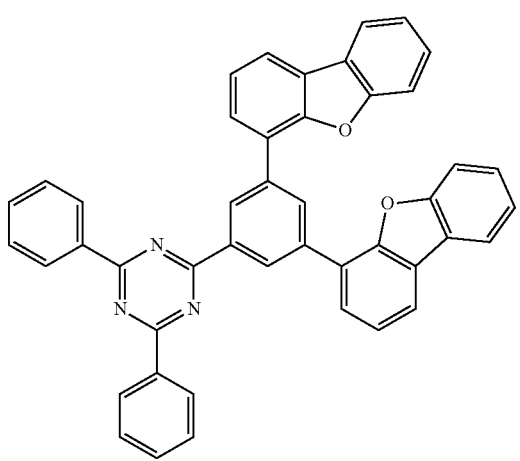
D6
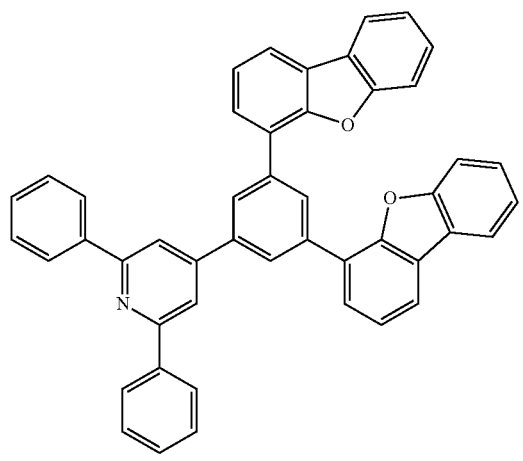
D7
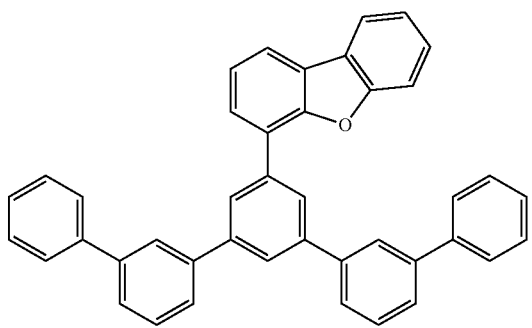
D8

-continued
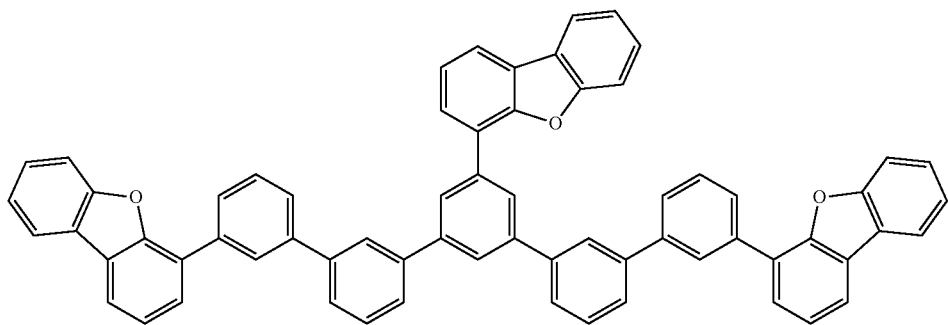
D9
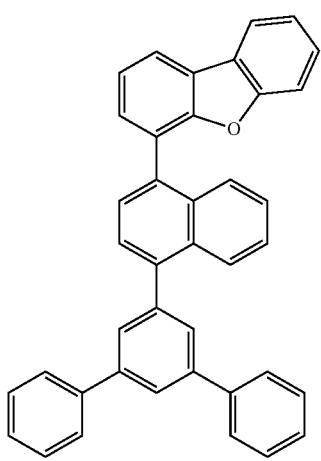
D10
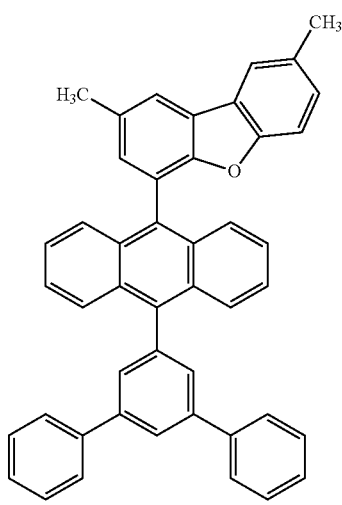
D11
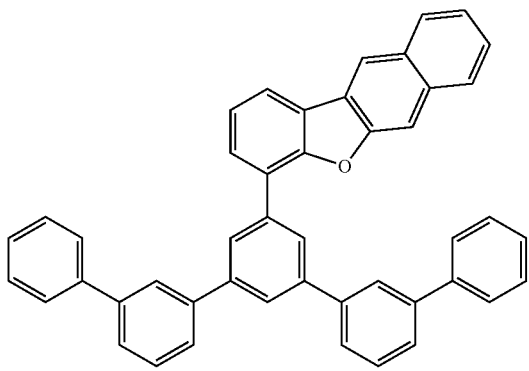
D12
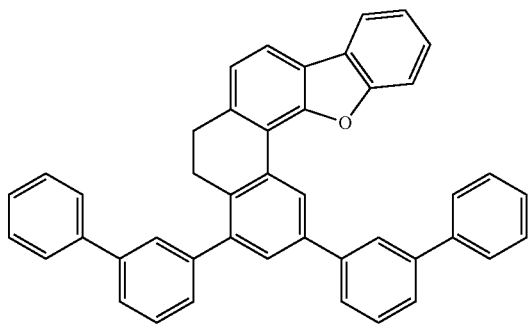
D13

-continued
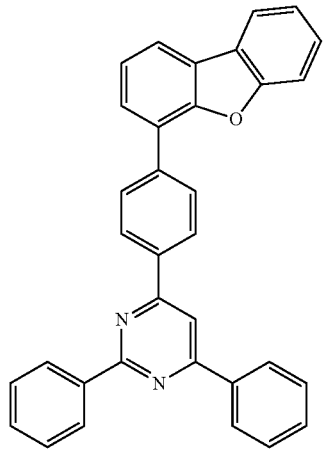
D14
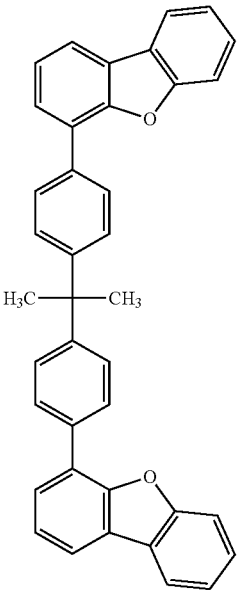
D15
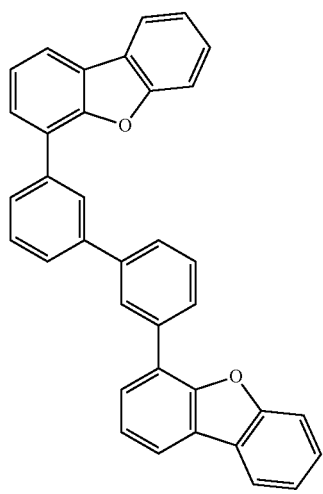
D16
[Formula 35]
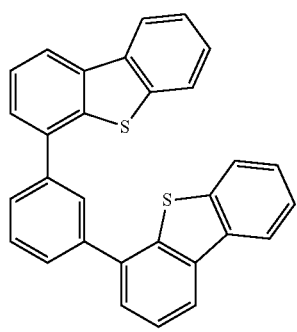
E1
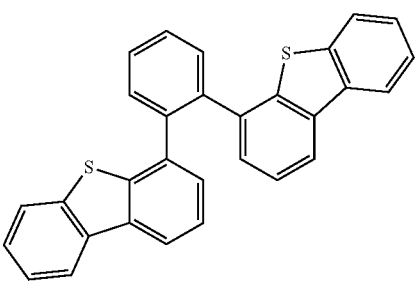
E2

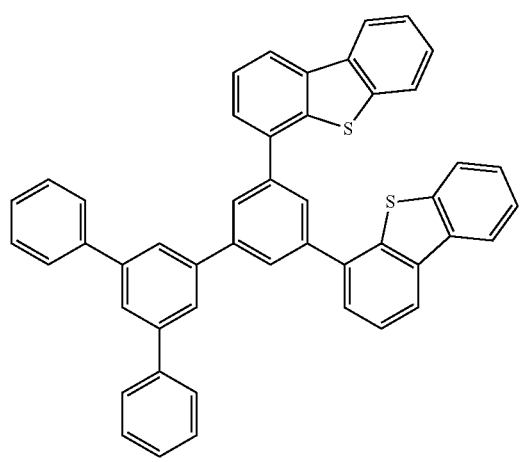
E3
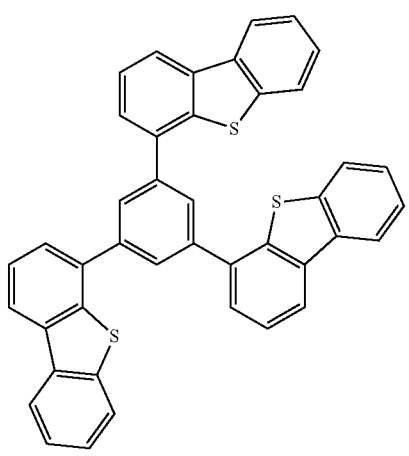
E4
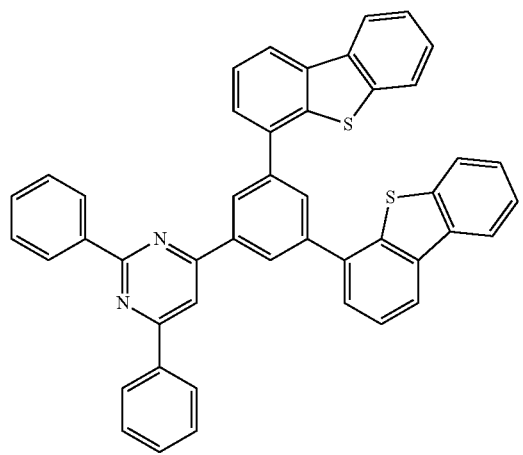
E5
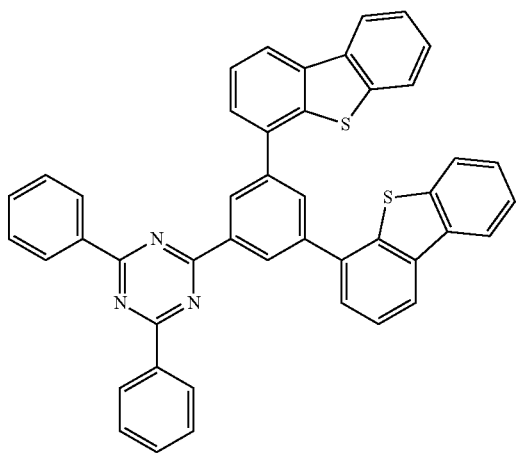
E6
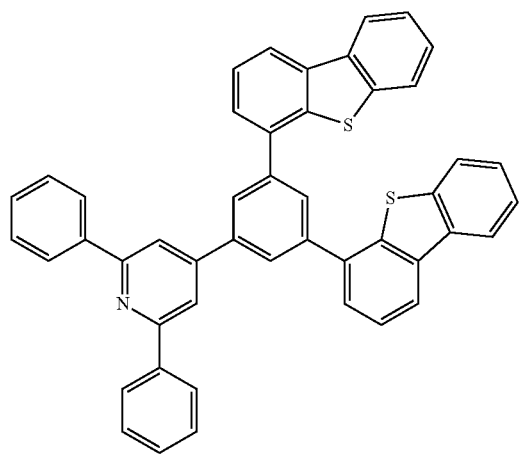
E7
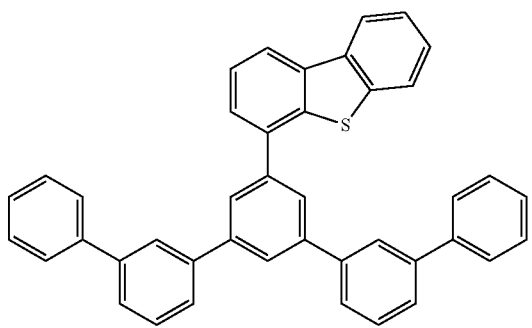
E8

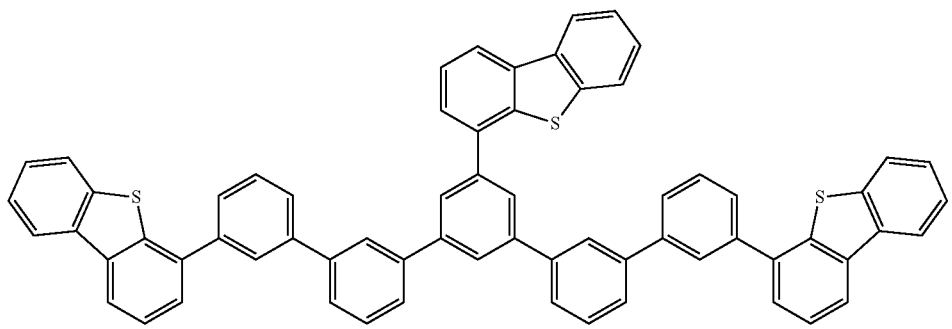
E9
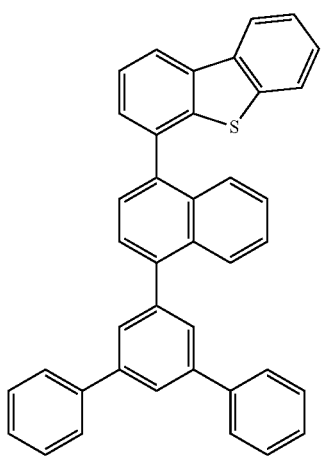
E10
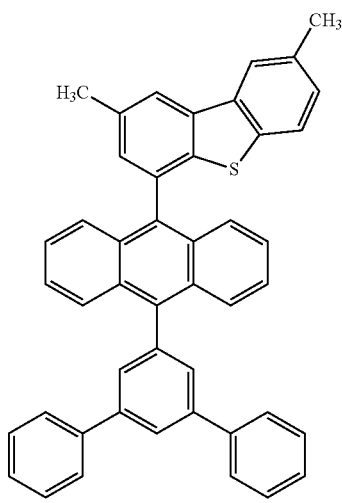
E11
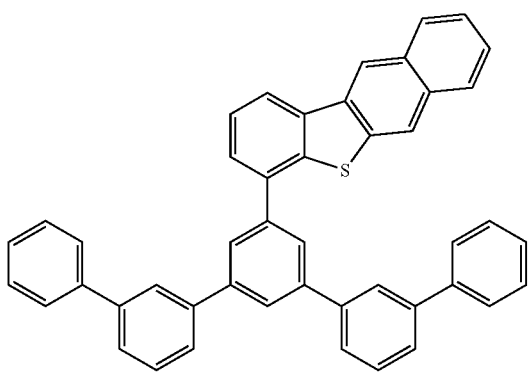
E12
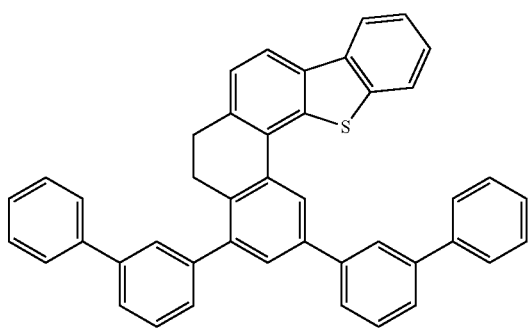
E13

-continued
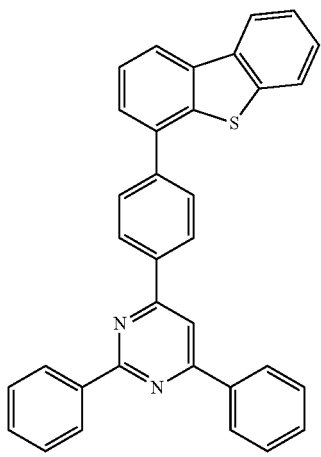
E14
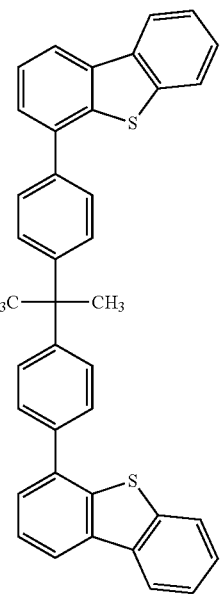
E15
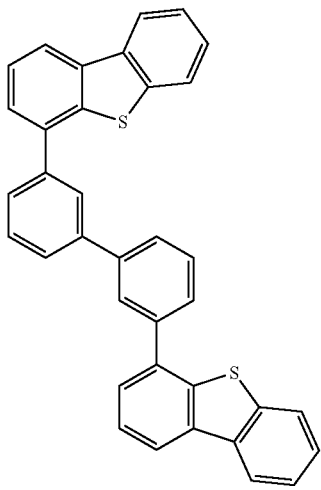
E16
In the exemplary embodiment, the second host is preferably a compound represented by the following formula (14A), (14B) or (14C).
[Formula 36]
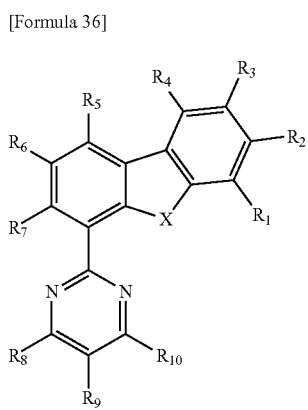
(14A)
-continued
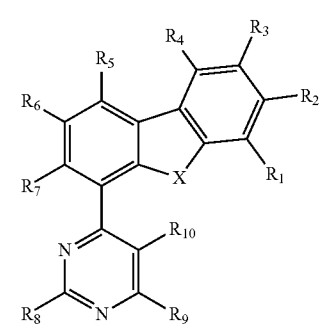
(14B)

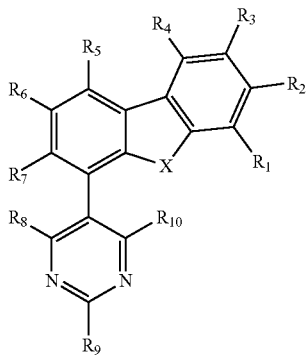
(14C)

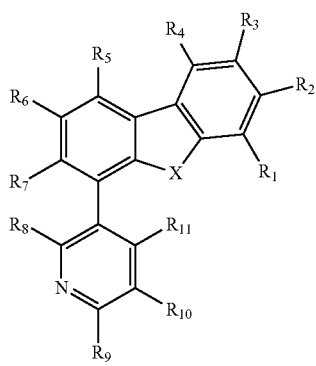
(15C)

In the formulae (14A), (14B) and (14C), each of $R_1$ to $R_{10}$ represents a substituent, examples of which are the same as those in relation to R in the formula (1).

In the formulae (14A), (14B) and (14C), adjacent ones of $R_1$ to $R_4$, $R_5$ to $R_7$ or $R_8$ to $R_{10}$, or $R_7$ and $R_8$ may form a saturated or unsaturated cyclic structure.

In the formulae (14A), (14B) and (14C), X is an oxygen atom or a sulfur atom.

In the exemplary embodiment, the second host is preferably a compound represented by the following formula (15A), (15B) or (15C).

[Formula 37]

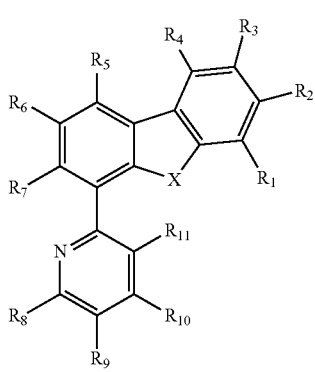
(15A)

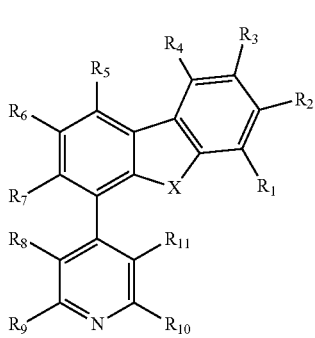
(15B)

In the formulae (15A), (15B) and (15C), each of $R_1$ to $R_{11}$ represents a substituent, examples of which are the same as those in relation to R in the formula (1).

In the formula (15A), adjacent ones of $R_1$ to $R_4$, $R_5$ to $R_7$ or $R_8$ to $R_{11}$ may form a saturated or unsaturated cyclic structure.

In the formula (15B), adjacent ones of $R_1$ to $R_4$, $R_5$ to $R_7$, $R_8$ to $R_9$ or $R_{10}$ to $R_{11}$, or $R_7$ and $R_8$ may form a saturated or unsaturated cyclic structure.

In the formula (15C), adjacent ones of $R_1$ to $R_4$, $R_5$ to $R_7$ or $R_9$ to $R_{11}$, or $R_7$ and $R_8$ may form a saturated or unsaturated cyclic structure.

In the formulae (15A), (15B) and (15C), X is an oxygen atom or a sulfur atom.

In the exemplary embodiment, the second host is preferably a compound represented by the following formula (16).

[Formula 38]

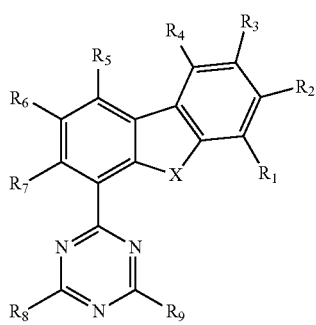
(16)

In the formula (16), each of $R_1$ to $R_9$ represents a substituent, examples of which are the same as those in relation to R in the formula (1).

In the formula (16), adjacent ones of $R_1$ to $R_4$ or $R_5$ to $R_7$ may form a saturated or unsaturated cyclic structure.

In the formula (16), X is an oxygen atom or a sulfur atom.

Examples of the compounds represented by the formulae (14A), (14B), (14C), (15A), (15B), (15C) and (16) are shown below.

[Formula 39]
D17
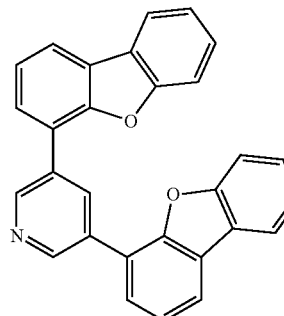
D18
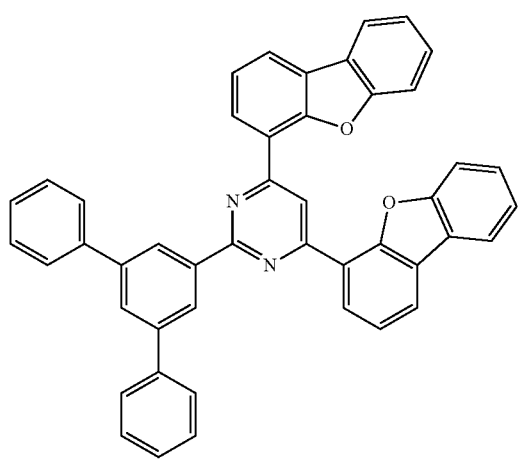
D19
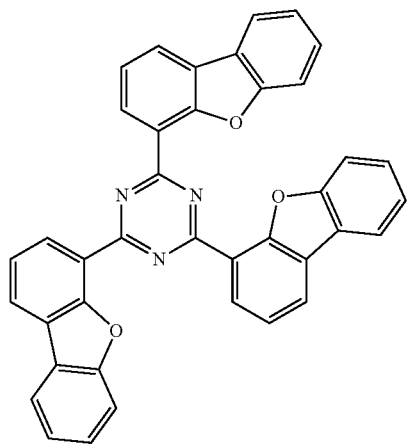
D20
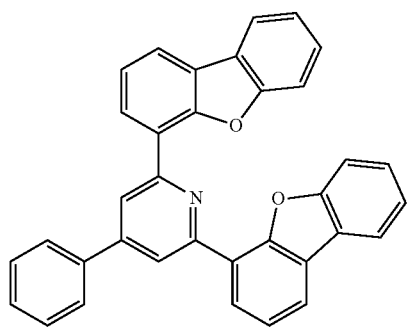
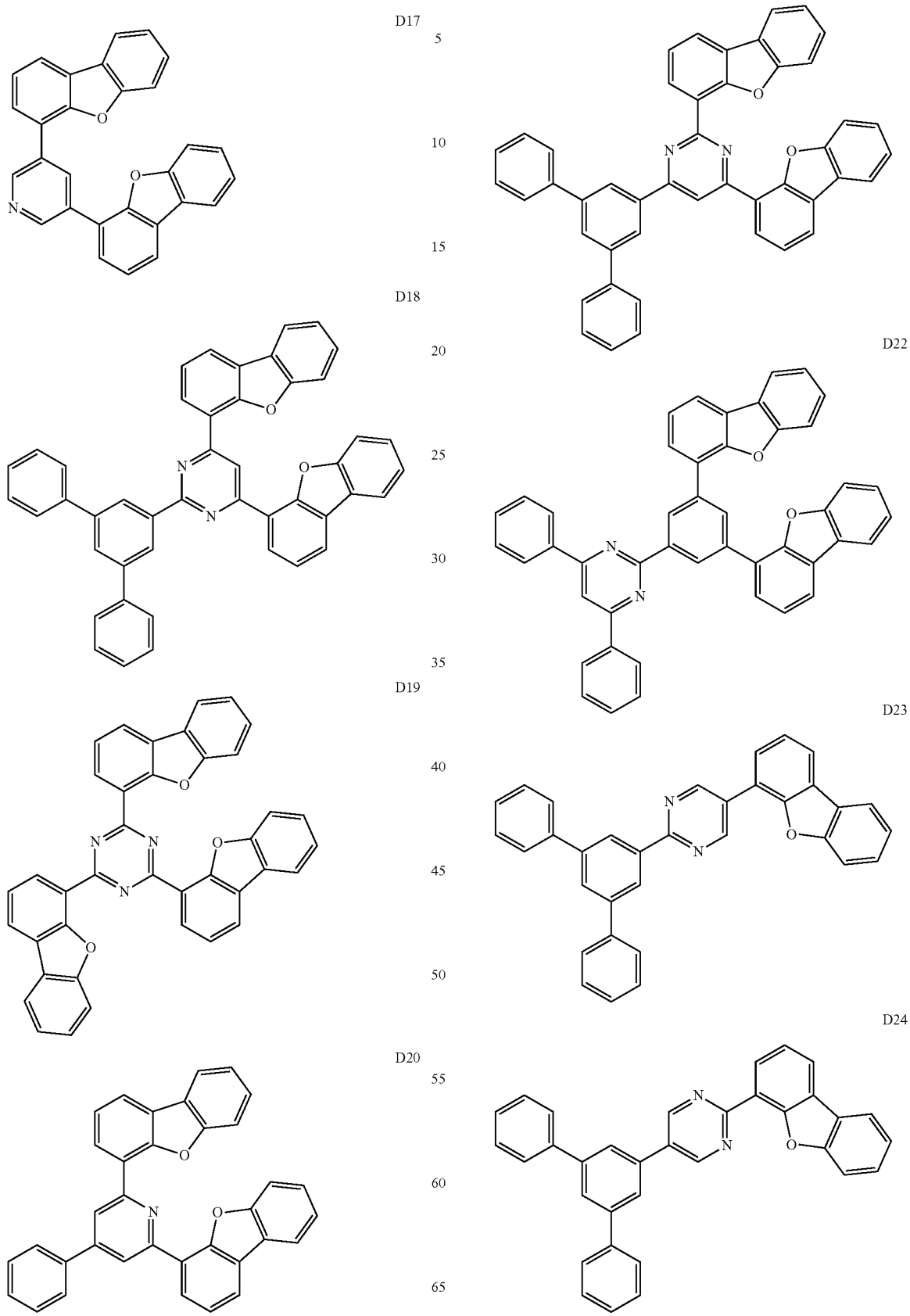

D25
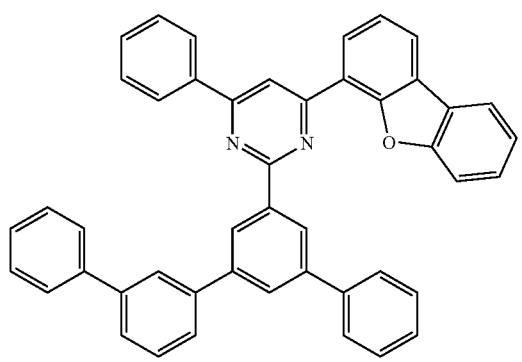
[Formula 40]
E17
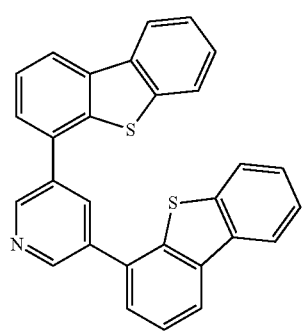
E18
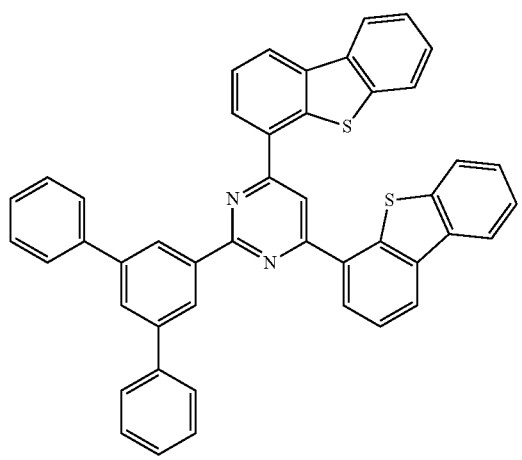
E19
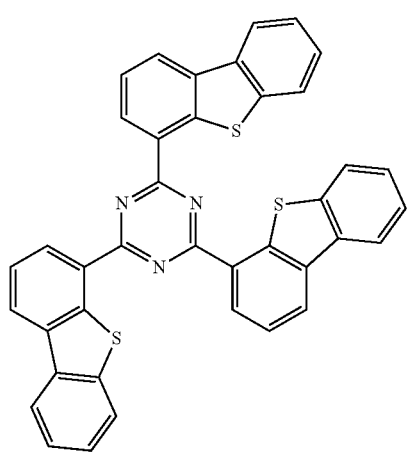
E20
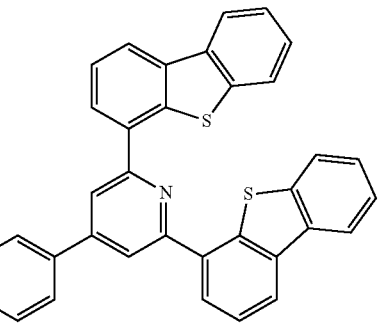
E21
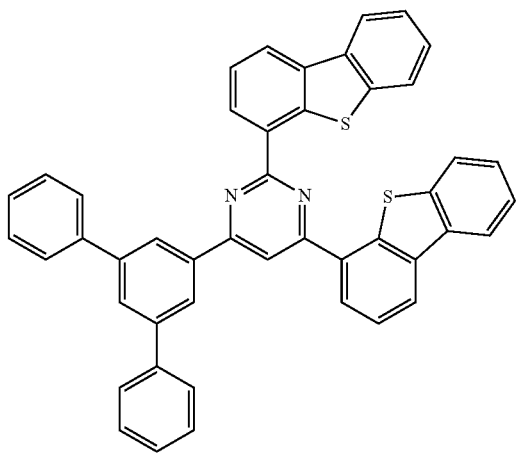
E22
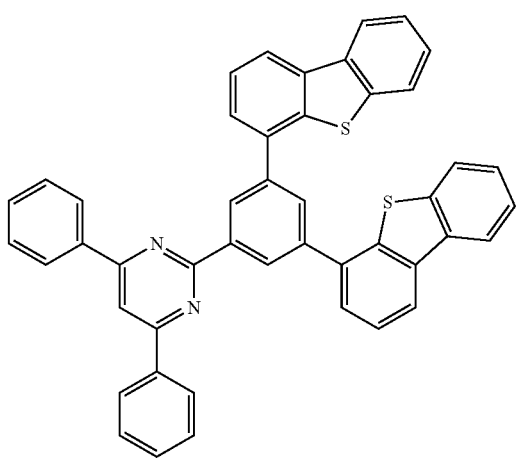
E23
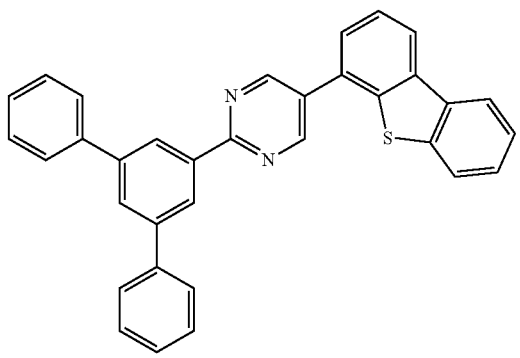

-continued

E24
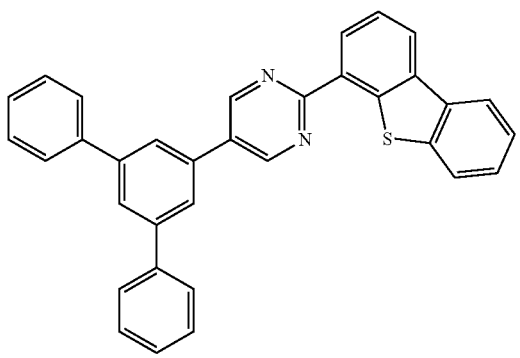

E25
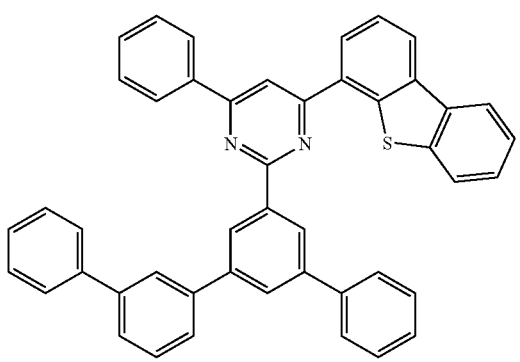

E26
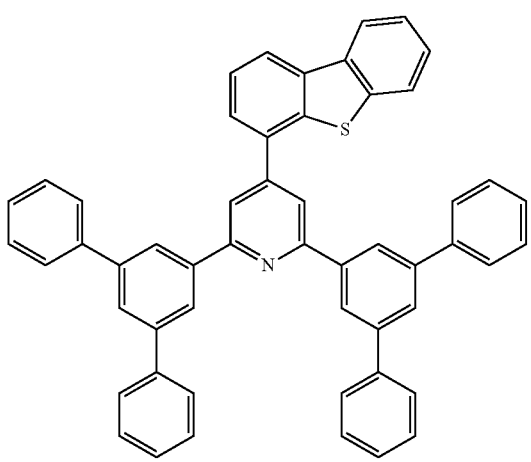

In the exemplary embodiment, the second host is preferably a compound represented by the following formula (17) or (18).

[Formula 41]

(17)
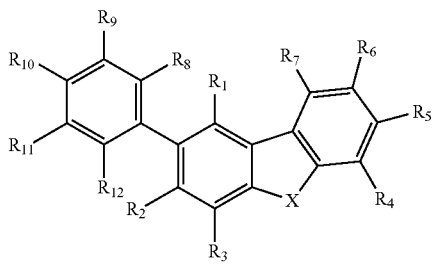

-continued

(18)
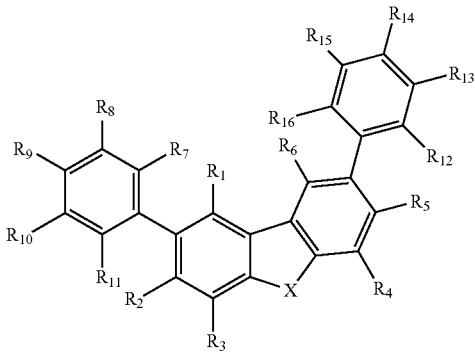

In the formulae (17) and (18), examples of each of $R_1$ to $R_{16}$ are the same as those described in relation to R in the formula (1). In the formulae (17) and (18), each of $R_1$ to $R_{16}$ may represent one of the following:

a substituted or unsubstituted alkenyl group having 2 to 40 carbon atoms;

a substituted or unsubstituted aralkyl group having 7 to 20 carbon atoms;

a substituted or unsubstituted aralkylamino group having 7 to 60 carbon atoms;

a substituted or unsubstituted aralkylsilyl group having 8 to 40 carbon atoms;

a substituted or unsubstituted alkylgermanium group having 3 to 20 carbon atoms;

a substituted or unsubstituted arylgermanium group having 8 to 40 carbon atoms;

a substituted or unsubstituted aralkylgermanium group having 8 to 40 carbon atoms; and a substituted or unsubstituted ketoaryl group having 7 to 40 carbon atoms.

In the formula (17), adjacent ones of $R_4$ to $R_7$ or $R_8$ to $R_{12}$ may form a saturated or unsaturated cyclic structure.

In the formula (18), adjacent ones of $R_7$ to $R_{11}$ or $R_{12}$ to $R_{16}$ may form a saturated or unsaturated cyclic structure.

In the formulae (17) and (18), X is an oxygen atom or a sulfur atom. When X is an oxygen atom, it is preferable that a fused aromatic hydrocarbon group is not included in the substituent for the dibenzofuran skeleton.

Examples of the compounds represented by the formulae (17) and (18) are shown below.

[Formula 42]

A-1
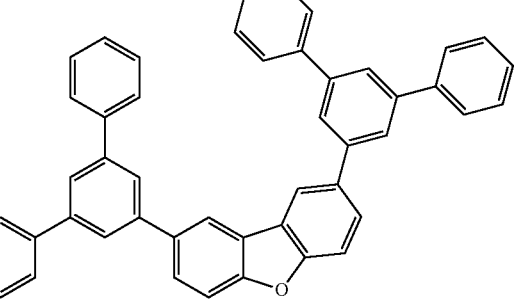

A-2
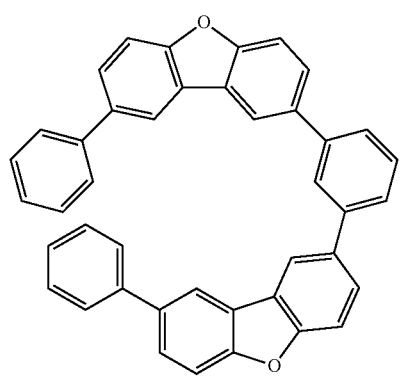
A-13
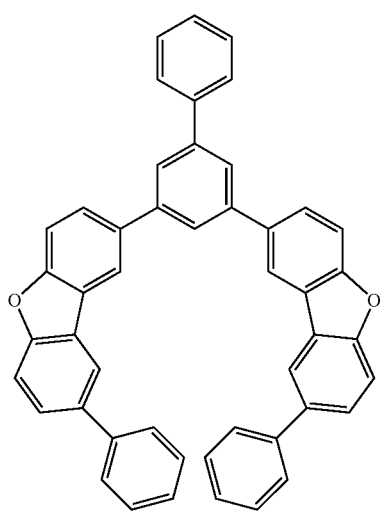
A-3
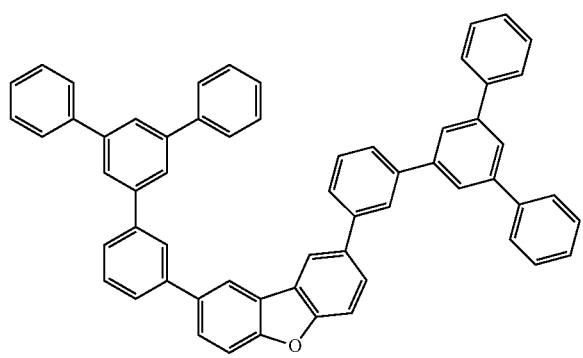
A-14
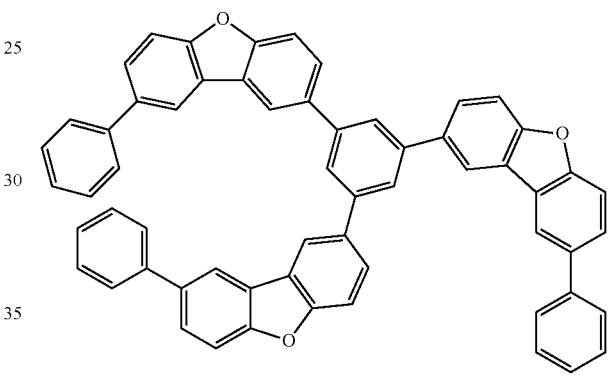
A-6
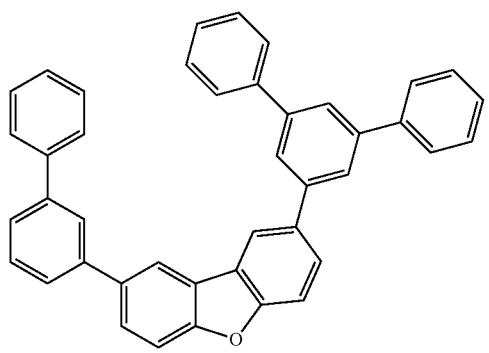
A-15
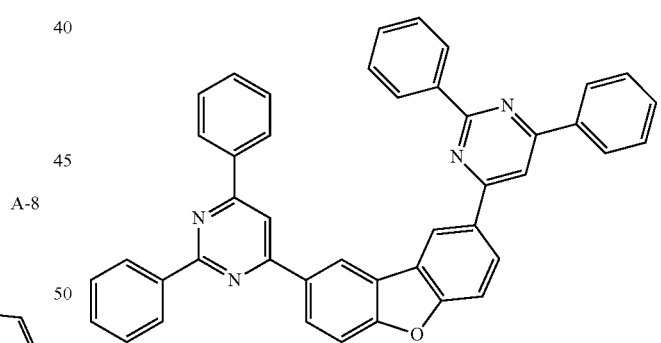
A-8
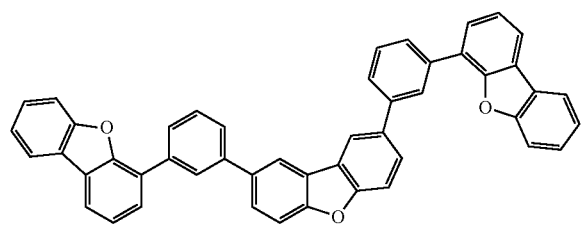
A-16
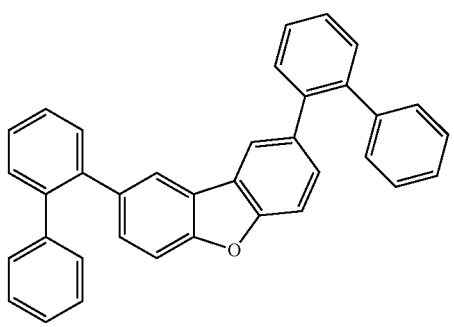
A-11
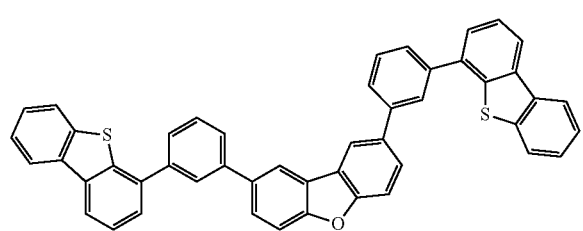

A-17
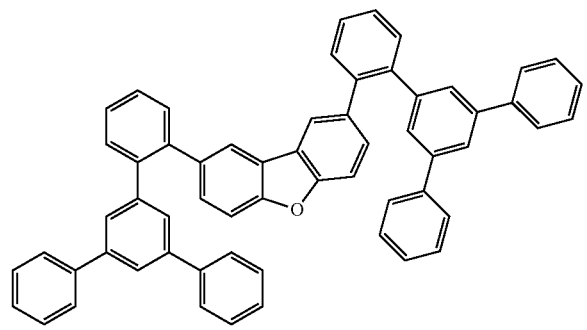
A-18
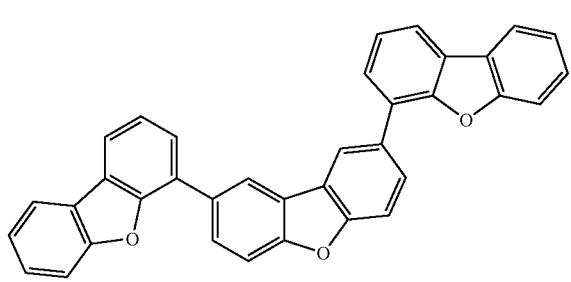
A-19
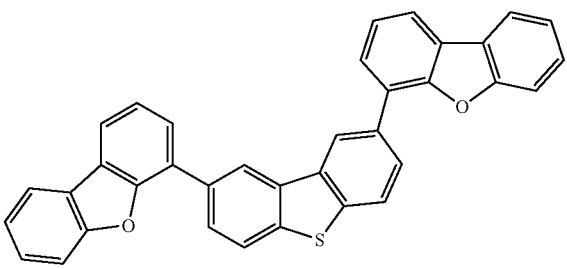
[Formula 43]
B-1
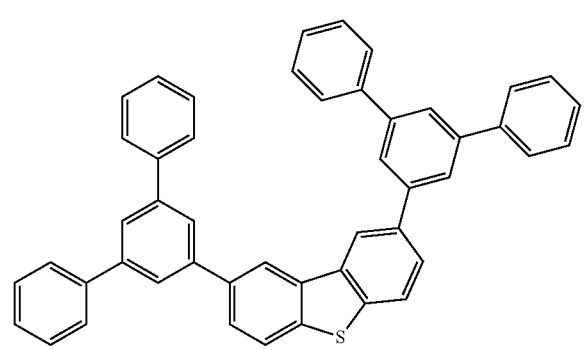
B-2
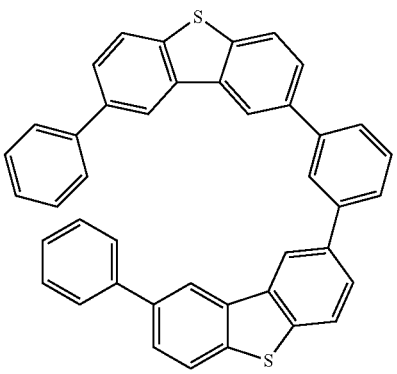
B-3
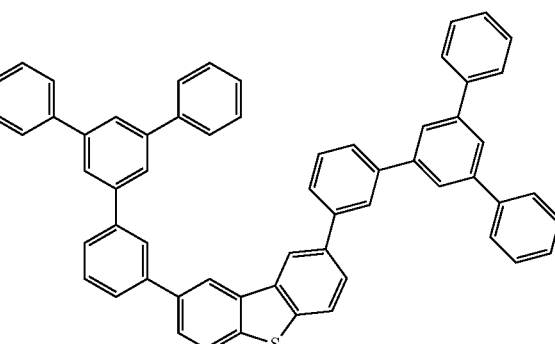
B-4
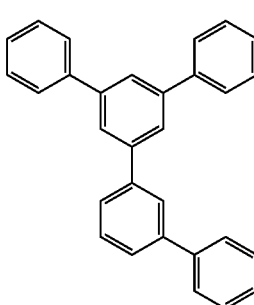
B-5
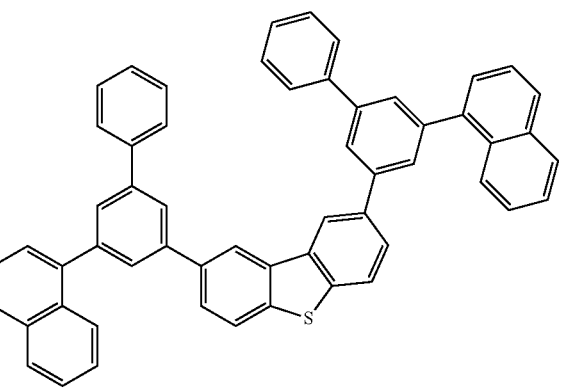

-continued
B-6
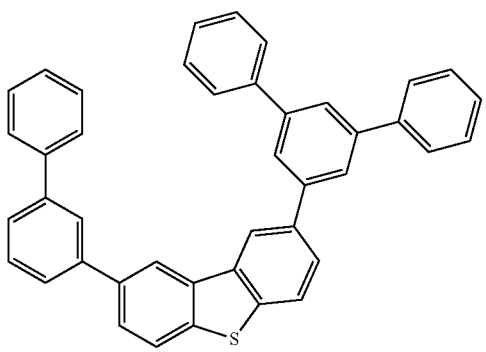
B-7
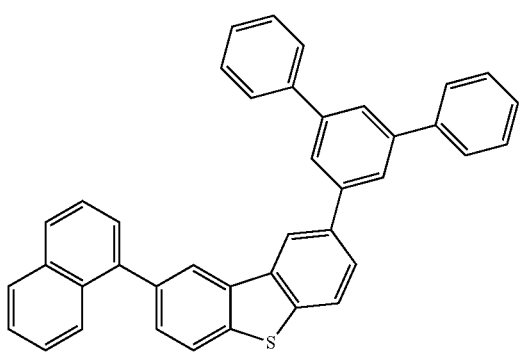
B-8
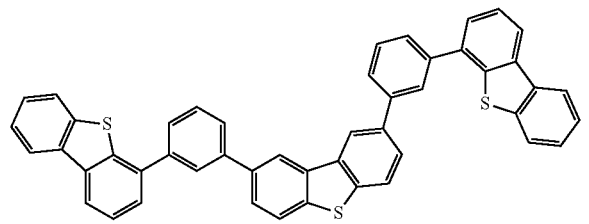
B-9
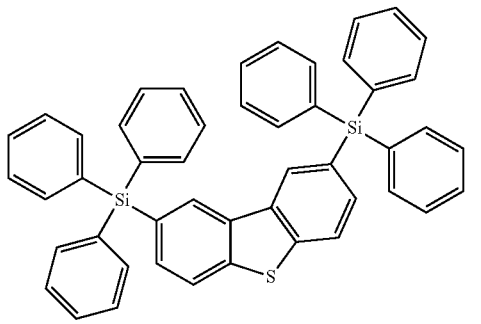
B-10
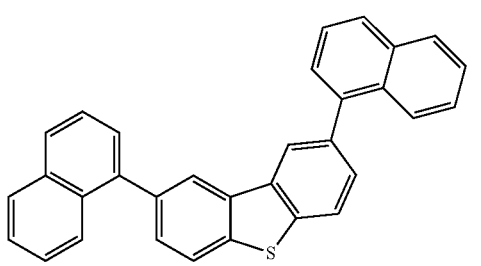
-continued
B-11
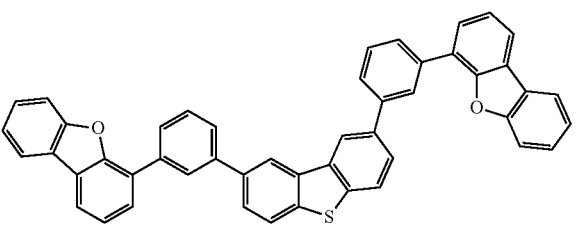
B-12
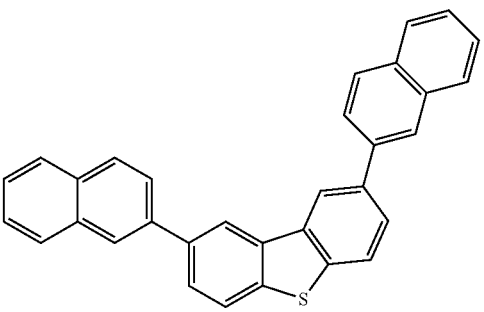
B-13
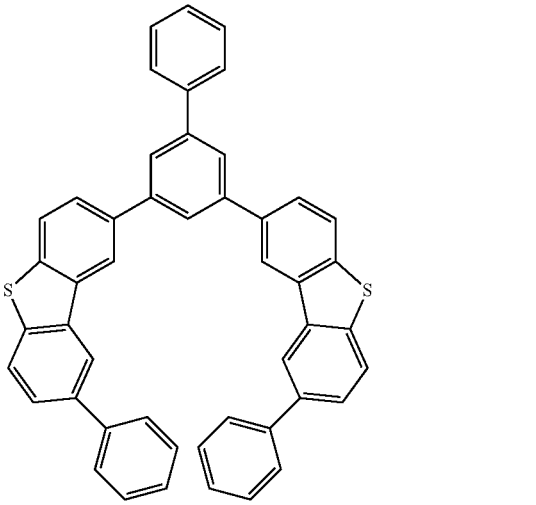
B-14
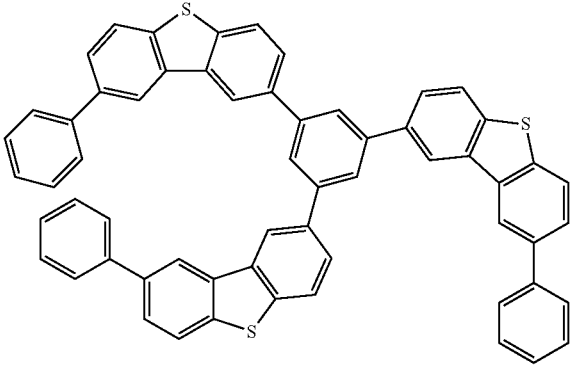

-continued

B-15
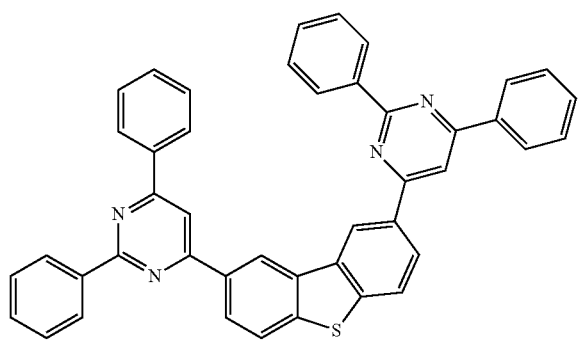

B-16
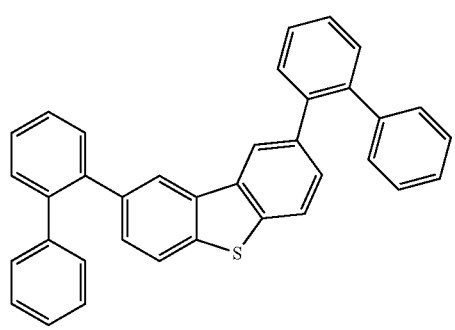

B-17
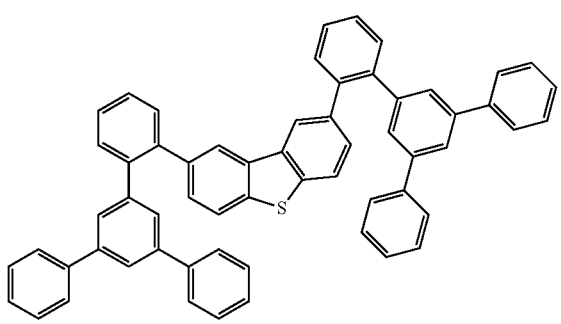

B-18
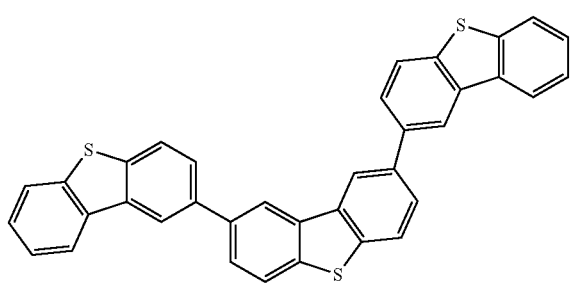

B-19
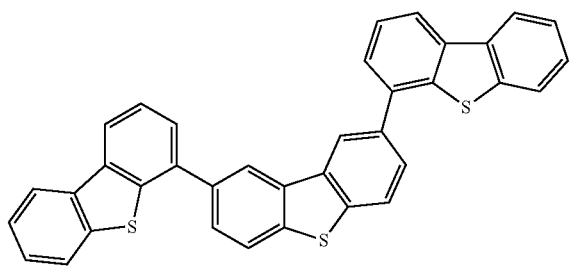

In the exemplary embodiment, it is preferable that the second host contains a compound having carbazole rings as a partial structure thereof and having in the molecule a benzene ring or a partial structure represented by the following formula (20), and all the carbazole rings of the compound are each substituted at the 9-position, substituted with a substituent(s) represented by the following formula (19) at one or more of the 1-position to the 8-position, and substituted at the 2-position or the 3-position.

[Formula 44]

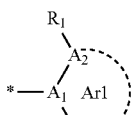

(19)

[Formula 45]

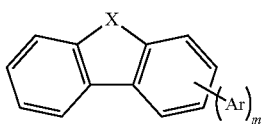

(20)

In the formula (19), * represents a bonding portion relative to the carbazole ring, and Ar1 represents an aromatic ring.

In the formula (19), each of $A_1$ to $A_3$ represents a carbon atom, nitrogen atom, oxygen atom or sulfur atom of the aromatic ring represented by Ar1. The carbon atom, nitrogen atom, oxygen atom and sulfur atom may have a hydrogen atom or a substituent.

In the formula (19), $R_1$ represents a substituent. When Ar1 is a fused ring, $R_1$ may be a part of the fused ring.

In the formula (20), X represents an oxygen atom or a sulfur atom.

In the formula (20), Ar represents an aromatic substituent.

In the formula (20), m is an integer of 0 to 4.

In the formula (19), examples of the aromatic ring represented by Ar1 are an aromatic hydrocarbon ring and an aromatic heterocycle.

Examples of the aromatic hydrocarbon ring are a benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring and anthraanthrene ring. These rings may have a substituent R1. Examples of the substituent R1 are the same as those of R in the formula (1).

In the formula (19), preferable examples of the aromatic hydrocarbon ring represented by Ar1 are a benzene ring and a naphthalene ring.

Examples of the aromatic heterocycle are a furan ring, benzofuran ring, dibenzofuran ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, benzimidazole ring, benzothiazole ring, benzoxazole ring, quinoxaline ring, quinazoline ring, phthalazine ring, carbazole ring, carboline ring and diazacarbazole ring (i.e., a ring in which one carbon atom in a hydrocarbon ring of a carboline ring is substituted with a nitrogen atom). These rings may have a substituent R1. Examples of the substituent R1 are the same as those of R in the formula (1).

In the formula (19), preferable examples of the aromatic heterocycle represented by Ar1 are a benzofuran ring, dibenzofuran ring, pyrrole ring, pyridine ring, imidazole ring and benzimidazole ring.

In the formula (20), the aromatic substituent represented by Ar is an aromatic hydrocarbon ring group (also referred to as an aromatic hydrocarbon group, an aryl group or the like) or an aromatic heterocyclic group. Examples of the aromatic hydrocarbon ring group are a phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group and biphenylyl group. These aromatic hydrocarbon ring groups may be unsubstituted or may have the substituent represented by R1 in the formula (19).

Examples of the aromatic heterocyclic group are a pyridyl ring, pyrimidinyl ring, furyl ring, pyrrolyl ring, imidazolyl ring, benzimidazolyl ring, pyrazolyl group, pyrazinyl group, triazolyl ring (e.g., 1,2,4-triazole-1-yl group and 1,2,3-triazole-1-yl group), oxazolyl group, benzoxazolyl group, thiazolyl group, isoxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl group (i.e., a group in which one carbon atom in a carboline ring of the carbolinyl group is substituted with a nitrogen atom), quinoxalinyl group, pyridazinyl group, triazinyl group, quinazolinyl group and phthalazinyl group. These aromatic heterocyclic groups may be unsubstituted or may have the substituent represented by R1 in the formula (19).

Examples of such a compound having such carbazole rings as a partial structure thereof are shown below.

[Formula 46]

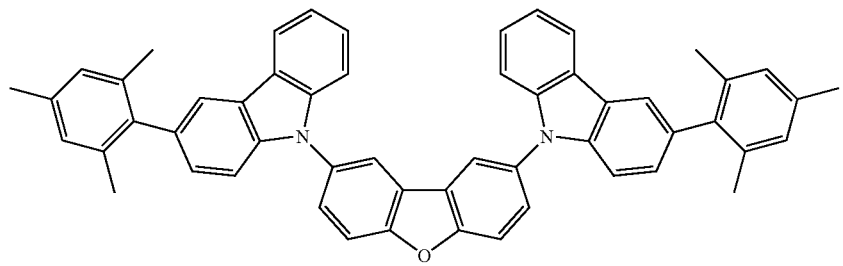

(1)

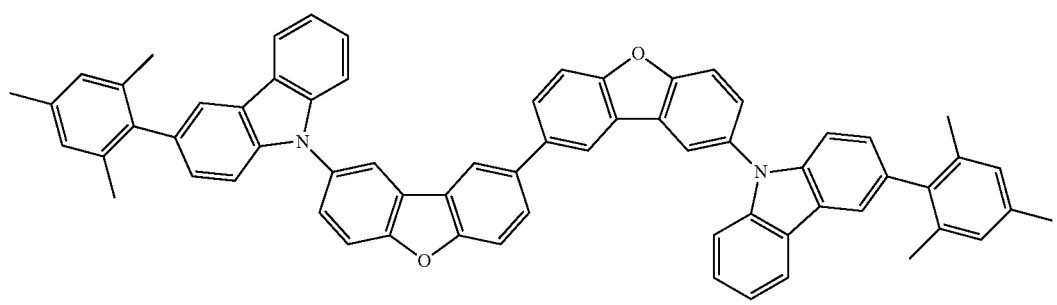

(2)

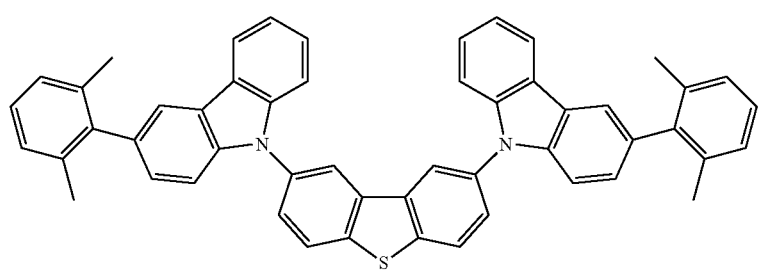

(3)

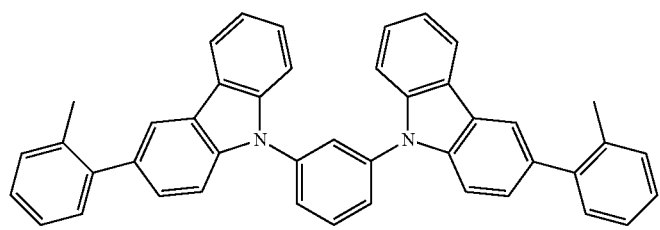

(4)

[Formula 47]
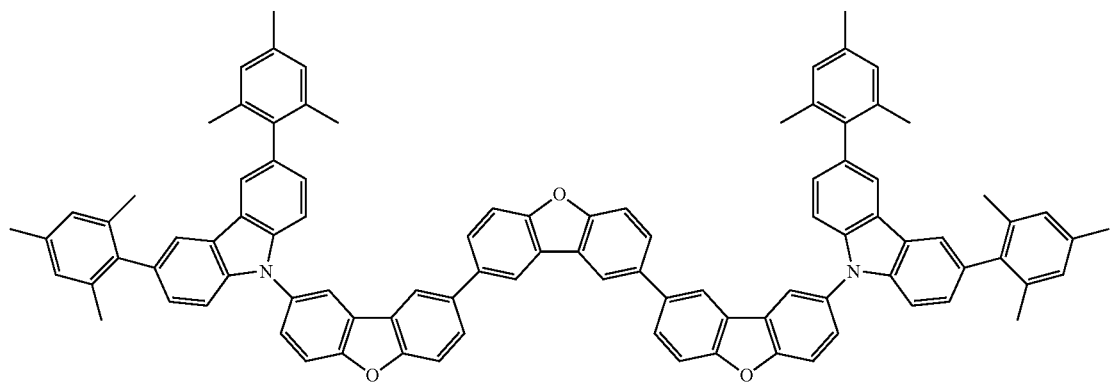
(5)
(6)
[Formula 48]
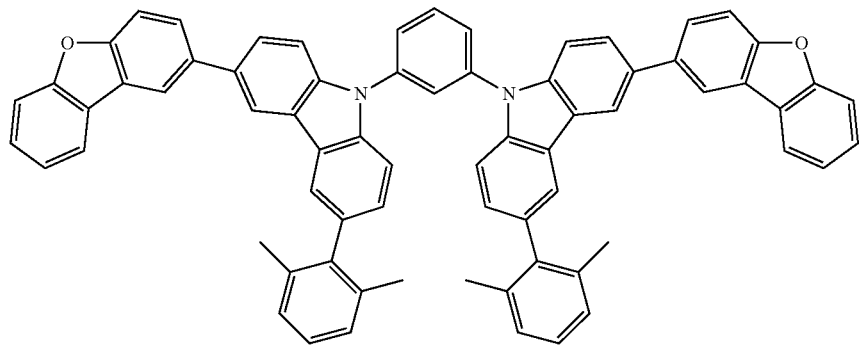
(7)
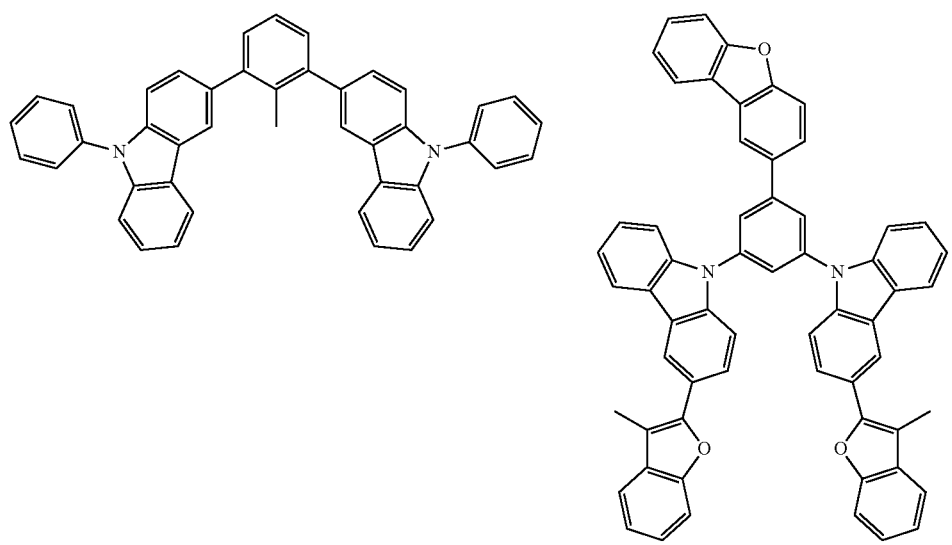
(8)
(9)

(10)
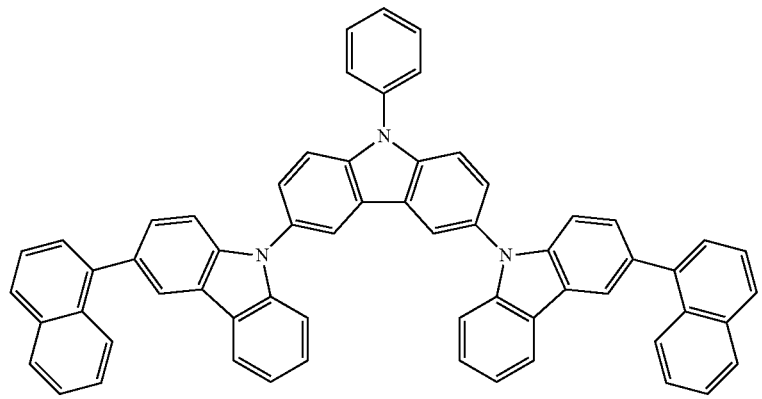
(11)
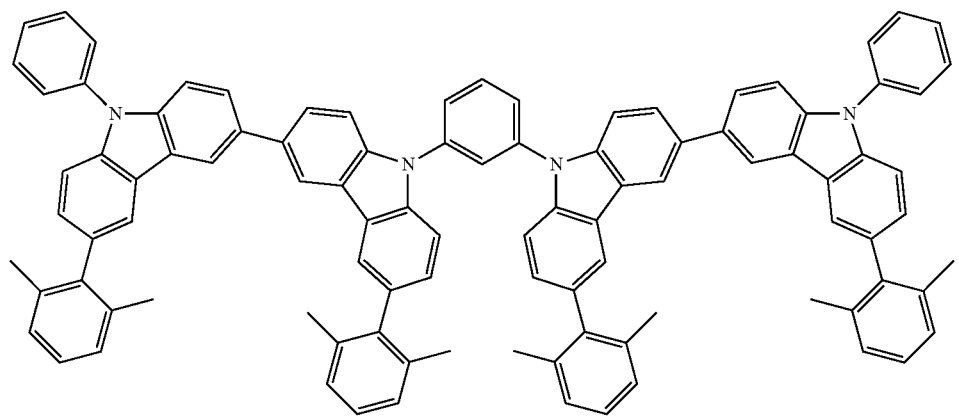
[Formula 49]
(12)
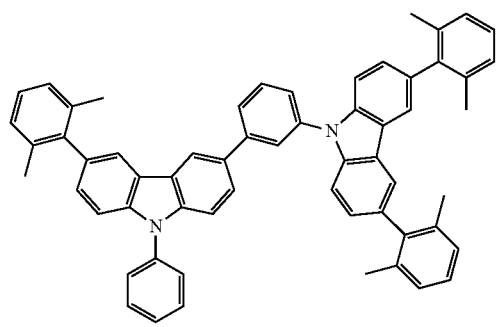
(13)
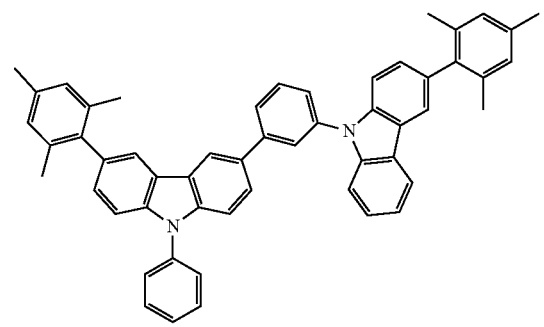
(14)
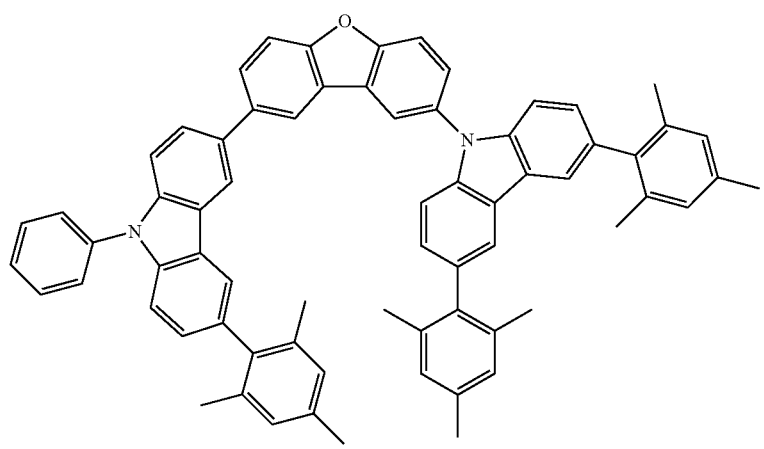

(15)
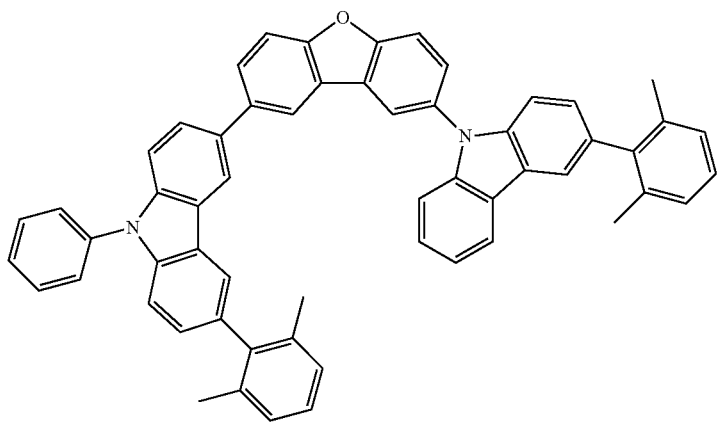
[Formula 50]
(16)
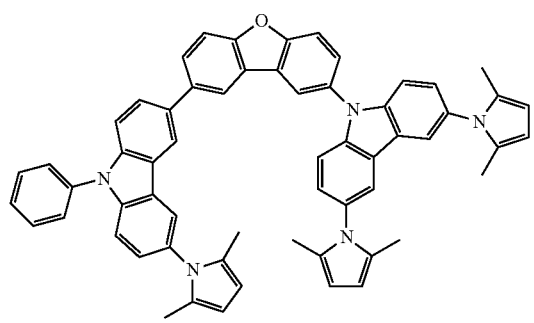
(17)
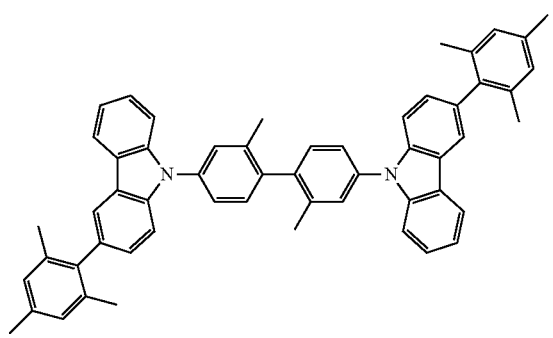
(18)
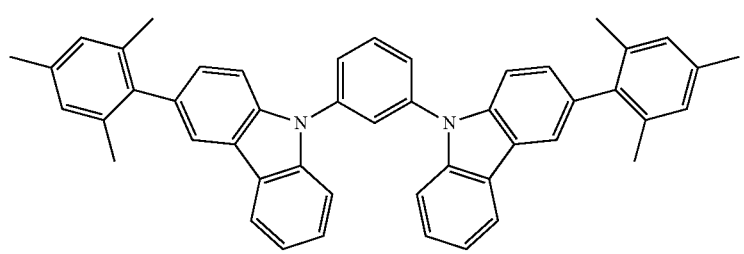
(19)
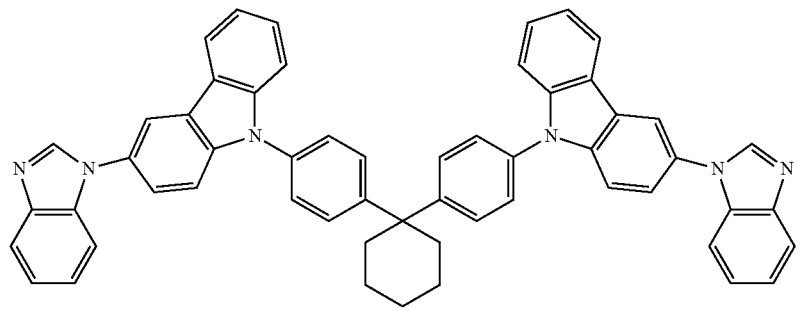

[Formula 51]

(20)

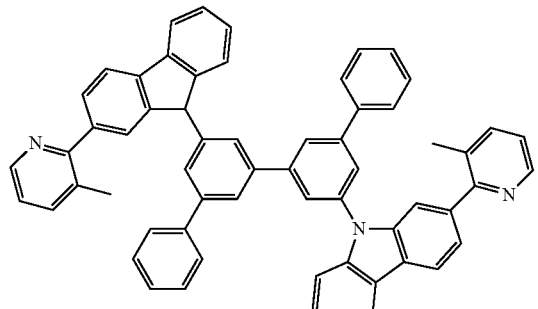

(21)

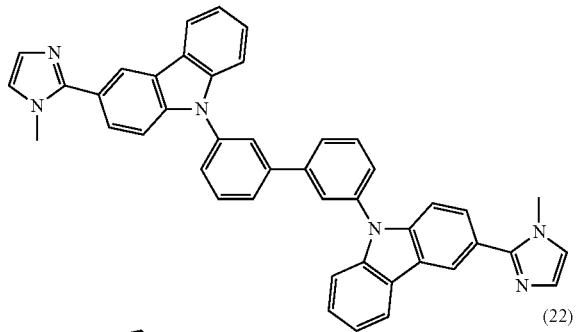

(22)

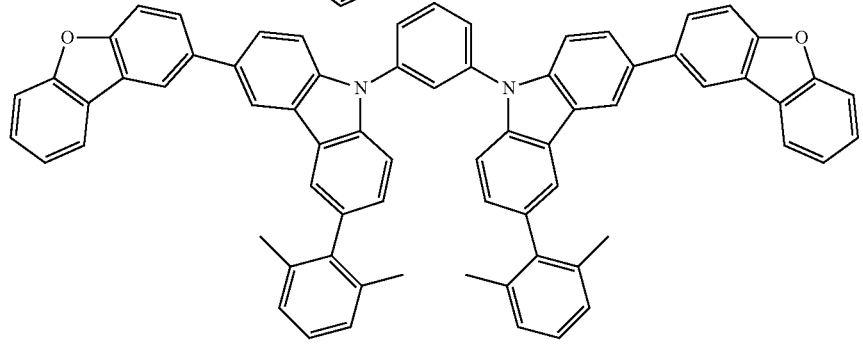

Additionally, compounds disclosed in WO2009/050281, WO2009/003898, WO2008/034758, WO2006/056418, WO2006/130598 and WO2009/085344 are also usable as the second host.

Phosphorescent Dopant

In the exemplary embodiment, the phosphorescent dopant contains a metal complex. The metal complex preferably has a metal atom selected from Ir (iridium), Pt (platinum), Os (osmium), Au (gold), Cu (copper), Re (rhenium) and Ru (ruthenium), and a ligand. Particularly, the ligand preferably has an ortho-metal bond.

The phosphorescent material is preferably a compound containing a metal atom selected from iridium (Ir), osmium (Os) and platinum (Pt) because such a compound, which exhibits high phosphorescence quantum yield, can further enhance external quantum efficiency of an organic EL device. The phosphorescent material is more preferably a metal complex such as an iridium complex, osmium complex or platinum complex, among which an iridium complex and platinum complex are more preferable and ortho metalation of an iridium complex is the most preferable.

Preferable examples of the metal complex are shown below.

[Formula 52]

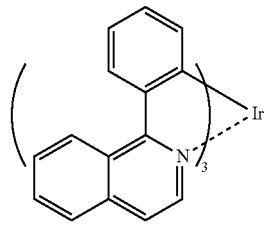

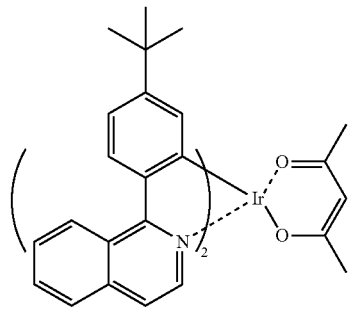

-continued

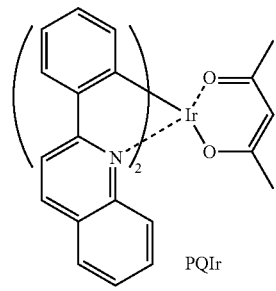

PQIr

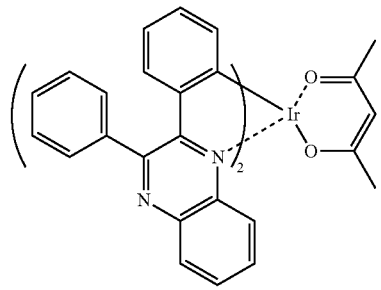

-continued
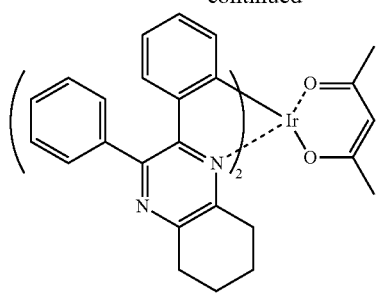
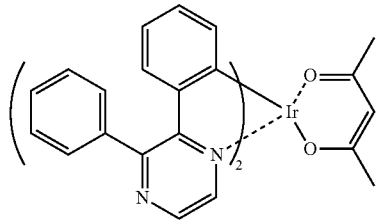
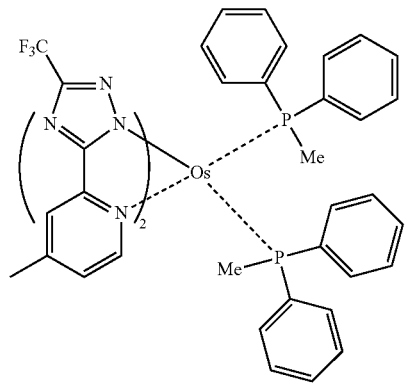
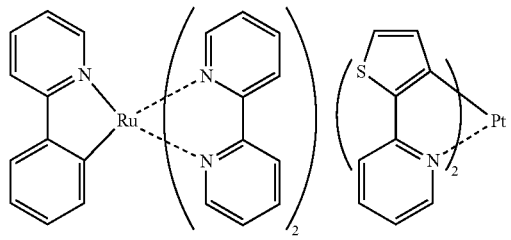
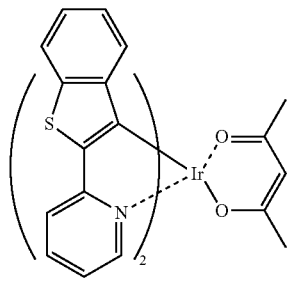
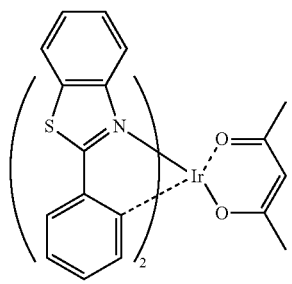
-continued
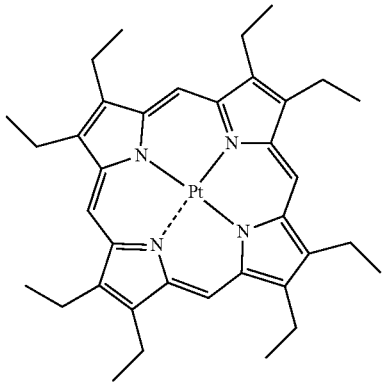
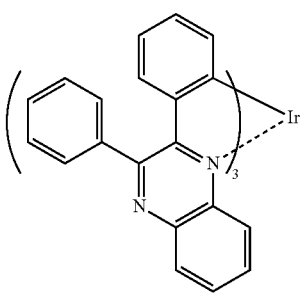
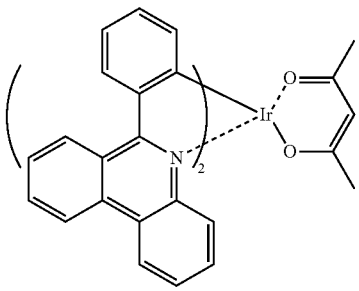
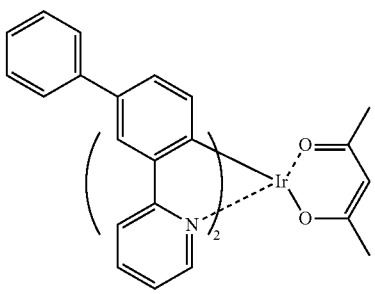
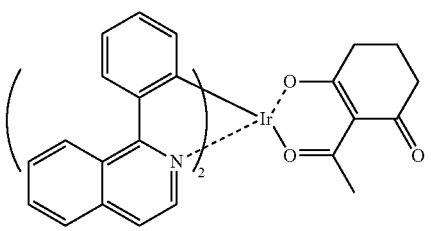

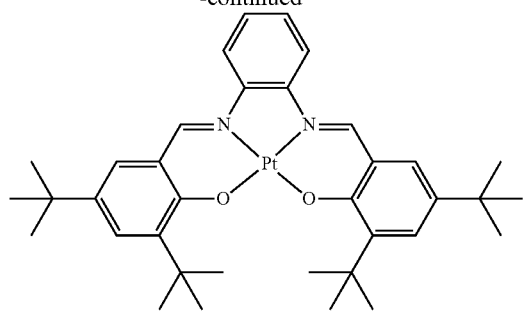
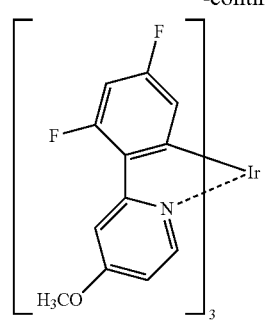
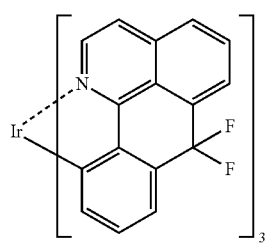
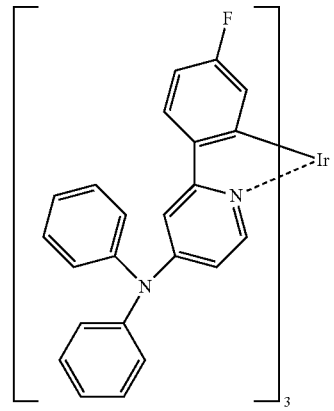
[Formula 53]
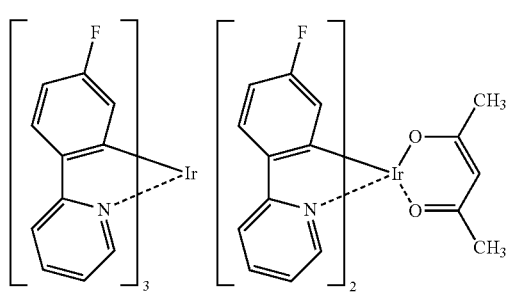
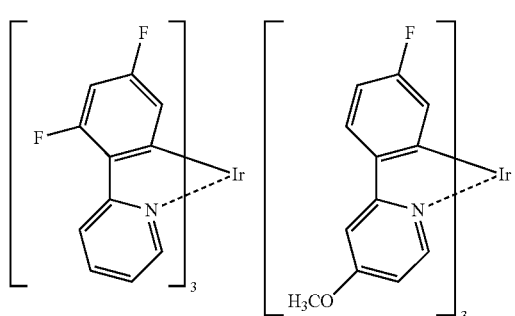
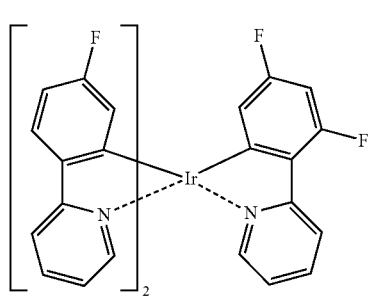
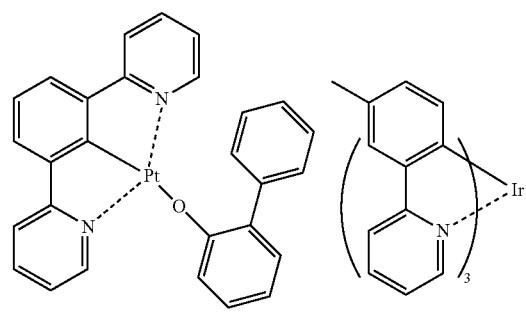

-continued
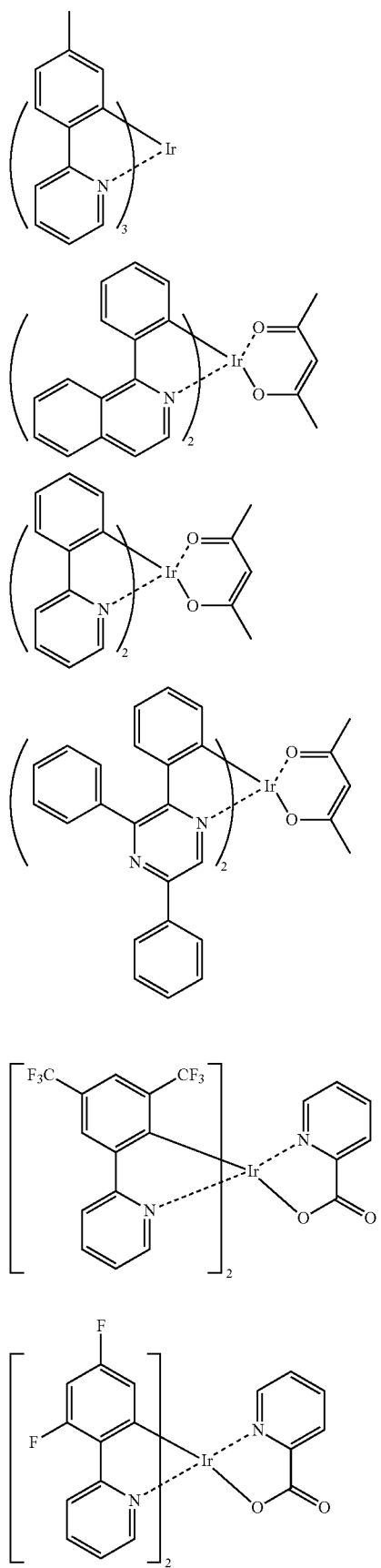
[Formula 54]
-continued
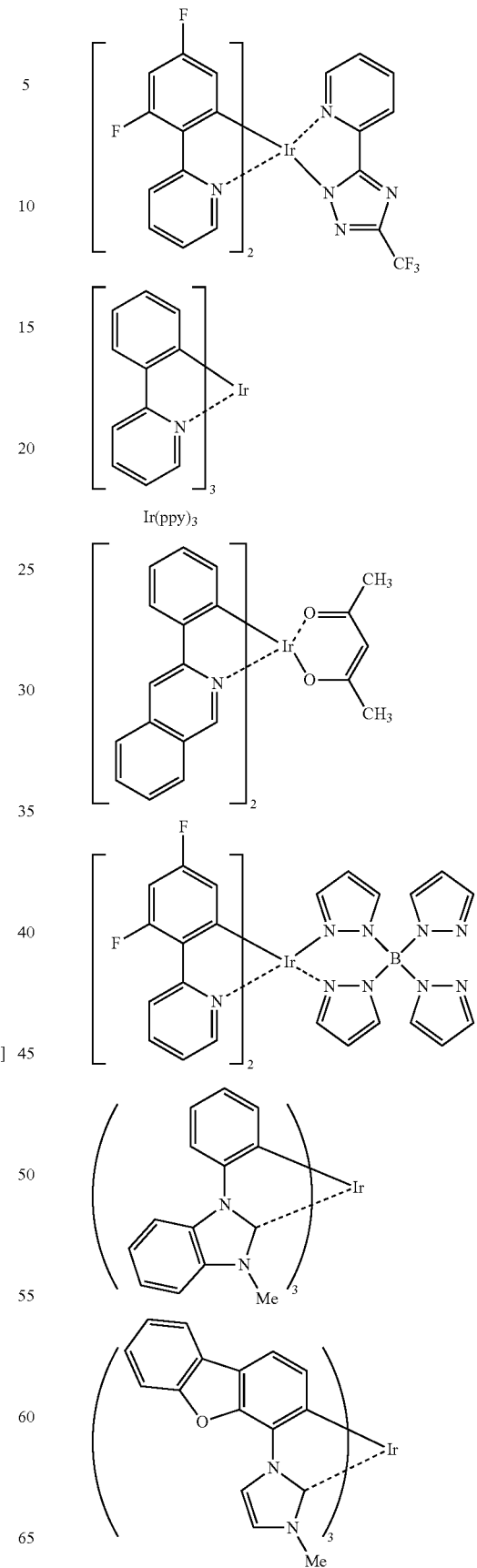
Ir(ppy)₃

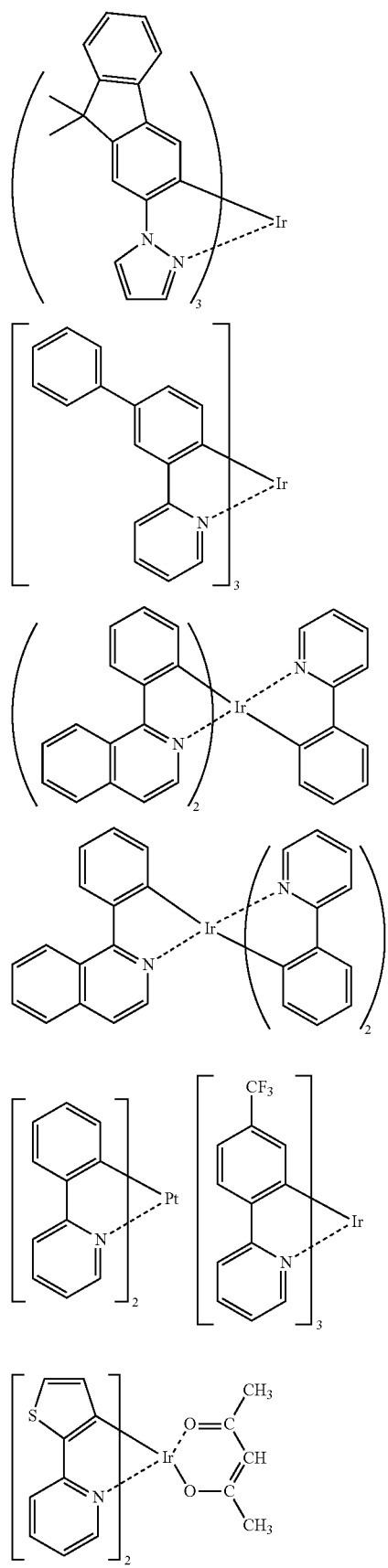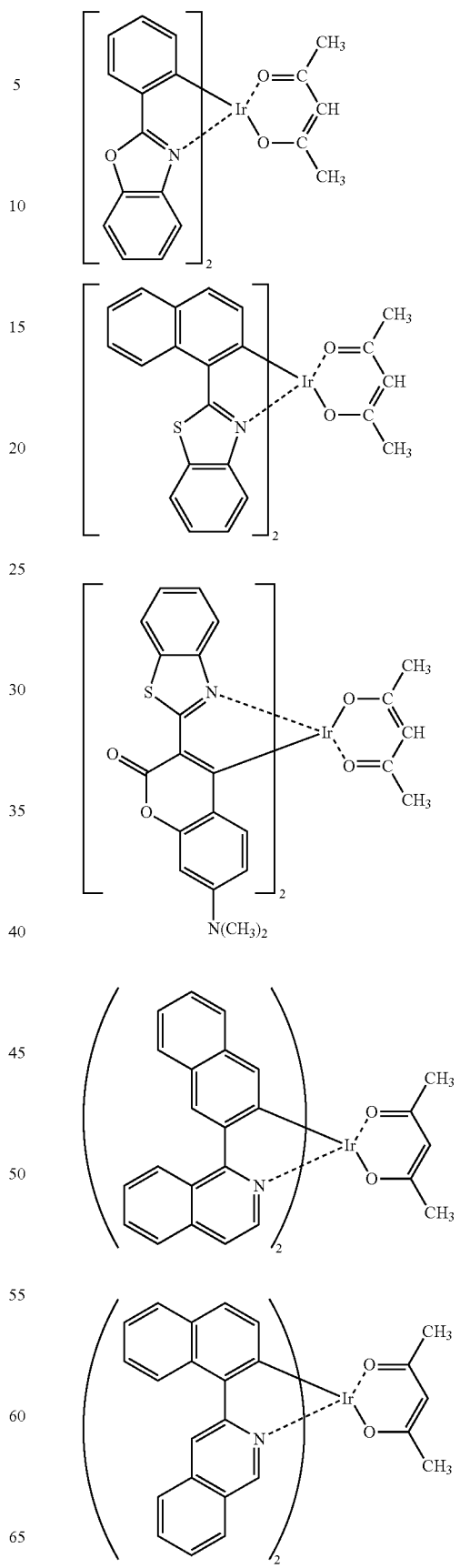

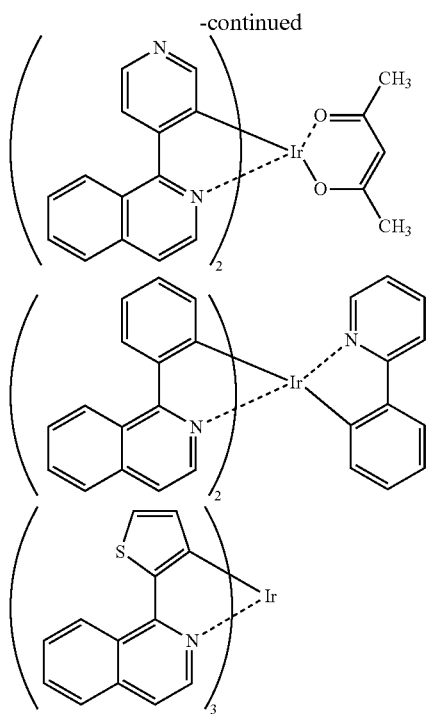

In the exemplary embodiment, at least one of the phosphorescent dopant contained in the emitting layer preferably emits light with a peak emission wavelength in a range of 420 nm to 720 nm.

By doping the phosphorescent dopant having such an emission wavelength to a specific host usable for the exemplary embodiment so as to form the emitting layer, the organic EL device can exhibit a high efficiency.

For enabling blue emission, a preferred peak emission wavelength is in a range of 420 nm to 480 nm.

Relationship 1 Between First Host and Second Host
—Triplet Energy, Ionization Potential and Affinity—

In the exemplary embodiment, the triplet energy of the first host and the triplet energy of the second host are 2.8 eV or more and the ionization potential of the first host is 5.5 eV or less.

In the exemplary embodiment, an affinity $Af_1$ of the first host is smaller than an affinity $Af_2$ of the second host.

Although the compounds usable as the first host and the second host are described above, a different compound may be usable as the first host and the second host in the exemplary embodiment as long as the above relationship in energy between the first host and the second host is satisfied.

Figure 2:
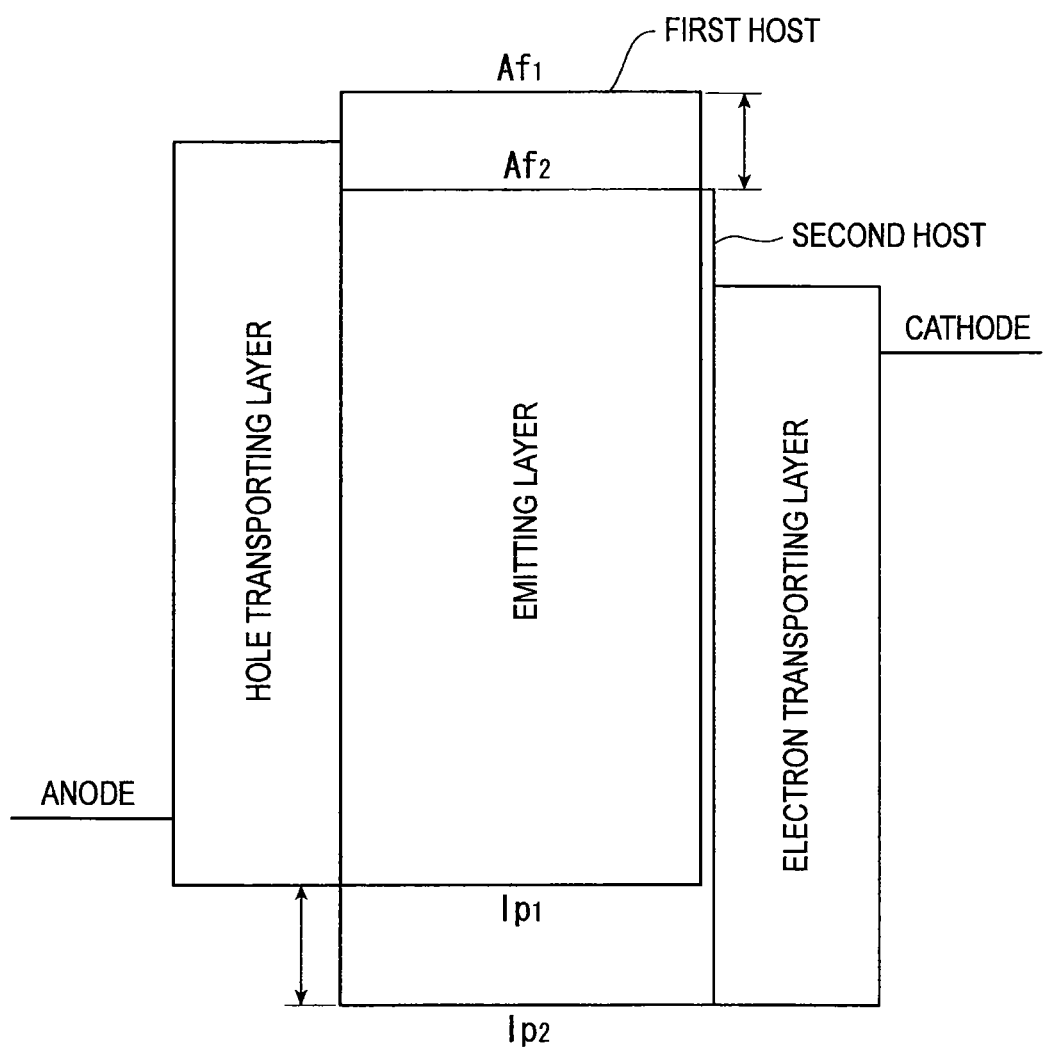
FIG. 2 shows an energy diagram of the organic electroluminescence device according to the exemplary embodiment.

FIG. 2 shows an energy diagram of the organic EL device 1.

Since the ionization potential ($Ip_1$) of the first host is 5.5 eV or less, a gap between the ionization potential ($Ip_1$) and the work function of the anode and a gap between the ionization potential ($Ip_1$) and the ionization potential of the hole transporting layer become small. Thus, holes are easily injected from the hole transporting layer into the emitting layer. Holes accumulated on and near an interface between the hole transporting layer and the emitting layer are reduced, so that a recombination region of holes and electrons in the emitting layer can be located away from the interface with the hole transporting layer and the vicinity of the interface toward the cathode.

Typically, in an organic EL device using a host having a large triplet energy for blue phosphorescent emission, since a larger band gap of the host results in a larger ionization potential of the host, it is difficult to inject holes into the emitting layer. A disadvantage of this arrangement is that the recombination region of holes and electrons is shifted toward the hole transporting layer 6 and thus electrons flow from the first host, which has small affinity and large band gap, into the hole transporting layer 6, which has a larger affinity than the host, so that the hole transporting layer 6 is likely to be deteriorated because the hole transporting layer 6 does not exhibit electron tolerance. In contrast, in the exemplary embodiment, although the first host has a large triplet energy such as 2.8 eV or more, holes are easily injected because the ionization potential ($Ip_1$) of the first host is 5.5 eV or less, and thus the recombination region of holes and electrons can be located not near the hole transporting layer 6 but in the emitting layer containing a host that exhibits a high carrier resistance. Thus, electrons flowing into the hole transporting layer 6 are reduced and the hole transporting layer 6 is unlikely to be deteriorated.

In the exemplary embodiment, since the triplet energy of the first host is set at 2.8 eV or more and the ionization potential ($Ip_1$) of the first host is set at 5.5 eV or less, the affinity $Af_1$ of the first host becomes small. Thus, when the host contained in the emitting layer is provided only by the first host, energy barrier (i.e., a difference in affinity) between the electron transporting layer and the emitting layer becomes large, which results in a rise in driving voltage because of an insufficient electron-injecting capability.

However, in the exemplary embodiment, the second host, the affinity $Af_2$ of which is larger than the affinity $Af_1$ of the first host, is also contained in the emitting layer along with the first host, so that energy barrier becomes small between the electron transporting layer and the second host and thus the electron-injecting capability is enhanced.

The affinity $Af_1$ of the first host and the affinity $Af_2$ of the second host preferably satisfy the following relationship.

$$Af_2 - Af_1 \geq 0.4 \text{ [eV]}$$

As long as the above relationship is satisfied, while the capability of injecting electrons into the emitting layer can be enhanced, electron injection toward the hole transporting layer 6 and the anode 3 can be prevented. As a result, the lifetime of the device can be prolonged.

As described above, since holes are easily injected into the emitting layer and electrons are easily injected into the emitting layer, the electrons and the holes are efficiently recombined in the emitting layer exhibiting a high carrier resistance, thereby improving luminous efficiency.

Since the recombination region is located away from the hole transporting layer and the electron transporting layer, less electrons move to the hole transporting layer exhibiting a low electron tolerance, and less holes move to the electron transporting layer exhibiting a low hole tolerance. Thus, the hole transporting layer and the electron transporting layer are less deteriorative. As a result, the lifetime of the organic EL device can be prolonged.

Ionization Potential (Ip)

To measure the ionization potential (Ip), a material was irradiated with a light (excitation light) from a deuterium ramp dispersed through a monochromator. The resulting ejection of photoelectrons was measured by an electrometer. With reference to the obtained curve of radiated photon energy resulting from the ejection of photoelectrons, a threshold of the ejection of photoelectrons was calculated by extrapolation. As a measuring machine, the atmospheric ultraviolet photoelectron analyzer AC-3 (manufactured by Riken Keiki Co., Ltd.) was used.

Singlet Energy (Eg)

The singlet energy (Eg) was obtained by irradiating a toluene-diluted solution of each material with light and converting a maximum wavelength of the resulting absorption spectrum. As a measuring machine, a spectrophotometer (manufactured by Hitachi, Ltd., product name: U-3400) was used.

Triplet Energy (EgT)

The triplet energy (EgT) was obtained in the following method. An organic material was measured by a known phosphorescence measurement method (e.g., a method described on and near page 50 of "Hikarikagaku no Sekai" (edited by The Chemical Society of Japan, 1993)). Specifically, the organic material was dissolved in a solvent (sample: 10 µmol/L, EPA (diethylether:isopentane:ethanol=5:5:2 in volume ratio, each solvent is in a spectroscopic grade)) to provide a sample for phosphorescence measurement. The sample set in a quartz cell was cooled down to 77 K and irradiated with an excitation light. The resulting phosphorescence was measured relative to a wavelength. A tangent line was drawn to be tangent to a rising section of the phosphorescence spectrum on the short-wavelength side, and the obtained wavelength value was converted into an energy value, which was defined as EgT. For the measurement, the body of the F-4500 fluorescence spectrophotometer (manufactured by Hitachi, Ltd.) and optional accessories for low-temperature measurement were used. In place of the above measuring device, a cooling device, a low-temperature container, an excitation light source and a light-receiving device may be used in combination for the measurement.

In the exemplary embodiment, the following expression was used for conversion of the wavelength.

conversion expression: EgT(eV)=1239.85/λedge

When the phosphorescence spectrum is expressed in coordinates, the ordinate axis of which indicates the phosphorescence intensity and the abscissa axis of which indicates the wavelength, and a tangent is drawn to a rising section of the phosphorescence spectrum on the short-wavelength side, "λedge" is a wavelength value at the intersection of the tangent and the abscissa axis. unit: nm In the exemplary embodiment, the triplet energy is referred to as a difference between energy in the lowest triplet state and energy in the ground state. The singlet energy (often referred to as energy gap) is referred to as a difference between energy in the lowest singlet state and energy in the ground state.

Affinity (Af)

Using the measurement values Ip and Eg, the affinity (Af) was calculated by an expression Af=Ip−Eg.

Relationship 2 between First Host and Second Host
—Hole Mobility and Electron Mobility—

In the organic EL device according to the exemplary embodiment, the first host preferably has a higher hole mobility so that holes injected from the hole transporting layer are transferred, and the second host preferably has a higher electron mobility so that electrons injected from the electron transporting layer are transferred.

The hole mobility of the first host is preferably $10^{-4}$ cm$^2$/Vs or more at application of an electrical field of $10^4$ to $10^6$ V/cm.

The electron mobility of the second host is preferably $10^{-5}$ cm$^2$/Vs or more at application of an electrical field of $10^4$ to $10^6$ V/cm.

A ratio of the hole mobility of the first host to the electron mobility of the first host is preferably in a range of 1 to 100.

When the ratio is less than 1, the hole-transporting capability is lowered, which results in deterioration of the hole transporting layer. When the ratio is more than 100, the electron tolerance is lowered, which results in deterioration of the first host.

A ratio of the electron mobility of the second host to the hole mobility of the second host is preferably in a range of 10 to 100.

A ratio of the hole mobility of the first host to the hole mobility of the second host is preferably in a range of 1 to 1000.

In the exemplary embodiment, a difference between the singlet energy and the triplet energy of the first host is preferably smaller than a difference between the singlet energy and the triplet energy of the second host.

A method of measuring hole mobility and electron mobility is not specifically limited. Specifically, for instance, a time-of-flight method (i.e., a method according to which the mobility is calculated from a measured transit time of charge in an organic film) and a method according to which the mobility is calculated from the voltage characteristics of a space limited current are usable. According to the time-of-flight method, an arrangement of electrode/organic layer (an organic material layer forming an electron transporting layer or a hole transporting layer)/electrode is irradiated by a light having a wavelength in an absorption wavelength range of the organic layer to measure the time characteristics of the resulting transient current (transient characteristic time). The hole mobility or the electron mobility is calculated by the following expressions.

mobility=(organic film thickness)$^2$/(transient characteristic time*applied voltage)

field intensity=(voltage applied to device)/(organic layer thickness)

Additionally, methods described in Electronic Process in Organic Crystals (M. Pope, C. E. Swenberg), Organic Molecular Solids (W. Jones), and the like are also usable.

Light-Transmissive Substrate

The anode 3, the emitting layer 5, the cathode 4 and the like are layered on the light-transmissive substrate 2 to provide the organic EL device 1. The substrate 2, which supports the anode 3 and the like, is preferably a smoothly-shaped substrate that transmits 50% or more of light in a visible region of 400 nm to 700 nm.

The light-transmissive substrate is exemplarily a glass plate, a polymer plate or the like.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used.

Anode and Cathode

The anode 3 of the organic EL device 1 is used for injecting holes into the hole injecting layer, the hole transporting layer 6 or the emitting layer 5. It is effective that the anode 3 has a work function of 4.5 eV or more.

Exemplary materials for the anode are alloys of indium-tin oxide (ITO), tin oxide (NESA), indium zinc oxide, gold, silver, platinum and copper.

The anode 3 can be manufactured by forming a thin film from these anode materials on, for instance, the substrate 2 through methods such as vapor deposition and sputtering.

When light from the emitting layer 5 is to be emitted through the anode 3 as in the exemplary embodiment, the anode 3 preferably transmits more than 10% of the light in the visible region. Sheet resistance of the anode 3 is preferably several hundreds Ω/sq. or lower. Although depending on the material of the anode, thickness of the anode is typically in a range of 10 nm to 1 μm, and preferably in a range of 10 nm to 200 nm.

Although the material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, alloy of magnesium and silver, and the like.

Like the anode 3, the cathode 4 may be made by forming a thin film from the above materials on, for instance, the electron transporting layer 7 through a method such as vapor deposition or sputtering. In addition, light from the emitting layer 5 may be emitted through the cathode 4. When light from the emitting layer 5 is to be emitted through the cathode 4, the cathode 4 preferably transmits more than 10% of the light in the visible region.

Sheet resistance of the cathode is preferably several hundreds Ω/sq. or lower.

Although depending on the material of the cathode, the film thickness of the cathode is typically in a range from 10 nm to 1 μm, preferably in a range from 50 to 200 nm.

Other Layers

The organic EL device according to the exemplary embodiment may further include a hole injecting layer, a hole transporting layer, an electron injecting layer and the like as needed in order to increase a current (or luminous) efficiency. The organic EL device 1 exemplarily includes the hole transporting layer 6 and the electron transporting layer 7.

A material for forming these layers is not specifically limited, and any organic material known as a typical organic electroluminescent material is usable. Specifically, an amine derivative, stilbene derivative, silazane derivative, polysilane, aniline copolymer and the like are usable.

In the exemplary embodiment, in order to enhance the capability of injecting holes into the emitting layer, the ionization potential $Ip_H$ of an adjacent layer being adjacent to the emitting layer on the anode side thereof (the hole injecting layer, the hole transporting layer or the like) and the ionization potential $Ip_1$ of the first host preferably satisfy a relationship of the following expression.

0 eV≤$Ip_H$−$Ip_1$≤0.3 eV

Additionally, in the exemplary embodiment, in order to enhance the capability of injecting electrons into the emitting layer, the affinity $Af_E$ of an adjacent layer being adjacent to the emitting layer on the cathode side thereof (the electron injecting layer, the electron transporting layer or the like) and the affinity $Af_2$ of the second host preferably satisfy a relationship of the following expression.

0 eV≤$Af_E$−$Af_2$≤0.4 eV

Hole Injecting Layer and Hole Transporting Layer

The hole injecting layer or the hole transporting layer (including the hole injecting/transporting layer) may preferably contain an aromatic amine compound such as an aromatic amine derivative represented by the following formula (I).

[Formula 56]

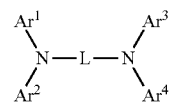

(I)

In the formula (1), $Ar^1$ to $Ar^4$ each represent one of the following:

an aromatic or fused aromatic hydrocarbon group having 6 to 50 ring carbon atoms (which may have a substituent);

an aromatic or fused aromatic heterocyclic group having 2 to 40 ring carbon atoms (which may have a substituent); and a group provided by bonding the aromatic or fused aromatic hydrocarbon group and the aromatic or fused aromatic heterocyclic group.

Aromatic amine represented by the following formula (II) can also be preferably used for forming the hole injecting layer or the hole transporting layer.

[Formula 57]

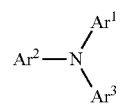

(II)

In the above formula (II), $Ar^1$ to $Ar^3$ each represent the same as $Ar^1$ to $Ar^4$ of the above formula (1).

Electron Injecting Layer and Electron Transporting Layer

The electron injecting layer or the electron transporting layer, which aids injection of the electrons into the emitting layer, has a large electron mobility. The electron injecting layer is provided for adjusting energy level, by which, for instance, sudden changes in the energy level can be reduced.

The organic EL device according to the exemplary embodiment preferably includes the electron injecting layer between the emitting layer and the cathode, and the electron injecting layer preferably contains a nitrogen-containing cyclic derivative as the main component. The electron injecting layer may serve as the electron transporting layer.

It should be noted that "as the main component" means that the nitrogen-containing cyclic derivative is contained in the electron injecting layer at a content of 50 mass % or more.

A preferable example of an electron transporting material for forming the electron injecting layer is an aromatic heterocyclic compound having at least one heteroatom in the molecule. Particularly, a nitrogen-containing cyclic derivative is preferable. The nitrogen-containing cyclic derivative is preferably an aromatic ring having a nitrogen-containing six-membered or five-membered ring skeleton, or a fused aromatic compound having a nitrogen-containing six-membered or five-membered ring skeleton.

The nitrogen-containing cyclic derivative is preferably exemplified by a nitrogen-containing cyclic metal chelate complex represented by the following formula (A).

[Formula 58]

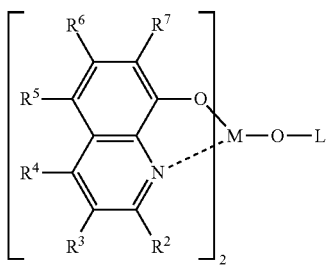
(A)

$R^2$ to $R^7$ in the formula (A) independently represent one of the following:
- a hydrogen atom;
- a halogen atom;
- an oxy group;
- an amino group;
- a hydrocarbon group having 1 to 40 carbon atoms;
- an alkoxy group;
- an aryloxy group;
- an alkoxycarbonyl group; and
- an aromatic heterocyclic group.

$R^2$ to $R^7$ may be substituted or unsubstituted.

Examples of the halogen atom include fluorine, chlorine, bromine and iodine. In addition, examples of the substituted or unsubstituted amino group include an alkylamino group, an arylamino group and an aralkylamino group.

The alkoxycarbonyl group is represented by —COOY'. Examples of Y' are the same as the examples of the above alkyl group. The alkylamino group and the aralkylamino group are represented by —NQ$^1$Q$^2$. Examples of each of Q$^1$ and Q$^2$ are the same as the examples described in relation to the above alkyl group and the above aralkyl group, and preferable examples for each of Q$^1$ and Q$^2$ are also the same as those described in relation to the above alkyl group and the above aralkyl group. Either one of Q$^1$ and Q$^2$ may be a hydrogen atom. It should be noted that the aralkyl group is a group in which a hydrogen atom in the alkyl group is substituted with the aryl group.

The arylamino group is represented by —NAr$^1$Ar$^2$. Examples for each of Ar$^1$ and Ar$^2$ are the same as the examples described in relation to the non-fused aromatic hydrocarbon group and the fused aromatic hydrocarbon group. Either one of Ar$^1$ and Ar$^2$ may be a hydrogen atom.

M represents aluminum (Al), gallium (Ga) or indium (In), among which In is preferable.

L in the formula (A) represents a group represented by a formula (A') or (A") below.

[Formula 59]

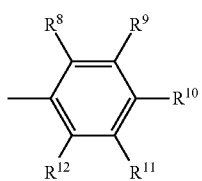
(A')

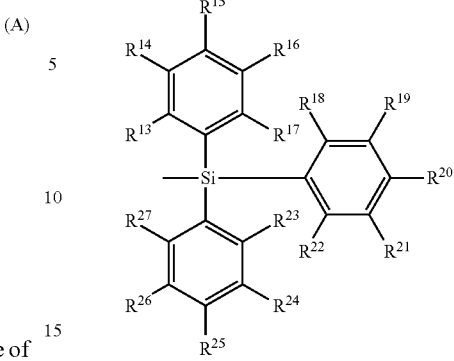
(A")

$R^8$ to $R^{12}$ in the formula (A') independently represent a hydrogen atom or a hydrocarbon group having 1 to 40 carbon atoms (which may have a substituent, and an adjacent set of groups may form a cyclic structure.

$R^{13}$ to $R^{27}$ in the formula (A") independently represent a hydrogen atom or a hydrocarbon group having 1 to 40 carbon atoms (which may have a substituent), and an adjacent set of groups may form a cyclic structure.

Examples of the hydrocarbon group having 1 to 40 carbon atoms represented by each of $R^8$ to $R^{12}$ and $R^{13}$ to $R^{27}$ in the formulae (A') and (A") are the same as those of $R^2$ to $R^7$ in the formula (A).

Examples of a divalent group selected when an adjacent set of $R^8$ to $R^{12}$ and $R^{13}$ to $R^{27}$ forms a cyclic structure are a tetramethylene group, a pentamethylene group, a hexamethylene group, a diphenylmethane-2,2'-diyl group, a diphenylethane-3,3'-diyl group and a diphenylpropane-4,4'-diyl group.

The electron transporting layer preferably contains at least one of nitrogen-containing heterocyclic derivatives respectively represented by the following formulae (201) to (203).

[Formula 60]

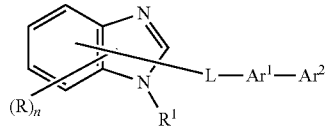
(201)

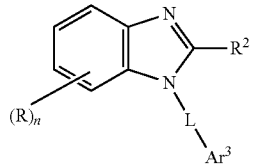
(202)

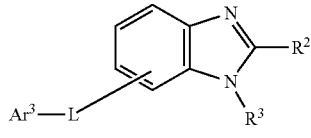
(203)

R in the formulae (201) to (203) represents one of the following:
- a hydrogen atom;
- an aromatic hydrocarbon group or fused aromatic hydrocarbon group having 6 to 60 ring carbon atoms (which may have a substituent);

a pyridyl group (which may have a substituent);
a quinolyl group (which may have a substituent);
an alkyl group having 1 to 20 carbon atoms (which may have a substituent); and
an alkoxy group having 1 to 20 carbon atoms (which may have a substituent). n is an integer 0 to 4.

$R^1$ in the formulae (201) to (203) represents one of the following:
an aromatic hydrocarbon group or fused aromatic hydrocarbon group having 6 to 60 ring carbon atoms (which may have a substituent);
a pyridyl group (which may have a substituent);
a quinolyl group (which may have a substituent);
an alkyl group having 1 to 20 carbon atoms (which may have a substituent); and
an alkoxy group having 1 to 20 carbon atoms (which may have a substituent).

$R^2$ and $R^3$ in the formulae (201) to (203) independently represent one of the following:
a hydrogen atom;
an aromatic hydrocarbon group or fused aromatic hydrocarbon group having 6 to 60 ring carbon atoms (which may have a substituent);
a pyridyl group (which may have a substituent);
a quinolyl group (which may have a substituent);
an alkyl group having 1 to 20 carbon atoms (which may have a substituent); and
an alkoxy group having 1 to 20 carbon atoms (which may have a substituent).

L in the formulae (201) to (203) represents one of the following:
an aromatic hydrocarbon group or fused aromatic hydrocarbon group having 6 to 60 ring carbon atoms (which may have a substituent);
a pyridinylene group (which may have a substituent);
a quinolinylene group (which may have a substituent); and
a fluorenylene group (which may have a substituent).

$Ar^1$ in the formulae (201) to (203) represents one of the following:
an aromatic hydrocarbon group or fused aromatic hydrocarbon group having 6 to 60 ring carbon atoms (which may have a substituent); and
a pyridinylene group or quinolinylene group (which may have a substituent).

$Ar^2$ in the formulae (201) to (203) represents one of the following: an aromatic hydrocarbon group or fused aromatic hydrocarbon group having 6 to 60 ring carbon atoms (which may have a substituent);
a pyridyl group (which may have a substituent);
a quinolyl group (which may have a substituent);
an alkyl group having 1 to 20 carbon atoms (which may have a substituent); and
an alkoxy group having 1 to 20 carbon atoms (which may have a substituent).

$Ar^3$ in the formulae (201) to (203) represents one of the following:
an aromatic hydrocarbon group or fused aromatic hydrocarbon group having 6 to 60 ring carbon atoms (which may have a substituent);
a pyridyl group (which may have a substituent);
a quinolyl group (which may have a substituent);
an alkyl group having 1 to 20 carbon atoms (which may have a substituent);
an alkoxy group having 1 to 20 carbon atoms (which may have a substituent); and
a group represented by —$Ar^1$-$Ar^2$ (each of $Ar^1$ and $Ar^2$ is the same as described above).

As an electron transporting compound for the electron injecting layer or the electron transporting layer, 8-hydroxyquinoline or a metal complex of its derivative, an oxadiazole derivative and a nitrogen-containing heterocyclic derivative are preferable. A specific example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are as follows.

[Formula 61]

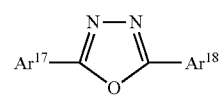

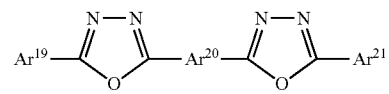

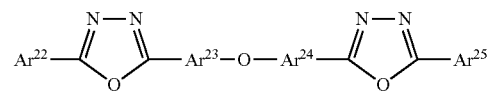

In the formula:
each of $Ar^{17}$, $Ar^{18}$, $Ar^{19}$, $Ar^{21}$, $Ar^{22}$, and $Ar^{25}$ represents a substituted or unsubstituted aromatic or fused aromatic hydrocarbon group having 6 to 40 ring carbon atoms; and $Ar^{17}$ and $Ar^{18}$ may be mutually the same or different, $Ar^{19}$ and $Ar^{21}$ may be mutually the same or different, and $Ar^{22}$ and $Ar^{25}$ may be mutually the same or different.

Examples of the aromatic or fused aromatic hydrocarbon group having 6 to 40 ring carbon atoms are a phenyl group, naphthyl group, biphenyl group, anthranyl group, perylenyl group and pyrenyl group. Examples of the substituent therefor are an alkyl group having 1 to 10 carbon atoms, alkoxy group having 1 to 10 carbon atoms and cyano group.

$Ar^{20}$, $Ar^{23}$ and $Ar^{24}$ each represent a substituted or unsubstituted divalent aromatic hydrocarbon group or fused aromatic hydrocarbon group having 6 to 40 ring carbon atoms. $Ar^{23}$ and $Ar^{24}$ may be mutually the same or different.

Examples of the divalent aromatic hydrocarbon group or fused aromatic hydrocarbon group are a phenylene group, naphthylene group, biphenylene group, anthranylene group, perylenylene group and pyrenylene group. Examples of the substituent therefor are an alkyl group having 1 to 10 carbon atoms, alkoxy group having 1 to 10 carbon atoms and cyano group.

Such an electron transporting compound is preferably an electron transporting compound that can be favorably formed into a thin film(s). Examples of the electron transporting compound are as follows.

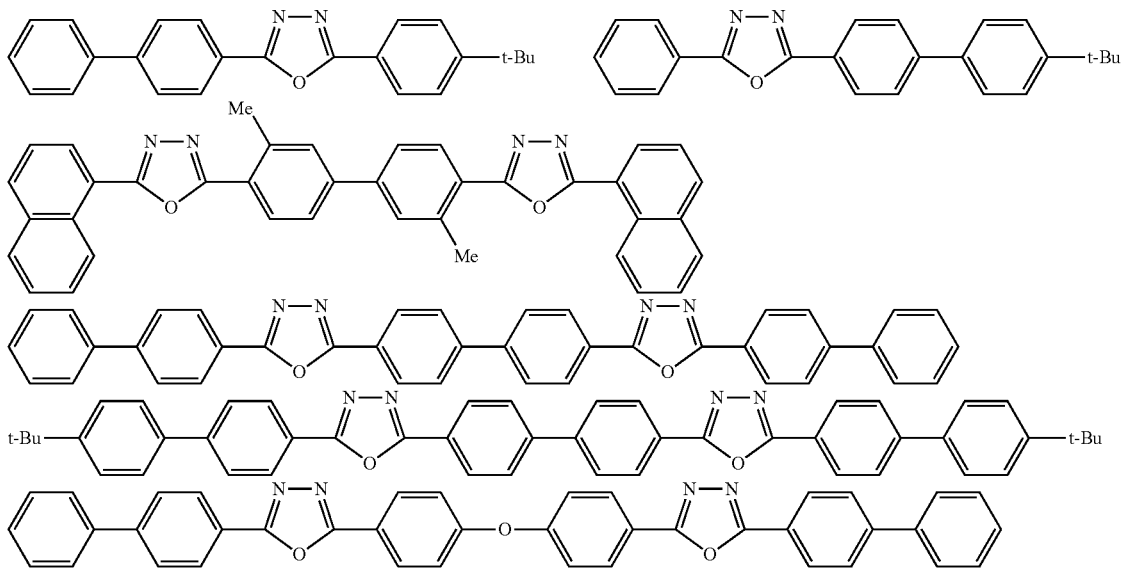

[Formula 62]

An example of the nitrogen-containing heterocyclic derivative as the electron transporting compound is a nitrogen-containing compound that is not a metal complex, the derivative being formed of an organic compound represented by one of the following general formulae. Examples of the nitrogen-containing heterocyclic derivative are a five-membered ring or six-membered ring derivative having a skeleton represented by the following formula (B1) and a derivative having a structure represented by the following formula (B2).

[Formula 63]

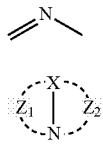

(B1)

(B2)

In the formula (B2), X represents a carbon atom or a nitrogen atom. $Z_1$ and $Z_2$ each independently represent a group of atoms capable of forming a nitrogen-containing heterocycle.

More preferably, the nitrogen-containing heterocyclic derivative is a nitrogen-containing aromatic polycyclic organic compound having a five-membered ring or six-membered ring. Further, when the nitrogen-containing heterocyclic derivative is such a nitrogen-containing aromatic polycyclic group having plural nitrogen atoms, the nitrogen-containing heterocyclic derivative is preferably a nitrogen-containing aromatic polycyclic organic compound having a skeleton formed by a combination of the skeletons respectively represented by the formulae (B1) and (B2), or by a combination of the skeletons respectively represented by the formulae (B1) and (C).

[Formula 64]

(C)

A nitrogen-containing group of the nitrogen-containing aromatic polycyclic organic compound is selected from nitrogen-containing heterocyclic groups respectively represented by the following general formulae.

[Formula 65]

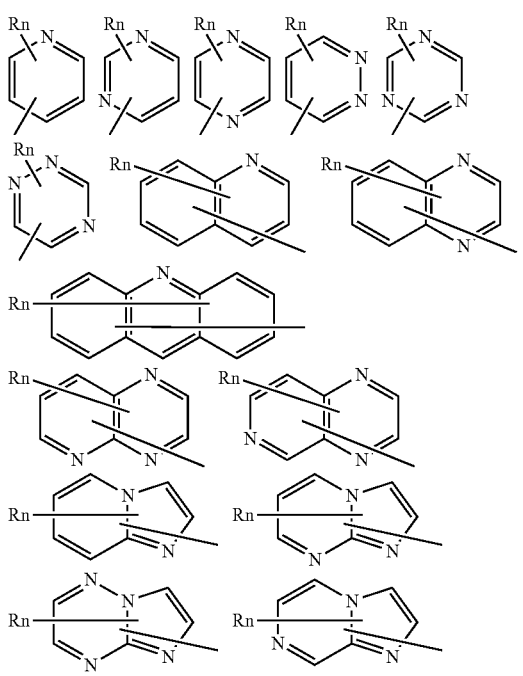

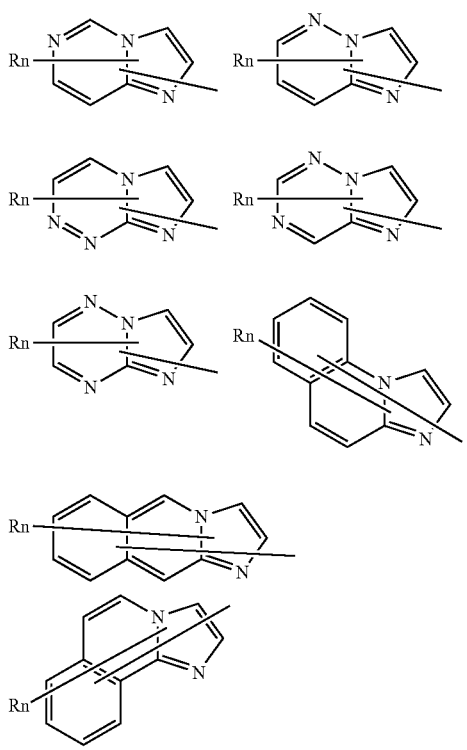

R in the formulae represents one of the following:

an aromatic or fused aromatic hydrocarbon group having 6 to 40 ring carbon atoms;

an aromatic or fused aromatic heterocyclic group having 2 to 40 ring carbon atoms;

an alkyl group having 1 to 20 carbon atoms; and an alkoxy group having 1 to 20 carbon atoms.

n is an integer of 0 to 5. When n is 2 or more, a plurality of R may be mutually the same or different.

A preferable specific compound is a nitrogen-containing heterocyclic derivative represented by the following formula (D).

HAr-L$^1$-Ar$^1$—Ar$^2$  (D)

In the formula (D), HAr represents a nitrogen-containing heterocyclic group having 1 to 40 ring carbon atoms (which may have a substituent).

In the formula (D), L$^1$ represents one of the following:

a single bond;

an aromatic or fused aromatic hydrocarbon group having 6 to 40 ring carbon atoms (which may have a substituent); and an aromatic or fused aromatic heterocyclic group having 2 to 40 ring carbon atoms (which may have a substituent).

In the formula (D), Ar$^1$ represents a divalent aromatic hydrocarbon group having 6 to 40 ring carbon atoms (which may have a substituent).

In the formula (D), Ar$^2$ represents one of the following:

an aromatic or fused aromatic hydrocarbon group having 6 to 40 ring carbon atoms (which may have a substituent); and an aromatic or fused aromatic heterocyclic group having 2 to 40 ring carbon atoms (which may have a substituent).

HAr is exemplarily selected from the following group.

[Formula 66]

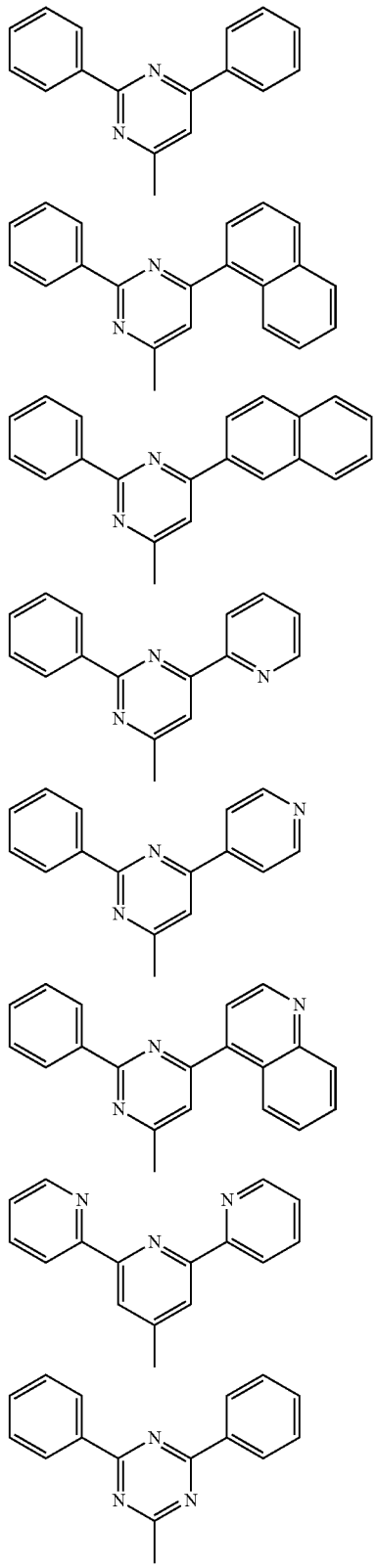

L¹ is exemplarily selected from the following group.

[Formula 67]

Ar¹ is exemplarily selected from the following arylanthranil groups.

[Formula 68]

In the formula, R¹ to R¹⁴ independently represent one of the following:

a hydrogen atom;

a halogen atom;

an alkyl group having 1 to 20 carbon atoms;

an alkoxy group having 1 to 20 carbon atoms;

an aryloxy group having 6 to 40 ring carbon atoms;

an aromatic or fused aromatic hydrocarbon group having 6 to 40 ring carbon atoms (which may have a substituent); and an aromatic or fused aromatic heterocyclic group having 2 to 40 ring carbon atoms (which may have a substituent).

Ar³ represents one of the following:

an aromatic or fused aromatic hydrocarbon group having 6 to 40 ring carbon atoms (which may have a substituent); and an aromatic or fused aromatic heterocyclic group having 2 to 40 ring carbon atoms (which may have a substituent).

All of R¹ to R⁸ of the nitrogen-containing heterocyclic derivative may be hydrogen atoms.

Ar² is exemplarily selected from the following group.

[Formula 69]

Other than the above, the following compound (see JP-A-9-3448) can be favorably used for the nitrogen-containing aromatic polycyclic organic compound as the electron transporting compound.

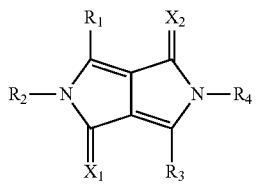

[Formula 70]

In the formula, $R^1$ to $R^4$ independently represent one of the following:
a hydrogen atom;
an aliphatic group (which may have a substituent);
an aliphatic cyclic group (which may have a substituent);
a carbocyclic aromatic cyclic group (which may have a substituent); and
a heterocyclic group (which may have a substituent).

$X_1$ and $X_2$ independently represent an oxygen atom, a sulfur atom or a dicyanomethylene group.

Additionally, the following compound (see JP-A-2000-173774) can also be favorably used for the electron transporting compound.

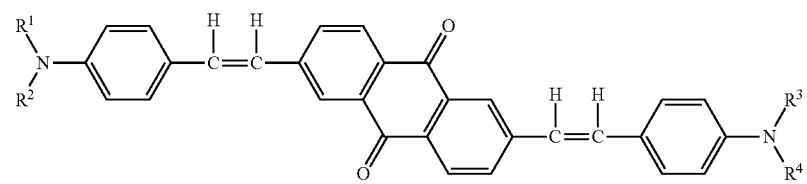

[Formula 71]

In the formula, $R^1$, $R^2$, $R^3$ and $R^4$, which may be mutually the same or different, each represent an aromatic hydrocarbon group or fused aromatic hydrocarbon group represented by the following formula.

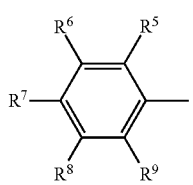

[Formula 72]

In the formula, $R^5$, $R^6$, $R^7$, $R^8$ and $R^9$, which may be mutually the same or different, each represent a hydrogen atom, saturated or unsaturated alkoxy group, alkyl group, amino group or alkylamino group. At least one of $R^5$, $R^6$, $R^7$, $R^8$ and $R^9$ represents a saturated or unsaturated alkoxy group, alkyl group, amino group or alkylamino group.

The electron transporting compound may be a polymer compound containing the nitrogen-containing heterocyclic group or nitrogen-containing heterocyclic derivative.

Although a thickness of the electron injecting layer or the electron transporting layer is not specifically limited, the thickness is preferably 1 to 100 nm.

The electron injecting layer preferably contains an inorganic compound such as an insulator or a semiconductor in addition to the nitrogen-containing cyclic derivative. Such an insulator or a semiconductor, when contained in the electron injecting layer, can effectively prevent a current leak, thereby enhancing the electron-injecting capability of the electron injecting layer.

As the insulator, it is preferable to use at least one metal compound selected from the group consisting of an alkali metal chalcogenide, an alkaline earth metal chalcogenide, a halogenide of alkali metal and a halogenide of alkaline earth metal.

By forming the electron injecting layer from the alkali metal chalcogenide or the like, the electron-injecting capability can preferably be further enhanced. Specifically, preferable examples of the alkali metal chalcogenide are $Li_2O$, $K_2O$, $Na_2S$, $Na_2Se$ and $Na_2O$. Preferable examples of the alkaline earth metal chalcogenide are CaO, BaO, SrO, BeO, BaS and CaSe. Preferable examples of the halogenide of the alkali metal are LiF, NaF, KF, LiCl, KCl and NaCl. Preferable examples of the halogenide of the alkaline earth metal are fluorides such as $CaF_2$, $BaF_2$, $SrF_2$, $MgF_2$ and $BeF_2$, and halogenides other than the fluoride.

Examples of the semiconductor are one of or a combination of two or more of an oxide, a nitride or an oxidized nitride containing at least one element selected from Ba, Ca, Sr, Yb, Al, Ga, In, Li, Na, Cd, Mg, Si, Ta, Sb and Zn. An inorganic compound for forming the electron injecting layer is preferably a microcrystalline or amorphous semiconductor film. When the electron injecting layer is formed of such semiconductor film, more uniform thin film can be formed, thereby reducing pixel defects such as a dark spot. Examples of such an inorganic compound are the alkali metal chalcogenide, alkaline earth metal chalcogenide, halogenide of the alkali metal and halogenide of the alkaline earth metal.

When the electron injecting layer contains such an insulator or semiconductor, the thickness thereof is preferably in a range of approximately 0.1 nm to 15 nm. The electron injecting layer in the exemplary embodiment may preferably contain the reduction-causing dopant.

Reduction-Causing Dopant

In the organic EL device according to the exemplary embodiment, a reduction-causing dopant may be preferably contained in an interfacial region between the cathode and the organic thin-film layer.

With this arrangement, the organic EL device can emit light with enhanced luminance intensity and have a longer lifetime.

The reduction-causing dopant may be at least one compound selected from an alkali metal, an alkali metal complex, an alkali metal compound, an alkaline earth metal, an alkaline earth metal complex, an alkaline earth metal compound, a rare-earth metal, a rare-earth metal complex, a rare-earth metal compound and the like.

Examples of the alkali metal are Na (work function: 2.36 eV), K (work function: 2.28 eV), Rb (work function: 2.16 eV) and Cs (work function: 1.95 eV), among which a substance having a work function of 2.9 eV or less is particularly preferable. Among the above, the alkali metal is preferably K, Rb or Cs, more preferably Rb or Cs, the most preferably Cs.

Examples of the alkaline earth metal are Ca (work function: 2.9 eV), Sr (work function: 2.0 to 2.5 eV), Ba (work function: 2.52 eV) and the like, among which a substance having a work function of 2.9 eV or less is particularly preferable.

Examples of the rare-earth metal are Sc, Y, Ce, Tb, Yb and the like, among which a substance having a work function of 2.9 eV or less is particularly preferable.

Since the above preferred metals have particularly high reducibility, addition of a relatively small amount of the metals to an electron injecting zone can enhance luminance intensity and lifetime of the organic EL device.

Examples of the alkali metal compound are an alkali oxide such as $Li_2O$, $Cs_2O$ or $K_2O$ and an alkali halogenide such as LiF, NaF, CsF or KF, among which LiF, $Li_2O$ and NaF are preferable.

Examples of the alkaline earth metal compound are BaO, SrO, CaO, and a mixture thereof such as $Ba_xSr_{1-x}O$ (0<x<1) or $Ba_xCa_{1-x}O$ (0<x<1), among which BaO, SrO and CaO are preferable.

Examples of the rare-earth metal compound are $YbF_3$, $ScF_3$, $ScO_3$, $Y_2O_3$, $Ce_2O_3$, $GdF_3$ and $TbF_3$, among which $YbF_3$, $ScF_3$ and $TbF_3$ are preferable.

The alkali metal complex, alkaline earth metal complex and rare earth metal complex are not specifically limited as long as they contain at least one metal ion of an alkali metal ion, an alkaline earth metal ion and a rare earth metal ion. Ligand for each of the complexes is preferably quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, β-diketones, azomethines, or a derivative thereof, but the ligand is not limited thereto.

The reduction-causing dopant is added to preferably form a layer or an island pattern in the interfacial region. The layer of the reduction-causing dopant or the island pattern of the reduction-causing dopant is preferably formed by depositing the reduction-causing dopant by resistance heating deposition while an emitting material for forming the interfacial region or an organic substance as an electron injecting material are simultaneously deposited, so that the reduction-causing dopant is dispersed in the organic substance. Dispersion concentration at which the reduction-causing dopant is dispersed in the organic substance is a mole ratio (organic substance to reduction-causing dopant) of 100:1 to 1:100, preferably 5:1 to 1:5.

When the reduction-causing dopant forms the layer, the emitting material or the electron injecting material for forming the organic layer of the interfacial region is initially layered, and the reduction-causing dopant is subsequently deposited singularly thereon by resistance heating deposition to form a preferably 0.1 to 15 nm-thick layer.

When the reduction-causing dopant forms the island pattern, the emitting material or the electron injecting material for forming the organic layer of the interfacial region is initially formed in an island shape, and the reduction-causing dopant is subsequently deposited singularly thereon by resistance heating deposition to form a preferably 0.05 to 1 nm-thick island shape.

A ratio of the main component to the reduction-causing dopant in the organic EL device of the exemplary embodiment is preferably a mole ratio (main component to reduction-causing dopant) of 5:1 to 1:5, more preferably 2:1 to 1:2.

Film Thickness

In the organic EL device of the exemplary embodiment, the thickness of each layer between the anode and the cathode is not specifically limited except for the thicknesses particularly specified above. However, the thickness of each layer is typically preferably in a range from several nanometers to 1 μm because an excessively thinned film is likely to entail defects such as a pin hole while an excessively thickened film requires application of high voltage and deteriorates efficiency.

Manufacturing Method of Organic EL Device

A manufacturing method of the organic EL device according to the exemplary embodiment is not particularly limited, and any manufacturing method used for forming a typical organic EL device is usable. Specifically, the respective layers can be formed by vacuum deposition, a casting method, a coating method, a spin coating method or the like. Moreover, in addition to the casting method, the coating method and the spin coating using a solution, in which the organic material of each layer is dispersed, on a transparent polymer such as polycarbonate, polyurethane, polystyrene, polyarylate and polyester, the respective layers can be formed by simultaneous deposition of the organic material and the transparent polymer, or the like.

It should be noted that the invention is not limited to the above description, but may include any modification as long as such modification stays within a scope and a spirit of the invention.

Although the organic EL device including the hole transporting layer provided between the anode and the emitting layer is exemplarily described in the exemplary embodiment, the invention is not limited to such an arrangement. In other words, as long as the organic EL device includes an adjacent layer that is provided between the anode and the emitting layer to be adjacent to the emitting layer, the adjacent layer is not limited to the hole transporting layer. According to the invention, such an adjacent layer can be prevented from deterioration resulting from injection of electrons into the adjacent layer, thereby prolonging the lifetime of the organic EL device. An adjacent layer such as the electron injecting layer may be provided between the emitting layer and the cathode.

EXAMPLES

Examples of the invention will be described below. However, the invention is not limited by these Examples.

Example 1

The organic EL device according to Example 1 was manufactured as follows.

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. After the glass substrate having the transparent electrode line was cleaned, the glass substrate was mounted on a substrate holder of a vacuum deposition apparatus. A compound HI was initially formed onto a surface of the glass substrate where the transparent electrode line was provided so as to cover the transparent electrode. Thus, a 10-nm thick hole transporting layer was formed.

A compound PBH-01 (the first host), a compound PBH-04 (the second host) and a compound BD1 (the phosphorescent dopant) were co-deposited on the hole transporting layer. The compound PBH-01, the compound PBH-04 and the compound BD1 were contained in an emitting layer at a ratio of 45 mass %, 45 mass % and 10 mass %, respectively. Thus, a 40-nm thick emitting layer of blue emission was formed.

Next, the compound PBH-04 was layered on the emitting layer to form a 5-nm thick exciton blocking layer. The exciton blocking layer is adapted to prevent diffusion of the triplet energy from the emitting layer.

A compound ET was layered on the exciton blocking layer to form a 30-nm thick electron transporting layer.

Lithium fluoride (LiF) was vapor-deposited at a rate of 1 Å/min to form a 1-nm thick electron-injecting cathode. Metallic aluminum (Al) was vapor-deposited on the electron-injecting cathode to form an 80-nm thick cathode.

Examples 2 to 4 and Comparatives 1 to 3

The organic EL devices according respectively to Examples 2 to 4 and Comparatives 1 to 3 were formed in the same manner as in Example 1 except that the materials, a thickness of each of the layers and a concentration of each of the emitting materials were changed as shown in Table 1. In Comparative 3, a compound corresponding to the first host and the phosphorescent dopant were contained in the emitting layer, but a compound corresponding to the second host was not contained.

The numerals in parentheses in Table 1 indicate a thickness of each layer (unit: nm). The percentages in parentheses in Table 1 indicate a ratio between the first host, the second host and the phosphorescent material in each emitting layer (mass percentage). In Comparative 3, the percentages indicate a ratio between the host and the phosphorescent dopant (mass percentage).

TABLE 1

| | Arrangement of Organic EL Device |
|---|---|
| Example 1 | ITO/HT(50)/PBH-01:PBH-4:BD1 (40, 45%:45%:10%)/PBH-4(5)/ET(30)/LiF(1)/Al(80) |
| Example 2 | ITO/HT(50)/PBH-01:PBH-5:BD1 (40, 45%:45%:10%)/PBH-5(5)/ET(30)/LiF(1)/Al(80) |
| Example 3 | ITO/HT(50)/PBH-02:PBH-4:BD1 (40, 45%:45%:10%)/PBH-4(5)/ET(30)/LiF(1)/Al(80) |
| Example 4 | ITO/HT(50)/PBH-03:PBH-4:BD1 (40, 45%:45%:10%)/PBH-4(5)/ET(30)/LiF(1)/Al(80) |
| Comparative 1 | ITO/HT(50)/CBP:TPBI:BD1 (40, 45%:45%:10%)/ET(30)/LiF(1)/Al(80) |
| Comparative 2 | ITO/HT(50)/mCp:TPBI:BD1 (40, 45%:45%:10%)/ET(30)/LiF(1)/Al(80) |
| Comparative 3 | ITO/HT(50)/PBH-01:BD1 (10, 90%:10%)/ET(30)/LiF(1)/Al(80) |

Formulae of the first host, the second host, the phosphorescent dopant, the material of the hole transporting layer, and the material of the electron transporting layer used in Examples 1 to 4 and Comparatives 1 to 3 are shown below.

First Host

[Formula 73]

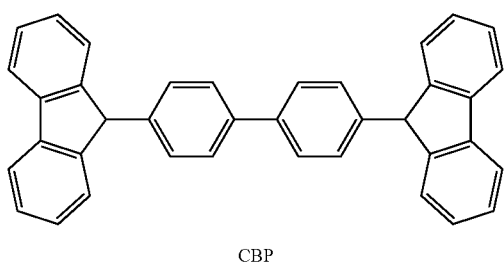

CBP

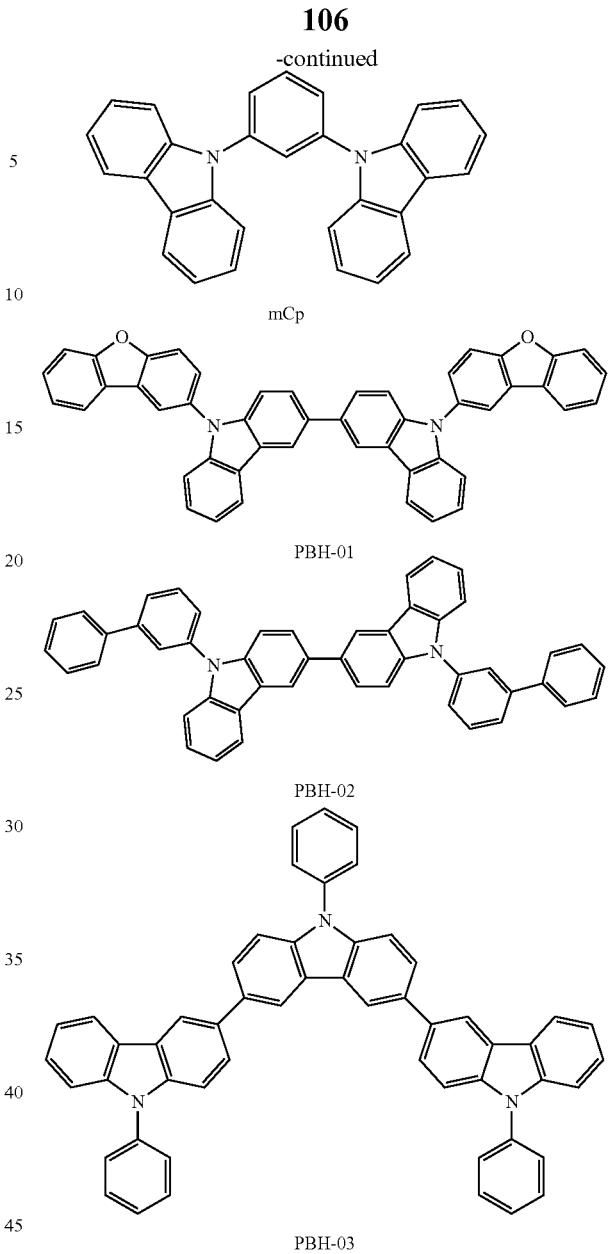

mCp

PBH-01

PBH-02

PBH-03

Second Host

[Formula 74]

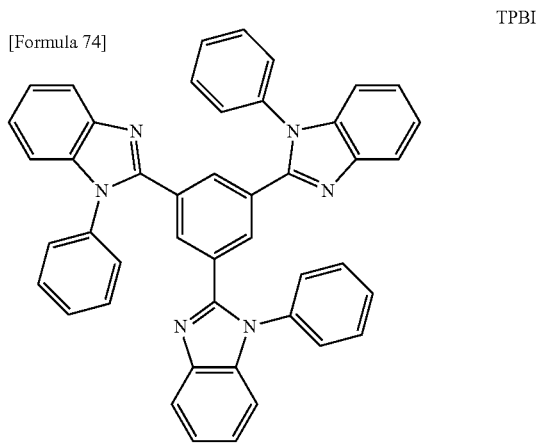

TPBI

Material of Electron Transporting Layer

PBH-04

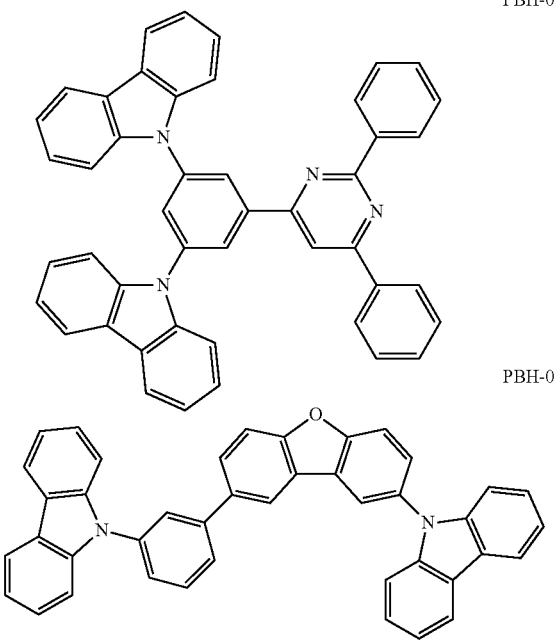

PBH-05

[Formula 77]

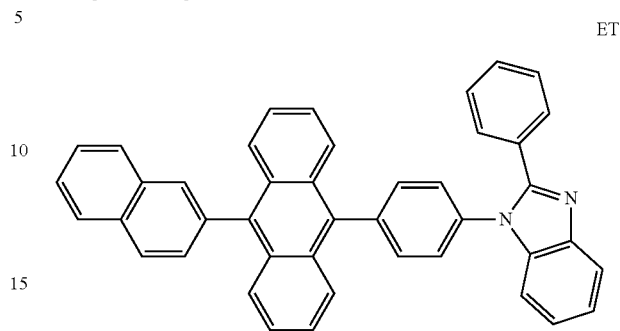

ET

The ionization potential, affinity and triplet energy of each of the first host, the second host, the material of the hole transporting layer, and the material of the electron transporting layer used in Examples 1 to 4 and Comparatives 1 to 3 were measured. The results are shown in Tables 2 to 4. A measurement method is the same as described hereinabove.

TABLE 2

| | First Host | | |
|---|---|---|---|
| Compound | Ionization Potential Ip [eV] | Affinity Af [eV] | Triplet Energy Eg (T) [eV] |
| CBP | 6.0 | 2.4 | 2.70 |
| mCP | 5.8 | 2.3 | 3.00 |
| PBH-01 | 5.5 | 2.2 | 2.90 |
| PBH-02 | 5.5 | 2.2 | 2.90 |
| PBH-03 | 5.5 | 2.2 | 2.80 |

Phosphorescent Dopant

BD1

[Formula 75]

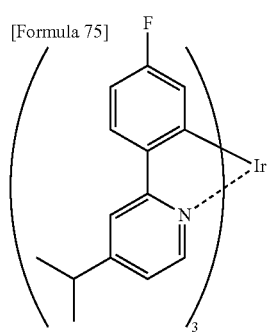

TABLE 3

| | Second Host | | |
|---|---|---|---|
| Compound | Ionization Potential Ip [eV] | Affinity Af [eV] | Triplet Energy Eg(T) [eV] |
| TPBI | 6.1 | 2.6 | 2.60 |
| PBH-04 | 6.0 | 2.6 | 3.00 |
| PBH-05 | 6.0 | 2.5 | 3.00 |

Material of Hole Transporting Layer

HT

[Formula 76]

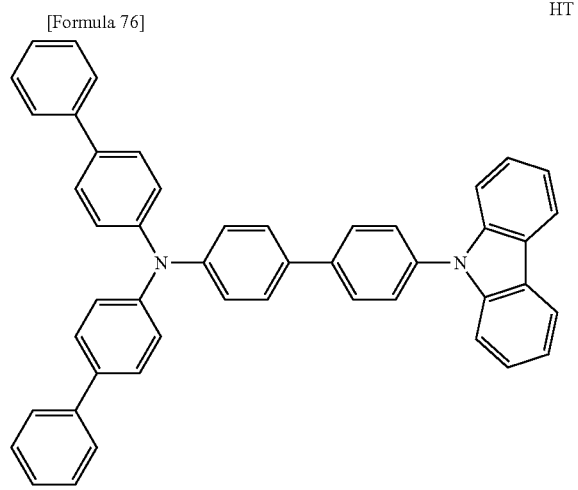

TABLE 4

| Material of Hole Transporting Layer or Electron Transporting Layer | | | |
|---|---|---|---|
| Compound | Ionization Potential Ip [eV] | Affinity Af [eV] | Triplet Energy Eg(T) [eV] |
| HT | 5.5 | 2.4 | 2.60 |
| ET | 6.0 | 3.1 | 1.80 |

Each of the organic EL devices according to Examples 1 to 4 and Comparatives 1 to 3 was driven at a current density of 10 mA/cm², and then voltage, luminous efficiency and durability (lifetime) were measured and evaluated. The results are shown in Table 5. A period of time elapsed until the initial luminescence intensity decreased to half was defined as the lifetime.

TABLE 5

|  | Voltage [V] | Efficiency [cd/A] | Lifetime [hrs] |
| --- | --- | --- | --- |
| Example 1 | 4.2 | 25.7 | 2000 |
| Example 2 | 5.5 | 26.3 | 2500 |
| Example 3 | 4.7 | 25.9 | 1800 |
| Example 4 | 5.0 | 24.2 | 1600 |
| Comparative 1 | 6.4 | 20.2 | 500 |
| Comparative 2 | 6.2 | 21.8 | 800 |
| Comparative 3 | 7.9 | 10.8 | 200 |

As shown in Table 5, in each of the organic EL devices according to Examples 1 to 4, the respective triplet energies of the first host and the second host were 2.8 eV or more, the ionization potential of the first host was 5.5 eV or less, and the affinity $Af_1$ of the first host was smaller than the affinity $Af_2$ of the second host. In view of the above, it has been found out that each of the organic EL devices according to Examples 1 to 4 exhibits an excellent luminous efficiency and has a longer lifetime while requiring a lower driving voltage.

In contrast, in each of the organic EL devices according to Comparatives 1 and 2, the ionization potential of the first host exceeded 5.5 eV, so that holes were not efficiently injected from the hole transporting layer into the emitting layer. In view of the above, as compared with the organic EL devices according to Examples 1 to 4, it has been found out that each of the organic EL devices according to Comparatives 1 and 2 exhibits a lower luminous efficiency and has a particularly shorter lifetime while requiring a higher driving voltage. Among the organic EL devices according to Comparatives, it has been found out that, particularly, the organic EL device according to Comparative 3 exhibits a lower luminous efficiency and has a shorter lifetime while requiring a higher driving voltage. Presumably, this is because although the organic EL device according to Comparative 3 had a host (corresponding to the first host) whose ionization potential was 5.5 eV to enable efficient injection of holes into the emitting layer, the organic EL device did not have the second host contained in the emitting layer, so that electrons were not efficiently injected from the electron transporting layer into the emitting layer. Additionally, it is also presumed that the holes injected into the emitting layer were not efficiently recombined with the electrons in the emitting layer because of a low electron-injecting capability to lower the luminous efficiency, so that the recombination region of the holes and the electrons was present at the interfacial region between the electron transporting layer and the emitting layer, and thus the compound of the electron transporting layer was deteriorated because of a low hole tolerance of the compound.

The invention claimed is:
1. An organic electroluminescence device, comprising:
an anode;
a cathode; and
an emitting layer provided between the anode and the cathode,
wherein:
the emitting layer comprises a first host, a second host and a phosphorescent dopant;
a triplet energy of each of the first host and the second host is 2.8 eV or more;
an ionization potential of the first host is 5.5 eV or less;
an affinity $Af_1$ of the first host is smaller than an affinity $Af_2$ of the second host; and
a difference between a singlet energy of the first host and the triplet energy of the first host is smaller than a difference between a singlet energy of the second host and the triplet energy of the second host.

2. The organic electroluminescence device according to claim 1, wherein the affinity $Af_1$ of the first host and the affinity $Af_2$ of the second host satisfy a relationship: $Af_2 - Af_1 \geq 0.4$ [eV].

3. The organic electroluminescence device according to claim 1, wherein an emission peak of the phosphorescent dopant is 480 nm or less.

4. The organic electroluminescence device according to claim 2, wherein an emission peak of the phosphorescent dopant is 480 nm or less.

5. The organic electroluminescence device according to claim 1, wherein the first host is a compound represented by a formula (1) below,

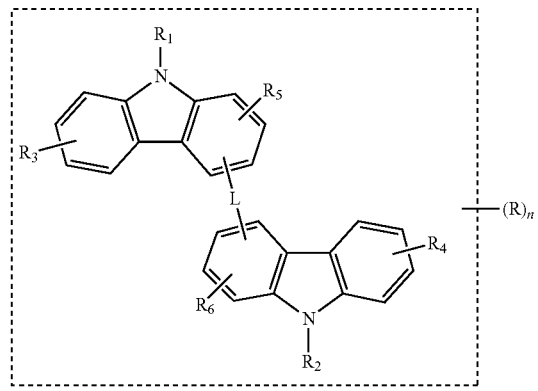

(1)

where, in the formula (1): R represents a substituent substitutable for a carbazole skeleton or L; n represents the number of R; n is an integer of 0 to 6; when n is 2 or larger, a plurality of R may be mutually different;
R represents a substituent selected from the group consisting of:
an alkyl group having 1 to 20 carbon atoms;
a cycloalkyl group having 3 to 20 carbon atoms;
an alkoxy group having 1 to 20 carbon atoms;
a cycloalkoxy group having 3 to 20 carbon atoms;
an aryl group having 6 to 18 carbon atoms;
an aryloxy group having 6 to 18 carbon atoms;
a heteroaryl group having 5 to 18 carbon atoms;
an amino group that is optionally substituted by a substituent that is the same as the alkyl group, the cycloalkyl group or the aryl group;
a silyl group that is optionally substituted by a substituent that is the same as the alkyl group, the cycloalkyl group or the aryl group;
a fluoro group; and
a cyano group,
any of the above substituents optionally being further substituted with the substituent;
each of $R_1$ to $R_6$ represents a substituent that has the same definition as that for the substituent for R in the formula (1);
L bonds two carbazole skeletons, L being a single bond or a divalent bonding group containing an element selected from the group consisting of carbon (C), nitrogen (N), oxygen (O), silicon (Si), phosphorus (P) and sulfur (S), the bonding group optionally being substituted by the substituent for R;
R may be a hydrogen atom;

R₁ and R₂ may be bonded at N-position (9-position) of the carbazole skeleton directly or via a bonding group; and the substituent may include an adjacent set of substituents substituted for the carbazole skeleton, the adjacent set of substituents optionally being mutually bonded to form a ring structure.

6. The organic electroluminescence device according to claim 1, further comprising:

a hole transporting layer provided between the anode and the emitting layer, wherein the hole transporting layer comprises a compound represented by a formula (I) below,

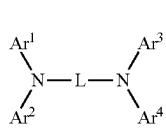
(I)

where Ar¹ to Ar⁴ each represent:
an aromatic or fused aromatic hydrocarbon group having 6 to 50 ring carbon atoms that may have a substituent;
an aromatic or fused aromatic heterocyclic group having 2 to 40 ring carbon atoms that may have a substituent; or
a group provided by bonding the aromatic or fused aromatic hydrocarbon group and the aromatic or fused aromatic heterocyclic group.

7. The organic electroluminescence device according to claim 1, further comprising:

a hole transporting layer provided between the anode and the emitting layer, wherein the hole transporting layer comprises a compound represented by a formula (II) below,

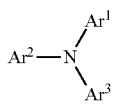
(II)

where Ar¹ to Ar⁴ each represent:
an aromatic or fused aromatic hydrocarbon group having 6 to 50 ring carbon atoms that may have a substituent;
an aromatic or fused aromatic heterocyclic group having 2 to 40 ring carbon atoms that may have a substituent; or
a group provided by bonding the aromatic or fused aromatic hydrocarbon group and the aromatic or fused aromatic heterocyclic group.

8. The organic electroluminescence device according to claim 1, further comprising:

an adjacent layer provided between the anode and the emitting layer, wherein the adjacent layer is adjacent to the emitting layer, and an ionization potential $Ip_H$ of the adjacent layer and an ionization potential $Ip_1$ of the first host satisfy a relationship of $0\ eV \leq Ip_H - Ip_1 \leq 0.3\ eV$.

9. The organic electroluminescence device according to claim 5, wherein the second host is a compound represented by a formula (3) below,

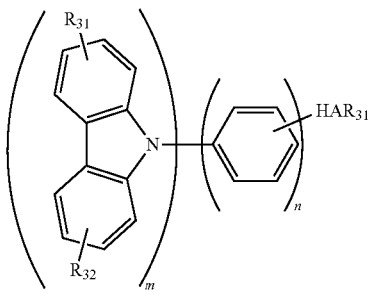
(3)

where: HAR₃₁ is a substituted or unsubstituted heteroaryl;
m is an integer of 0 to 5;
n is an integer of 0 to 3, and, when n is equal to 0, HAR₃₁ is bonded to a nitrogen atom in the carbazole skeleton; and
each of R₃₁ and R₃₂ is a substituted or unsubstituted alkyl group or aryl group, R₃₁ and R₃₂ optionally being bonded to provide a ring structure with a fused benzene ring.

10. The organic electroluminescence device according to claim 5, wherein the heteroaryl group is carbazole, dibenzofuran or dibenzothiophene.

11. An organic electroluminescence device comprising;
an anode;
a cathode; and
an emitting layer provided between the anode and the cathode, wherein the emitting layer comprises a first host, a second host and a phosphorescent dopant, the first host is a compound represented by a formula (1) below, and the second host is an azine compound,

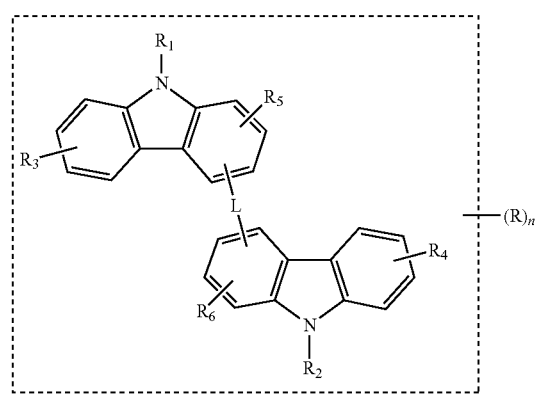
(1)

where, in the formula (1): R represents a substituent substitutable for a carbazole skeleton or L; n represents the number of R; n is an integer of 0 to 6; when n is 2 or larger, a plurality of R may be mutually different;

R represents a substituent selected from the group consisting of:
an alkyl group having 1 to 20 carbon atoms;
a cycloalkyl group having 3 to 20 carbon atoms;
an alkoxy group having 1 to 20 carbon atoms;
a cycloalkoxy group having 3 to 20 carbon atoms;
an aryl group having 6 to 18 carbon atoms;

an aryloxy group having 6 to 18 carbon atoms;

a heteroaryl group having 5 to 18 carbon atoms;

an amino group that is optionally substituted by a substituent that is the same as the alkyl group, the cycloalkyl group or the aryl group;

a silyl group that is optionally substituted by a substituent that is the same as the alkyl group, the cycloalkyl group or the aryl group;

a fluoro group; and a cyano group, any of the above substituents optionally being further substituted with the substituent;

each of $R_1$ to $R_6$ represents a substituent that has the same definition as that for the substituent for R in the formula (1);

L bonds two carbazole skeletons, L being a single bond or a divalent bonding group containing an element selected from the group consisting of carbon (C), nitrogen (N), oxygen (O), silicon (Si), phosphorus (P) and sulfur (S);

the bonding group optionally being substituted by the substituent for R in the formula (1);

R may be a hydrogen atom;

$R_1$ and $R_2$ may be bonded at N-position (9-position) of the carbazole skeleton directly or via a bonding group; and the substituent may include an adjacent set of substituents substituted for the carbazole skeleton, the adjacent set of substituents optionally being mutually bonded to form a ring structure.

12. The organic electroluminescence device according to claim 11, wherein the first host is a compound represented by a formula (2) below, (2)

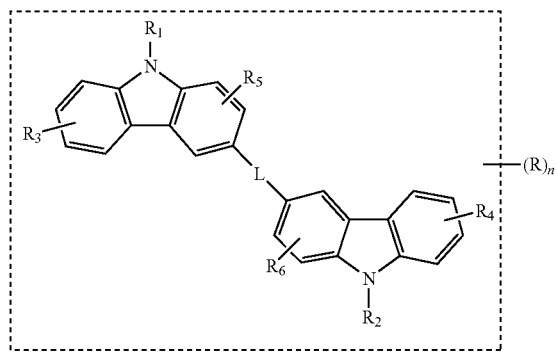

wherein R, n, L, and $R_1$ to $R_6$ have the same meanings as in formula (1).

13. The organic electroluminescence device according to claim 11, wherein the first host is a compound represented by a formula (1A) below, (1A)

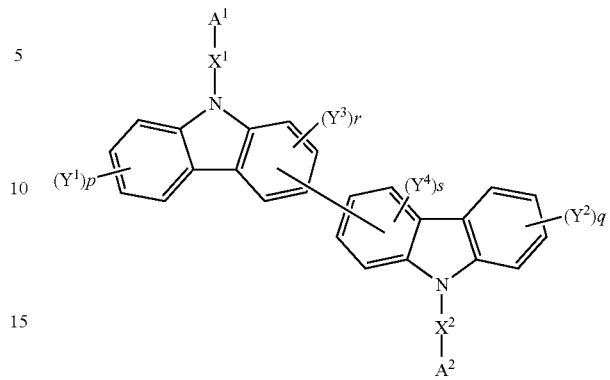

where: $A^1$ represents a substituted or unsubstituted nitrogen-containing heterocyclic group having 1 to 30 ring carbon atoms;

$A^2$ represents a substituted or unsubstituted aromatic hydrocarbon group having 6 to 30 ring carbon atoms or a substituted or unsubstituted nitrogen-containing heterocyclic group having 1 to 30 ring carbon atoms;

$X^1$ and $X^2$ are bonding groups and each independently represent:

a single bond;

a substituted or unsubstituted aromatic hydrocarbon group having 6 to 30 ring carbon atoms;

a substituted or unsubstituted fused aromatic hydrocarbon group having 6 to 30 ring carbon atoms;

a substituted or unsubstituted aromatic heterocyclic group having 2 to 30 ring carbon atoms; or a substituted or unsubstituted fused aromatic heterocyclic group having 2 to 30 ring carbon atoms;

$Y^1$ to $Y^4$ each independently represent:

a hydrogen atom;

a fluorine atom;

a cyano group, a substituted or unsubstituted alkyl group having 1 to 20 carbon atoms;

a substituted or unsubstituted alkoxy group having 1 to 20 carbon atoms;

a substituted or unsubstituted haloalkyl group having 1 to 20 carbon atoms;

a substituted or unsubstituted haloalkoxy group having 1 to 20 carbon atoms;

a substituted or unsubstituted alkylsilyl group having 1 to 10 carbon atoms;

a substituted or unsubstituted arylsilyl group having 6 to 30 carbon atoms;

a substituted or unsubstituted aromatic hydrocarbon group having 6 to 30 ring carbon atoms;

a substituted or unsubstituted fused aromatic hydrocarbon group having 6 to 30 ring carbon atoms;

a substituted or unsubstituted aromatic heterocyclic group having 2 to 30 ring carbon atoms; or a substituted or unsubstituted fused aromatic heterocyclic group having 2 to 30 ring carbon atoms;

an adjacent set of $Y^1$ to $Y^4$ may be mutually bonded to form a ring structure;

each of p and q represents an integer of 1 to 4;

each of r and s represents an integer of 1 to 3; and when each of p and q is an integer of 2 to 4 and each of r and s is an integer of 2 to 3, a plurality of $Y^1$ to $Y^4$ may be mutually the same or different.

14. The organic electroluminescence device according to claim 11, wherein the first host is a compound represented by a formula (9) below,

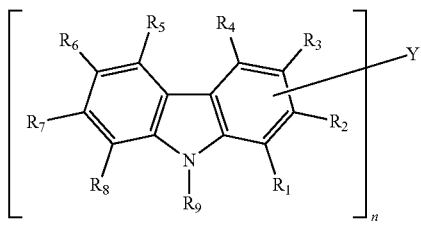
(9)

where: n is a natural number of 2 or more;

each of $R^1$ to $R^8$ is selected from hydrogen, an alkyl group, a cycloalkyl group, an aralkyl group, an alkenyl group, a cycloalkenyl group, an alkynyl group, a hydroxyl group, a mercapto group, an alkoxy group, an alkylthio group, an arylether group, an arylthioether group, an aryl group, a heterocyclic group, halogen, haloalkane, haloalkene, haloalkyne, a cyano group, an aldehyde group, a carbonyl group, a carboxyl group, an ester group, a carbamoyl group, an amino group, a nitro group, a silyl group, a siloxanyl group and a ring structure between adjacent substituents, with a proviso that at least one of $R^1$ to $R^4$ is a bonding group Y;

the bonding group Y is one of or a combination of two or more of a single bond, alkyl chain, alkylene chain, cycloalkyl chain, aryl chain, amino chain, heterocyclic chain, silyl chain, ether chain and thioether chain;

$R^9$ is selected from hydrogen, an alkyl group and an aryl group, $R^9$ optionally forming a substituted or unsubstituted ring structure with an adjacent substituent.

15. The organic electroluminescence device according to claim 11, wherein the second host is a compound represented by any one of formulae (4) to (8) and (8A) below,

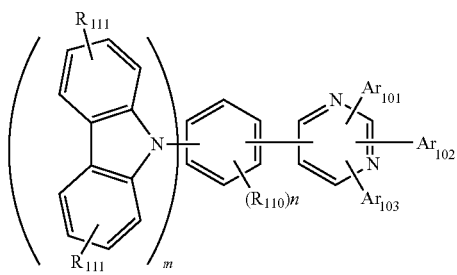
(4)

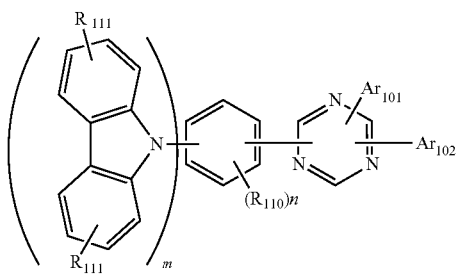
(5)

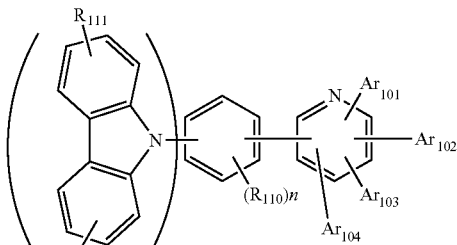
(6)

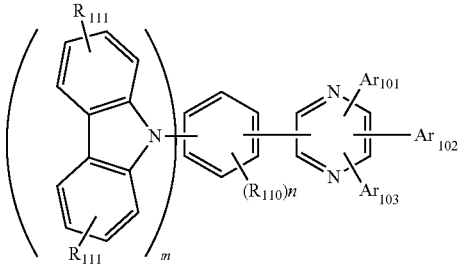
(7)

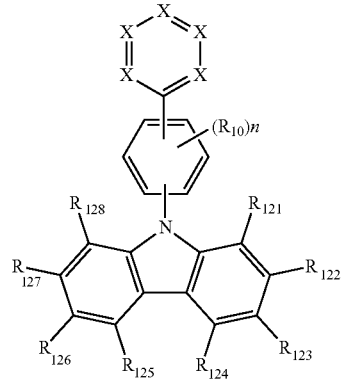
(8)

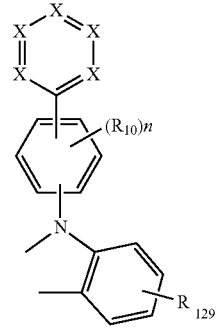
(9)

where, in the formulae (4) to (7), each of $Ar_{101}$ to $Ar_{104}$ represents:

a substituted or unsubstituted aryl group having 6 to 60 carbon atoms; or a substituted or unsubstituted heterocyclic group having 3 to 60 carbon atoms, with a proviso that, when at least one of $Ar_{101}$ to $Ar_{104}$ is substituted, substituent for the at least one of $Ar_{101}$ to $Ar_{104}$ is the same as the substituent for R in the formula (1), $R_{110}$ and $R_{111}$ each are a substituent that is the same as the substituent for R in the formula (1), n is an integer in a range from 0 to 4, m is an integer in a range from 0 to 5, where a sum of n and m satisfies a relationship of $1 \le (n+m) \le 5$, in the formulae (8) and (8A),
X is N or CH, the number of N being in a range from 1 to 4,
each of $R_{121}$ to $R_{128}$ represents:
a hydrogen atom;
an aryl group;
a heteroaryl group;
an alkyl group; or
a structure to which the skeleton of the formula (8A) is bonded,
the structure in which the skeleton of the formula (8A) is bonded to $R_{121}$ to $R_{128}$ is a structure in which at least $R_{121}$ and $R_{122}$, $R_{122}$ and $R_{123}$, $R_{123}$ and $R_{124}$, $R_{125}$ and $R_{126}$, $R_{126}$ and $R_{127}$, or $R_{127}$ and $R_{128}$ are bonded to the skeleton of the formula (8A),
in the formula (8A), $R_{129}$ represents:
a hydrogen atom;
an aryl group;
a heteroaryl group; or
an alkyl group,
the aryl group, heteroaryl group and alkyl group in $R_{10}$, $R_{121}$ to $R_{128}$ and $R_{129}$ are the same as the substituent for R in the formula (1), and
n represents the number of R and is in a range from 0 to 4.

16. The organic electroluminescence device according to claim 11, wherein
the first host is a compound represented by a formula (10) below,

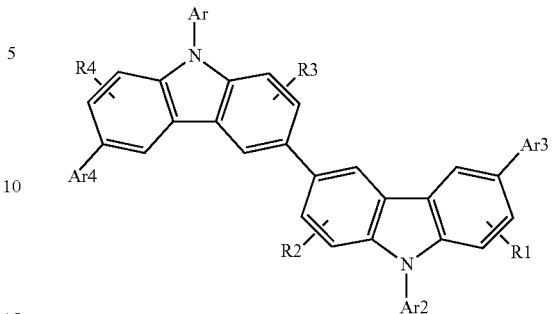

(10)

where: each of R1, R2, R3 and R4 is the same as R in the formula (1);
each of Ar1 and Ar2 is the same as the aryl group or heteroaryl group of R in the formula (1); and
each of Ar3 and Ar4 is the same as the aryl group in the formula (1).

17. The organic electroluminescence device according to claim 11, wherein the heteroaryl group is carbazole, dibenzofuran or dibenzothiophene.

18. The organic electroluminescence device according to claim 12, wherein the heteroaryl group is carbazole, dibenzofuran or dibenzothiophene.

* * * * *